(12) United States Patent  
Cameron

(10) Patent No.: US 8,949,112 B2  
(45) Date of Patent: *Feb. 3, 2015

(54) METHOD AND APPARATUS FOR PARALLEL XML PROCESSING

(71) Applicant: International Characters, Inc., West Vancouver (CA)

(72) Inventor: Robert D. Cameron, Burnaby (CA)

(73) Assignee: International Characters, Inc., Vancouver (CA)

( * ) Notice: Subject to any disclaimer, the term of this patent is extended or adjusted under 35 U.S.C. 154(b) by 28 days.

This patent is subject to a terminal disclaimer.

(21) Appl. No.: 13/760,453

(22) Filed: Feb. 6, 2013

(65) Prior Publication Data

US 2013/0144895 A1    Jun. 6, 2013

Related U.S. Application Data

(63) Continuation of application No. 11/834,396, filed on Aug. 6, 2007, now Pat. No. 8,392,174.

(60) Provisional application No. 60/821,599, filed on Aug. 7, 2006.

(51) Int. Cl.
*G06F 17/20* (2006.01)
*G06F 17/28* (2006.01)
(Continued)

(52) U.S. Cl.
CPC ........ *G06F 17/30923* (2013.01); *G06F 17/277* (2013.01)
USPC ................ 704/9; 704/1; 704/2; 704/3; 704/4; 704/5; 704/6; 704/7; 704/8; 704/10

(58) Field of Classification Search
CPC ......... G06F 17/28; G06F 17/21; G06F 17/27; G06F 17/271; G06F 17/2809; G06F 17/2881; G06F 17/2705; G06F 17/2863; G06F 9/4448; G06F 17/22; G06F 17/276; G06F 17/277; G06F 17/278; G06F 17/2818; G06F 17/2872; G06F 17/30613; G09B 19/06; G10L 15/1822
USPC ....................................... 704/1–10
See application file for complete search history.

(56) References Cited

U.S. PATENT DOCUMENTS 6,438,676 B1    8/2002    Sijstermans
6,785,677 B1    8/2004    Fritchman
(Continued)

OTHER PUBLICATIONS

H.K.T. Wong et al. "Bit Transposed Files" Proceedings of VLDB 85, Stockholm, pp. 448-457, 1985.
(Continued)

*Primary Examiner* — Edgar Guerra-Erazo  
(74) *Attorney, Agent, or Firm* — Michael B. Einschlag

(57) ABSTRACT

One embodiment of the present invention is an XML application module that processes an XML character stream, which module includes an XML interface module, a parallel bit stream module, a lexical item stream module, a parser and a parsed data receiver. The XML interface module applies the XML character stream as input to the parallel bit stream module and the parser; the parallel bit stream module forms parallel bit streams and applies them as input to the lexical item stream module; the lexical stream module forms lexical item streams and applies them as input to the parser; the parser forms a stream of parsed XML data and applies it as input to the parsed data receiver; and the parsed data receiver processes the stream of parsed XML data. The parsed data receiver may be, for example, a communication module of a portable communication device.

11 Claims, 24 Drawing Sheets

(51) Int. Cl.
*G06F 17/27* (2006.01)
*G06F 17/21* (2006.01)
*G06F 17/30* (2006.01)

(56) References Cited

U.S. PATENT DOCUMENTS

| | | | |
|---|---|---|---|
| 7,225,188 B1 | 5/2007 | Gai et al. | |
| 7,383,169 B1 * | 6/2008 | Vanderwende et al. | 704/9 |
| 7,400,271 B2 | 7/2008 | Cameron | |
| 7,562,009 B1 | 7/2009 | Emerson et al. | |
| 7,702,629 B2 | 4/2010 | Cytron et al. | |
| 7,728,738 B2 | 6/2010 | Cameron | |
| 8,077,061 B2 | 12/2011 | Cameron | |
| 8,090,731 B2 * | 1/2012 | Sthanikam et al. | 707/756 |
| 8,515,733 B2 * | 8/2013 | Jansen | 704/9 |
| 2003/0108043 A1 | 6/2003 | Liao | |
| 2004/0117499 A1 | 6/2004 | Liu et al. | |
| 2004/0122851 A1 | 6/2004 | Kinno et al. | |
| 2006/0047500 A1 | 3/2006 | Humphreys et al. | |
| 2006/0050968 A1 | 3/2006 | Oh et al. | |
| 2006/0117307 A1 | 6/2006 | Averbuch et al. | |
| 2006/0271835 A1 | 11/2006 | Marcy et al. | |
| 2006/0284745 A1 | 12/2006 | Cameron | |
| 2008/0033974 A1 | 2/2008 | Cameron | |
| 2008/0040345 A1 | 2/2008 | Cameron | |
| 2009/0055395 A1 | 2/2009 | Jenks et al. | |
| 2009/0112902 A1 * | 4/2009 | Sthanikam et al. | 707/101 |

OTHER PUBLICATIONS

Eli Biham "A Fast New DES Implementation in Software" Technical Report CS 0891 Computer Science Department, Technion—Israel Institute of Technology, 1997 http://www.cs.technion.ac.il/users/wwwb/cgi-bin/tr-info.cgi/1997/CS/CS0891.

P. Apparao et al. "A Detailed Look at the Characteristics of XML Parsing" 2004 Beacon Workshop—1st Workshop on Building Block Engine Architectures for Comps and Netwroks, Boston, Mass, 2004.

R. Baeza-Yates et al. "A New Approach to Text Searching" Comm. of the ACM, vol. 35, Issue 10, Oct. 1992, pp. 74-82.

* cited by examiner

Parallel UTF-8 Data and Property Streams

| Text | $ | , |   | ¥ |   | , |   | € |   |   | ? |
|---|---|---|---|---|---|---|---|---|---|---|---|
| u8data(*i*) | 0x24 | 0x2C | 0x20 | 0xC2 | 0xA5 | 0x2C | 0x20 | 0xE2 | 0x83 | 0xAC | 0x3F |
| u8bit0(*i*) | 0 | 0 | 0 | 1 | 1 | 0 | 0 | 1 | 1 | 1 | 0 |
| u8bit1(*i*) | 0 | 0 | 0 | 1 | 0 | 0 | 0 | 1 | 0 | 0 | 0 |
| u8bit2(*i*) | 1 | 1 | 1 | 0 | 1 | 1 | 1 | 1 | 0 | 1 | 1 |
| u8bit3(*i*) | 0 | 0 | 0 | 0 | 0 | 0 | 0 | 0 | 0 | 0 | 1 |
| u8bit4(*i*) | 0 | 1 | 0 | 0 | 0 | 1 | 0 | 0 | 0 | 1 | 1 |
| u8bit5(*i*) | 1 | 1 | 0 | 0 | 1 | 1 | 0 | 0 | 0 | 1 | 1 |
| u8bit6(*i*) | 0 | 0 | 0 | 1 | 0 | 0 | 0 | 1 | 1 | 0 | 1 |
| u8bit7(*i*) | 0 | 0 | 0 | 0 | 1 | 0 | 0 | 0 | 1 | 0 | 1 |
| u8prefix(*i*) | 0 | 0 | 0 | 1 | 0 | 0 | 0 | 1 | 0 | 0 | 0 |
| u8prefix2(*i*) | 0 | 0 | 0 | 1 | 0 | 0 | 0 | 0 | 0 | 0 | 0 |
| u8scope22(*i*) | 0 | 0 | 0 | 0 | 1 | 0 | 0 | 0 | 0 | 0 | 0 |
| u8hi4(*i*) | 0x2 | 0x2 | 0x2 | 0xC | 0xA | 0x2 | 0x2 | 0xE | 0x8 | 0xA | 0x3 |
| u8lo4(*i*) | 0x4 | 0xC | 0x0 | 0x2 | 0x5 | 0xC | 0x0 | 0x2 | 0x3 | 0xC | 0xF |
| cpbyte(*i*) | 0x24 | 0x2C | 0x20 | 0x00 | 0xA5 | 0x2C | 0x20 | 0x00 | 0x20 | 0xAC | 0x3F |
| *i* | 0 | 1 | 2 | 3 | 4 | 5 | 6 | 7 | 8 | 9 | 10 |

FIG. 1

Altivec Code Fragment Illustrating Shift Across Block and Buffer Boundaries

```
// initialize constants for shifts
vector unsigned char shift1 = vec_splat_u8(1);
vector unsigned char shift3 = vec_splat_u8(3);
vector unsigned char shift7 = vec_splat_u8(7);
vector unsigned char byte_shift15 = vec_sl(vec_splat_u8(15), shift3);
...
oldprefix2 = ...;// value for last block of previous buffer.
for (i = 0; i < block_count; i++) {
  u8_prefix = vec_and(u8bit0[i], u8bit1[i]);
  thisprefix2 = vec_andc(u8prefix, u8bit2[i]);
  u8scope22 = vec_or(vec_sll(vec_slo(oldprefix2, byte_shift15), shift7),
                     vec_srl(thisprefix2, shift1));
  ...
  ...
  oldprefix2 = thisprefix2; // prepare next iteration
}
```

FIG. 2.

Serial Byte Stream to Parallel Bit Stream Transposition Using an Inventive SIMD Instruction Set

```
// Temporary registers:
// bit0123_r0 ... bit0123_r3 for high nybbles of each byte.
// bit4567_r0 ... bit4567_r3 for low nybbles of each byte.
// bit01_r0, bit01_r1, ... bit67_r1 for bit pairs.
bit0123_r0 = simd_pack/8(u8data_r0/h, u8data_r1/h);
bit0123_r1 = simd_pack/8(u8data_r2/h, u8data_r3/h);
bit0123_r2 = simd_pack/8(u8data_r4/h, u8data_r5/h);
bit0123_r3 = simd_pack/8(u8data_r6/h, u8data_r7/h);
bit4567_r0 = simd_pack/8(u8data_r0/l, u8data_r1/l);
bit4567_r1 = simd_pack/8(u8data_r2/l, u8data_r3/l);
bit4567_r2 = simd_pack/8(u8data_r4/l, u8data_r5/l);
bit4567_r3 = simd_pack/8(u8data_r6/l, u8data_r7/l);
bit01_r0 = simd_pack/4(bit0123_r0/h, bit0123_r1/h);
bit01_r1 = simd_pack/4(bit0123_r2/h, bit0123_r3/h);
bit23_r0 = simd_pack/4(bit0123_r0/l, bit0123_r1/l);
bit23_r1 = simd_pack/4(bit0123_r2/l, bit0123_r3/l);
bit45_r0 = simd_pack/4(bit4567_r0/h, bit4567_r1/h);
bit45_r1 = simd_pack/4(bit4567_r2/h, bit4567_r3/h);
bit67_r0 = simd_pack/4(bit4567_r0/l, bit4567_r1/l);
bit67_r1 = simd_pack/4(bit4567_r2/l, bit4567_r3/l);
u8bit0 = simd_pack/2(bit01_r0/h, bit01_r1/h);
u8bit1 = simd_pack/2(bit01_r0/l, bit01_r1/l);
u8bit2 = simd_pack/2(bit23_r0/h, bit23_r1/h);
u8bit3 = simd_pack/2(bit23_r0/l, bit23_r1/l);
u8bit4 = simd_pack/2(bit45_r0/h, bit45_r1/h);
u8bit5 = simd_pack/2(bit45_r0/l, bit45_r1/l);
u8bit6 = simd_pack/2(bit67_r0/h, bit67_r1/h);
u8bit7 = simd_pack/2(bit67_r0/l, bit67_r1/l);
```

FIG. 3

Altivec Code Fragment for Bit Pairing

```
// initialize constants for packing, shifting, masking.
vector unsigned char even_indices = vec_add(vec_lvsl(0,0), vec_lvsl(0,0));
vector unsigned char shift1 = vec_splat_u8(1);
vector unsigned char shift4 = vec_splat_u8(4);
vector unsigned char mask_0101 = vec_splat_u8(0x05);
vector unsigned char alternate_bits =
  vec_or(mask_0101, vec_sl(mask_0101, shift4));
vector unsigned char even, odd, even_left1, odd_right1;
..
..
// Assume that two consecutive sets of 16 input bytes are available
// in registers u8data0 and u8data1.  Pack into even and odd bytes.
even = vec_perm(u8data0, u8data1, even_indices);
odd  = vec_pack((vector unsigned short) u8data0,
                (vector unsigned short) u8data1);
// Now make offset 1 versions.
even_left1 = vec_sl(even, shift1);
odd_right1 = vec_sr(odd, shift1);
//
bits00224466 = vec_sel(even, odd_right1, alternate_bits);
bits11335577 = vec_sel(even_left1, odd, alternate_bits);
// Stage 1 bit pairing complete.
```

FIG. 4

Altivec Code Fragment for Bit Detection

```
int has_bit(vector unsigned char bit_block[], int block_count) {
  vector unsigned char accum = vec_splat_u8(0);
  int i;
  for (i = 0; i < block_count; i++) {
    accum = vec_or(bit_block[i], accum);
  }
  return accum_sum((vector unsigned int) accum) > 0;
}
```

FIG. 5

Pentium Code Fragment for Bit Position Arrays

```
asm volatile(
  "b2p_next_32:\n\t"
  "cmpl %[buffer_end_ptr], %[bit_buffer_ptr]\n\t"
  "jge b2p_finish\n"
  "b2p_scan_next:\n\t"
  "bsf (%[bit_buffer_ptr]), %%ecx\n\t"    // initiate bit scan
  // bsf has a latency of 4; load the current 32 bits and
  // advance counters in the meantime.  Use leal for arithmetic
  // to avoid conflict with the z flag set by bsf.
  "movl (%[bit_buffer_ptr]), %%eax\n\t"   // load current 32 bits
  "leal 32(%[bit_position]), %[bit_position]\n\t"
  "leal 4(%[bit_buffer_ptr]), %[bit_buffer_ptr]\n\t"
  "jz b2p_next_32\n"              // did bsf find a bit?
  "b2p_process_bit:\n\t"
  "leal (%[bit_position], %%ecx), %%edx\n\t" // bit position = base + offset
  "leal -1(%%eax), %%ecx\n\t"
  "andl %%ecx, %%eax\n\t"                  // clear bit
  "bsf %%eax, %%ecx\n\t"                   // start another scan
  "movw %%dx, (%[position_buffer_ptr])\n\t"  // store the position just found
  "leal 2(%[position_buffer_ptr]), %[position_buffer_ptr]\n\t"
  "jnz b2p_process_bit\n\t"
  "cmpl %[buffer_end_ptr], %[bit_buffer_ptr]\n\t"
  "jl b2p_scan_next\n"
  "b2p_finish:\n"
  : [position_buffer_ptr] "+D" (position_buffer_ptr)
  : [bit_buffer_ptr] "S" (bit_buffer_ptr),
    [bit_position] "b" (bit_position-32),   // will preincrement by 32.
    [buffer_end_ptr] "m" (buffer_end_ptr)
  : "eax", "ecx", "edx", "cc", "memory");
```

FIG. 6

Parallel Bit Stream to Serial Byte Stream Transposition Using an Inventive SIMD Instruction Set

```
// Temporary registers:
// bit01_r0, bit01_r1, ... bit67_r1 for merged bit pairs.
// bit0123_r0 ... bit0123_r3 for high nybbles of each byte.
// bit4567_r0 ... bit4567_r3 for low nybbles of each byte.
bit01_r0 = simd_mergeh/1(u8bit0, u8bit1);
bit01_r1 = simd_mergel/1(u8bit0, u8bit1);
bit23_r0 = simd_mergeh/1(u8bit2, u8bit3);
bit23_r1 = simd_mergel/1(u8bit2, u8bit3);
bit45_r0 = simd_mergeh/1(u8bit4, u8bit5);
bit45_r1 = simd_mergel/1(u8bit4, u8bit5);
bit67_r0 = simd_mergeh/1(u8bit6, u8bit7);
bit67_r1 = simd_mergel/1(u8bit6, u8bit7);
bit0123_r0 = simd_mergeh/2(bit01_r0, bit23_r0);
bit0123_r1 = simd_mergel/2(bit01_r0, bit23_r0);
bit0123_r2 = simd_mergeh/2(bit01_r1, bit23_r1);
bit0123_r3 = simd_mergel/2(bit01_r1, bit23_r1);
bit4567_r0 = simd_mergeh/2(bit45_r0, bit67_r0);
bit4567_r1 = simd_mergel/2(bit45_r0, bit67_r0);
bit4567_r2 = simd_mergeh/2(bit45_r1, bit67_r1);
bit4567_r3 = simd_mergel/2(bit45_r1, bit67_r1);
u8data_r0 = simd_mergeh/4(bit0123_r0, bit4567_r0);
u8data_r1 = simd_mergel/4(bit0123_r0, bit4567_r0);
u8data_r2 = simd_mergeh/4(bit0123_r1, bit4567_r1);
u8data_r3 = simd_mergel/4(bit0123_r1, bit4567_r1);
u8data_r4 = simd_mergeh/4(bit0123_r2, bit4567_r2);
u8data_r5 = simd_mergel/4(bit0123_r2, bit4567_r2);
u8data_r6 = simd_mergeh/4(bit0123_r3, bit4567_r3);
u8data_r7 = simd_mergel/4(bit0123_r3, bit4567_r3);
```

FIG. 7

UTF-8 Code Unit Sequences and Corresponding Code Point Bytes

| | | | | | |
|---|---|---|---|---|---|
| Single byte | byte class | | | | u8unibyte |
| | UTF-8 pattern | | | | 0tuvwxyz |
| 2-byte sequence | code point | | | | 0tuvwxyz |
| | byte class | | | u8prefix2 | u8scope22 |
| | UTF-8 pattern | | | 110pqrst | 10uvwxyz |
| | code point | | | 00000pqr | stuvwxyz |
| 3-byte sequence | byte class | | u8prefix3 | u8scope32 | u8scope33 |
| | UTF-8 pattern | | 1110jklm | 10npqrst | 10uvwxyz |
| | code point | | 00000000 | jklmnpqr | stuvwxyz |
| 4-byte sequence | byte class | u8prefix4 | u8scope42 | u8scope43 | u8scope44 |
| | UTF-8 pattern | 11110efg | 10hijklm | 10npqrst | 10uvwxyz |
| | code point | 00000000 | 000efghi | jklmnpqr | stuvwxyz |

FIG. 8

UTF-8 Code Unit Sequences and Corresponding UTF-16 High and Low Bytes

| | byte class | | | | u8unibyte |
|---|---|---|---|---|---|
| Single byte | UTF-8 pattern | | | | 0tuvwxyz |
| | u16hi | | | | 00000000 |
| | u16lo | | | | 0tuvwxyz |
| 2-byte sequence | byte class | | | u8prefix2 | u8scope22 |
| | UTF-8 pattern | | | 110pqrst | 10uvwxyz |
| | u16hi | | | *delete* | 00000pqr |
| | u16lo | | | *delete* | stuvwxyz |
| 3-byte sequence | byte class | | u8prefix3 | u8scope32 | u8scope33 |
| | UTF-8 pattern | | 1110jklm | 10npqrst | 10uvwxyz |
| | u16hi | | *delete* | *delete* | jklmnpqr |
| | u16lo | | *delete* | *delete* | stuvwxyz |
| 4-byte sequence | byte class | u8prefix4 | u8scope42 | u8scope43 | u8scope44 |
| | UTF-8 pattern | 11110efg | 10hijklm | 10npqrst | 10uvwxyz |
| | u16hi | *delete* | 110110ab | *delete* | 110111qr |
| | u16lo | *delete* | cdjklmnp | *delete* | stuvwxyz |

(where abcd = efghi - 1)

FIG. 11

Altivec Implementation of an Inventive Instruction simd_add_16

```
// simd_add_16 macros make the following assumptions.
// rslt, a, b are all either vector unsigned short or vector signed short.
// hshift8 is predefined as a vec_splat_u16(8)
// alt_bytes is predefined as vec_vsrh(vec_splat_u16(-1), hshift8)
//
#define simd_add_16_xx(rslt, a, b) rslt = vec_adduhm(a, b)

#define simd_add_16_xh(rslt, a, b) \
  rslt = vec_adduhm(a, vec_vsrh(b, hshift8))

#define simd_add_16_xl(rslt, a, b) \
  rslt = vec_adduhm(a, vec_and(b, alt_bytes))

#define simd_add_16_hx(rslt, a, b) \
  rslt = vec_adduhm(vec_vsrh(a, hshift8), b)

#define simd_add_16_hh(rslt, a, b) \
  rslt = vec_adduhm(vec_vsrh(a, hshift8), vec_vsrh(b, hshift8))

#define simd_add_16_hl(rslt, a, b) \
  rslt = vec_adduhm(vec_vsrh(a, hshift8), vec_and(b, alt_bytes))

#define simd_add_16_lx(rslt, a, b) \
  rslt = vec_adduhm(vec_and(a, alt_bytes), b)

#define simd_add_16_lh(rslt, a, b) \
  rslt = vec_adduhm(vec_and(a, alt_bytes), vec_vsrh(b, hshift8))

#define simd_add_16_ll(rslt, a, b) \
  rslt = vec_adduhm(vec_and(a, alt_bytes), vec_and(b, alt_bytes))
```

FIG. 12

Altivec Implementation of an Inventive Instruction simd_srl_4

```
// simd_srl_4 macros make the following assumptions.
// rslt, a, b are all vector unsigned char.
// shift2 is predefined as a vec_splat_u8(2)
// shift4 is predefined as a vec_splat_u8(4)
// alt_pairs is predefined as
//   vec_or(vec_splat_u8(3), vec_sl(vec_splat_u8(3), shift4))
// alt_nybbles is predefined as vec_splat_u8(15)
//
#define simd_srl_4_xx(rslt, a, b) \
  do { \
    vector unsigned char x = a; /* Ensure a is evaluated once only. */ \
    vector unsigned char y = vec_and(b, alt_pairs); /* max shift = 3 */ \
    vector unsigned char rslt_h = vec_vsrb(x, vec_vsrb(y, shift4)); \
    vector unsigned char rslt_l = vec_vsrb(vec_and(x, alt_nybbles), y); \
    rslt = vec_sel(rslt_h, rslt_l, alt_nybbles); \
  while (0)

#define simd_srl_4_xh(rslt, a, b) \
  simd_srl_4_xx(rslt, a, vec_vsrb(b, shift2))

define simd_srl_4_xl simd_srl_4_xx define simd_srl_4_hx(rslt, a, b) \
  simd_srl_4_xx(rslt, vec_and(vec_vsrb(a, shift2), alt_pairs), b)

#define simd_srl_4_hh(rslt, a, b) \
  simd_srl_4_hx(rslt, a, vec_vsrb(b, shift2))

define simd_srl_4_hl simd_srl_4_hx define simd_srl_4_lx(rslt, a, b) \
  simd_srl_4_xx(rslt, vec_and(a, alt_pairs), b)

#define simd_srl_4_lh(rslt, a, b) \
  simd_srl_4_xx(rslt, vec_and(a, alt_pairs), vec_vsrb(b, shift2))

#define simd_srl_4_ll simd_srl_4_lx
```

FIG. 13

Altivec Implementation of an Inventive Instruction simd_sub_2

```
// simd_sub_2 macros make the following assumptions.
// rslt, a, b are all vector unsigned char.
// shift1 is predefined as a vec_splat_u8(1)
// alt_bits is predefined as
//    vec_or(vec_splat_u8(5), vec_sl(vec_splat_u8(5), shift4))
//
#define simd_sub_2_xx(rslt, a, b) \
  do {vector unsigned char x = a; /* Evaluate a once only. */ \
      vector unsigned char y = b; /* Evaluate b once only. */ \
      vector unsigned char bit_diff = vec_xor(a, b); \
      vector unsigned char borrow = vec_vslb(vec_andc(b, a), shift1); \
      rslt = vec_sel(vec_xor(bit_diff, borrow), bit_diff, alt_bits); \
  } while (0)

#define simd_sub_2_xh(rslt, a, b) \
  simd_sub_2_xx(rslt, a, vec_and(vec_vsrb(b, shift1), alt_bits))

#define simd_sub_2_xl(rslt, a, b) simd_sub_2_xx(rslt, a, vec_and(b, alt_bits))

#define simd_sub_2_hx(rslt, a, b) \
  simd_sub_2_xx(rslt, vec_and(vec_vsrb(a, shift1), alt_bits), b)

#define simd_sub_2_lx(rslt, a, b) simd_sub_2_xx(rslt, vec_and(a, alt_bits), b)

// Optimized versions.
#define simd_sub_2_hh(rslt, a, b) \
  do {vector unsigned char x = a; /* Evaluate a once only. */ \
      vector unsigned char y = b; /* Evaluate b once only. */ \
      rslt = vec_sel(vec_andc(b, a), vec_vsrb(vec_xor(a, b), shift1), \
alt_bits); \
  } while (0)

#define simd_sub_2_hl(rslt, a, b) \
  do {vector unsigned char x = a; /* Evaluate a once only. */ \
      vector unsigned char y = b; /* Evaluate b once only. */ \
      rslt = vec_sel(vec_andc(vec_vslb(b, shift1), a), \
                     vec_xor(vec_vsrb(a, shift1), b), alt_bits); \
  } while (0)

#define simd_sub_2_lh(rslt, a, b) \
  do {vector unsigned char x = a; /* Evaluate a once only. */ \
      vector unsigned char y = b; /* Evaluate b once only. */ \
      rslt = vec_sel(vec_andc(b, vec_vslb(a, shift1)), \
                     vec_xor(a, vec_vsrb(b, shift1)), alt_bits); \
  } while (0)

#define simd_sub_2_ll(rslt, a, b) \
  do {vector unsigned char x = a; /* Evaluate a once only. */ \
      vector unsigned char y = b; /* Evaluate b once only. */ \
      rslt = vec_sel(vec_vslb(vec_andc(b, a), shift1),
                     vec_xor(a, b), alt_bits); \
  } while (0)
```

FIG. 14

Block Diagram of String Search Unit

Example of Partial Bit Match Candidate Filtering

| tdata($i$) | Haystack with one needy needle! |
|---|---|
| cand1 = tbit5($i$) | 0000100001010011101111001111110 |
| cand2 = cand1 $\wedge \neg$ tbit7($i$) | 0000100000100010010010001100 |
| cand3 = cand2 $\wedge$ ($\neg$ tbit6)($i+3$) | 0000000000000000001000001001000 |
| cand4 = cand3 $\wedge$ tbit4($i+4$) | 0000000000000000001000001000000 |

FIG. 18

Common Subexpressions in Altivec Computation of Lexical Item Bit Streams

```
vector unsigned char temp1 = vec_or(u8bit0, u8bit1);
vector unsigned char temp2 = vec_andc(u8bit2, u8bit3);
vector unsigned char temp3 = vec_andc(temp2, temp1);
vector unsigned char temp4 = vec_or(u8bit4, u8bit5);
vector unsigned char temp5 = vec_or(u8bit6, u8bit7);
vector unsigned char temp6 = vec_or(temp4, temp5);
vector unsigned char SP = vec_andc(temp3, temp6);
vector unsigned char temp7 = vec_or(u8bit2, u8bit3);
vector unsigned char temp8 = vec_or(temp1, temp7);
vector unsigned char temp9 = vec_and(u8bit4, u8bit5);
vector unsigned char temp10 = vec_andc(u8bit7, u8bit6);
vector unsigned char temp11 = vec_and(temp9, temp10);
vector unsigned char CR = vec_andc(temp11, temp8);
vector unsigned char temp12 = vec_andc(u8bit4, u8bit5);
vector unsigned char temp13 = vec_and(temp12, temp10);
vector unsigned char HT = vec_andc(temp13, temp8);
vector unsigned char temp14 = vec_andc(u8bit6, u8bit7);
vector unsigned char temp15 = vec_and(temp12, temp14);
vector unsigned char LF = vec_andc(temp15, temp8);
vector unsigned char S = vec_or(vec_or(HT, LF), vec_or(CR, SP));
vector unsigned char temp16 = vec_and(u8bit0, u8bit1);
vector unsigned char temp17 = vec_and(temp16, temp2);
vector unsigned char temp18 = vec_and(u8bit6, u8bit7);
vector unsigned char temp19 = vec_and(temp9, temp18);
vector unsigned char xEF = vec_and(temp17, temp19);
vector unsigned char temp20 = vec_andc(u8bit0, u8bit1);
vector unsigned char temp21 = vec_and(u8bit2, u8bit3);
vector unsigned char temp22 = vec_and(temp20, temp21);
vector unsigned char xBF = vec_and(temp22, temp19);
vector unsigned char temp23 = vec_and(temp9, temp14);
vector unsigned char xBE = vec_and(temp22, temp23);
```

FIG. 20

**Simultaneous Matching of [0-9]* Regular Expression**

| | |
|---|---|
| .4567b .212743 ;54...4a523 :atad | character stream data |
| 01111000111111001100010111000000 | [0-9] character class stream |
| 00000100000001000000000001000000 | initial cursor stream |
| 01111101000000011000110000000000 | temp = cursor + [0-9] stream |
| 00000101000000000000001000000000 | final cursor = temp & ~[0-9] stream |

FIG. 23

Simultaneous Matching of [-+]?[0-9]+ Regular Expression

| | |
|---|---|
| ;5.796953 - 6++ 4+ gnorw 17- 421 | character stream data |
| 00000000001001100100000000010000 | [-+] character class stream |
| 01011111100010001000000001100111 | [0-9] character class stream |
| 00000000101000100100000100010001 | c0, initial cursor stream |
| 10000000001010001001000010001000 | end_mask, expected final cursor |
| 00000000110001001000000100100001 | c1 = c0 + (c0 & [-+]) |
| 00100000000000100000000010001000 | c2 = (c1 + [0-9]) & (~[0-9]) & (~c1) |
| 00000000000000100000000010001000 | end_mask & c2 |
| 10000000001010000010000000000000 | end_mask & ~c2 |

FIG. 24

METHOD AND APPARATUS FOR PARALLEL XML PROCESSING

This application is a continuation of, and claims priority under 35 USC §120 from, U.S. patent application Ser. No. 11/834,396, filed Aug. 6, 2007, which application, in turn, claims priority under 35 USC §119(e) from U.S. Provisional Patent Application No. 60/821,599. filed Aug. 7, 2006, and which prior applications are incorporated herein in their entirety.

TECHNICAL FIELD OF THE INVENTION

One or more embodiments of the present invention relate to method and apparatus for parallel XML processing.

BACKGROUND OF THE INVENTION

Text processing applications deal with textual data encoded as strings or streams of characters following conventions of a particular character encoding scheme. Historically, many text processing applications have been developed that are based on fixed-width, single-byte, character encoding schemes such as ASCII and EBCDIC. Further, text processing applications involving textual data in various European languages or non-Roman alphabets may use one of the 8-bit extended ASCII schemes of ISO 8859. Still further, a number of alternative variable-length encoding schemes have been used for Chinese, Japanese or Korean applications.

Increasingly, Unicode is being used as a basis for text processing applications that may need to accommodate, and/or perhaps combine, text arising from different sources. The Unicode character set is designed to include characters of all the world's languages, as well as many additional characters arising from formal notation systems used in mathematics, music and other application areas. As is well known, UTF-8, UTF-16 and UTF-32 are the three basic encoding schemes of Unicode that are based on 8-bit, 16-bit, or 32-bit code units, respectively. In particular, UTF-8 is a variable-length encoding scheme that requires one to four 8-bit code units per character; UTF-16 is an encoding scheme that generally requires a single 16-bit code unit per character (some rarely used characters require 2 code units); and UTF-32 is a fixed-length encoding scheme that requires a single 32-bit code unit for each character. UTF-16 and UTF-32 have variations known as UTF-16LE, UTF-16BE, UTF-32LE and UTF-32BE, depending on byte-ordering conventions within code units.

While Unicode allows interoperation between applications and character streams from many different sources, it comes at some cost in processing efficiency when compared with legacy applications based on 8-bit character encoding schemes. This cost may become manifest in the form of additional hardware required to achieve desired throughput, additional energy consumption in carrying out an application on a particular character stream, and/or additional execution time for an application to complete processing.

Applications may further require that the content of data streams be structured according to lexical and/or syntactic conventions of a text-based notation system. Many such conventions exist, ranging from simple line-oriented structuring conventions used by various operating systems to formal programming language grammars used for representing computer programs as source language texts. Of special importance is the growing use of XML as a standard, text-based, markup language for encoding documents and data of all kinds. In each case, the imposition of structuring information may add considerably to resource requirements of relevant text processing applications.

In general, high-speed text processing in the prior art uses sequential, character-at-a-time (or byte-at-a-time) processing, often written in the C programming language. For example, much prior art for XML and Unicode string processing teaches use of the sequential character processing approach. This is also true of standard computing science textbooks dealing with parsing, lexical analysis, and text processing applications.

There are three basic techniques used in the prior art for implementing text processing applications. The first basic technique is a hand-coded implementation using iterative looping (for example, while loops) and branching instructions (for example, if-statements) to perform conditional actions based on particular characters or character classes. The second basic technique is a variation of the first in which decomposition of separate logic for different characters or character classes is handled through jump tables (for example, case statements). The third basic technique systematizes the use of tables in the form of finite state machines. Finite state machine implementations derive from standard theoretical techniques for string processing; namely, representing character and lexical syntax by regular expression grammars and recognizing character strings matching these grammars using finite automata. Finite state machine techniques can give efficient implementations when the number of states and the number of potential character transitions per state is reasonably small; for example, applications involving 7-bit ASCII processing require at most 128 entries per state. However, a straightforward implementation of finite state machines based on 16-bit representations of UTF-16 would require more than 64,000 entries per state. Thus, for state spaces of any complexity, this quickly becomes prohibitive.

Industry standard processors have evolved through 8-bit, 16-bit and 32-bit architectures. In addition, character encoding schemes have evolved from the 8-bit representations of extended ASCII through the 16-bit and 32-bit representations of UTF-16 and UTF-32. Through this period of evolution of processor architectures and character encoding schemes, there has been a rough match between processor capabilities and the requirements of character-at-a-time processing.

Although the evolution of character encoding has now likely reached a point of long-term stability through the Unicode standard, processor architectures are continuing to evolve. In particular, recent years have seen an increasing mismatch between processor capabilities and character-at-a-time processing requirements. Specifically, industry standard processor architectures now routinely include capabilities for single-instruction, multiple-data processing based on 128-bit registers, while processors with 64-bit general purpose registers are being increasingly deployed. These registers are potentially capable of dealing with a number of characters or code units at a time, for example, up to 16 UTF-8 code units could be processed using 128-bit registers. In addition, processors have developed sophisticated instruction and data caching facilities for increasing throughput. With respect to instruction caching, in particular, throughput advantages provided by pipelining are largely negated by sequential character processing software that is heavily laden with branch instructions for conditional character logic. Data cache behavior may also be a problem, particularly for finite-state machine and other table-based implementations that may use large transition or translation tables.

In light of the above, there is a need to provide method and/or apparatus to solve one or more of the above-identified issues.

SUMMARY OF THE INVENTION

One or more embodiments of the present invention satisfy one or more of the above-identified needs. In particular, one embodiment of the present invention is an XML application module that processes an XML character stream, which module comprises an XML interface module, a parallel bit stream module, a lexical item stream module, a parser and a parsed data receiver. The XML interface module applies the XML character stream as input to the parallel bit stream module and the parser; the parallel bit stream module forms parallel bit streams and applies them as input to the lexical item stream module; the lexical stream module forms lexical item streams and applies them as input to the parser; the parser forms a stream of parsed XML data and applies it as input to the parsed data receiver; and the parsed data receiver processes the stream of parsed XML data. The parsed data receiver may be, for example, a communication module of a portable communication device.

BRIEF DESCRIPTION OF THE DRAWINGS

FIG. 1 illustrates UTF-8 code units and parallel property streams for a Unicode text "$, ¥, € ?";

FIG. 2 shows a loop fragment illustrating shift across block and buffer boundaries using the C-language interface for Altivec programming on a Power PC in accordance with an embodiment of the present invention;

FIG. 3 illustrates serial byte to parallel bit stream transposition using an inductive instruction set architecture in accordance with an embodiment of the present invention;

FIG. 4 shows an Altivec code fragment implementing a serial to parallel transposition stage in accordance with an embodiment of the present invention;

FIG. 5 shows an Altivec code fragment for bit detection in accordance with an embodiment of the present invention;

FIG. 6 shows an inline assembly implementation (GCC conventions) for forming bit position arrays in accordance with one embodiment of the present invention suitable for a 32-bit Pentium architecture and compatible processors;

FIG. 7 illustrates parallel bit stream to serial byte transposition using an inductive instruction set architecture in accordance with an embodiment of the present invention;

FIG. 8 shows a correspondence between UTF-8 code unit sequences and code point values;

FIG. 11 shows a correspondence between UTF-8 code unit sequences and UTF-16 hi and lo byte data;

FIG. 12 shows an implementation of an inductive instruction simd_add_16 in accordance with one embodiment of the invention using Power PC processors;

FIG. 13 shows an implementation of an inductive instruction simd_srl_4 in accordance with one embodiment of the invention using Power PC processors;

FIG. 14 shows an implementation of an inductive instruction simd_sub_2 in accordance with one embodiment of the invention using Power PC processors;

FIG. 18 is a table that illustrates how partial bit matching operates in accordance with one or more embodiments of the present invention;

FIG. 20 shows Altivec code implementing equations 8.1 through 8.8 in accordance with one or more embodiments of the present invention;

FIG. 23 shows a method for matching a regular expression "[0-9]*" in accordance with one or more embodiments of the present invention;

FIG. 24 shows a method for matching a regular expression "[-+][0-9]+" in accordance with one or more embodiments of the present invention.

DETAILED DESCRIPTION

Definitions

Figure 9:
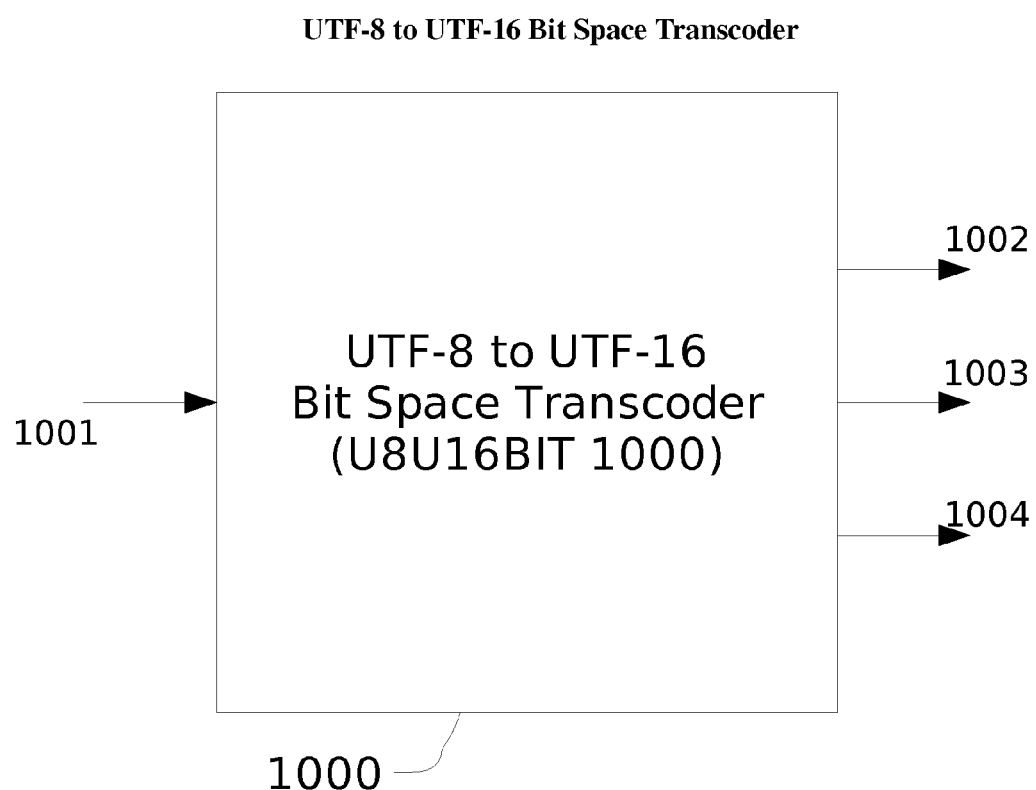
FIG. 9 shows a block diagram of an input-output structure of a UTF-8 to UTF-16 bit-space transcoder that is fabricated in accordance with one embodiment of the present invention.

The following definitions apply herein.

Data stream: A sequence of data values of a particular data type. A data stream may be of finite length or it may be nonterminating.

Data string: A data stream of finite length that may be processed as a single entity.

Bit stream: A data stream consisting of bit values, i.e., values that are either 0 or 1.

Bit string: A bit stream of finite length that may be processed as a single entity.

Byte: A data unit consisting of 8 bits.

Character stream: A data stream consisting of character values in accordance with an encoding convention of a particular character encoding scheme.

Character encoding scheme: A scheme for encoding characters as data values each comprising one or more fixed-width code units.

Character string: A character stream of finite length that may be processed as a single entity.

Code point: A numeric value associated with a particular character in a character encoding scheme.

Code unit: An individual data unit in a character encoding scheme.

Doublebyte: A data unit consisting of 16 bits.

Lexical item stream. A bit stream parallel to a basis character stream that is constructed to identify positions of lexically significant characters or character combinations in accordance with rules of a textual notation system.

Nybble: A data unit consisting of 4 bits.

Property stream: A data stream consisting of data values of a particular property associated with data values from another data stream, where the another data stream is called a basis stream of the property stream.

Parallel data streams. Two or more data streams whose data values are in one-to-one correspondence. For example, parallel property streams are parallel data streams where the parallel data streams are property streams of a basis stream, for example, a character stream.

Text: Information in a form readable by people and represented as character string or character stream data in accordance with a particular character encoding scheme.

Textual notation system. A system for structuring and representing information as text, in accordance with a grammar or other set of rules. Programming languages, markup languages and character-based data formats are examples of textual notation systems.

1. Parallel Data Streams and Property Streams

One or more embodiments of the present invention involve manipulating parallel data streams including, but not limited to, using simultaneous-instruction, multiple-data ("SIMD") techniques to manipulate the parallel data streams. In particular, in accordance with one or more such embodiments, the parallel data streams may be property streams of a character stream (the basis stream) in, for example and without limitation, a UTF-8 representation, a UTF-16 representation, or a UTF-32 representation. An understanding of this may be illustrated through an example of parallel property streams generated from Unicode text encoded in UTF-8.

1.1 Parallel Property Streams Generated from Unicode Text Encoded in UTF-8

Consider a Unicode text "$, ¥, € ?" comprising the following eight characters in sequence: dollar sign, comma, space, yen sign, comma, space, euro sign, question mark. FIG. 1 shows a UTF-8 data stream representing this text, together with a number of parallel property streams derived therefrom. Using hexadecimal notation, the row labeled u8data(i) shows the composition of the UTF-8 data stream as a sequence of 8-bit code units (bytes). Note that the yen sign and the euro sign respectively require two code units and three code units, so that the overall length of the UTF-8 data stream in this case is eleven code units. In general, given a UTF-8 data stream of N code units in all, u8data(i) denotes the code unit at position i, for positions 0 through N−1.

A UTF-8 data stream may be alternatively represented as a number of parallel property streams, for example, 8 parallel bit streams, u8bit0, u8bit1, u8bit2, u8bit3, u8bit4, u8bit5, u8bit6 and u8bit7, where each bit stream corresponds to a single bit position within successive code units of u8data. Thus, u8bit3($i$) represents bit 3 of u8data(i). In the example of FIG. 1, the rows labeled u8bit0($i$) through u8bit7($i$) show the bit streams that correspond to u8data(i). The further rows of FIG. 1 show other parallel property streams as will be described subsequently.

Usually, UTF-8 data streams of interest will be much longer. Streams will typically be processed in blocks. As an example, in accordance with one embodiment of the present invention, a block size of 128 bytes is used for processing 128 code units at a time. The corresponding parallel bit streams in this case will each be processed in blocks of 128 bits (16 bytes).

The u8data data stream and the u8bit0 through u8bit7 parallel bit streams are property data streams that are all said to be u8-indexed. A property data stream is u8-indexed if it consists of a sequence of data values in one-to-one correspondence with code units of an original UTF-8 data stream.

In accordance with one or more embodiments of the present invention, other u8-indexed property data streams may be defined as logical combinations of existing u8-indexed property data streams. For example, let u8prefix be a u8-indexed bit stream identifying those UTF-8 code units whose value is in a range hexadecimal C0 through hexadecimal FF, i.e., a range of values reserved for UTF-8 prefix bytes. This property data stream is a bit stream that is defined by (or fabricated or created in accordance with) the following equation.

$$u8\text{prefix}(i) = u8\text{bit0}(i) \wedge u8\text{bit1}(i) \quad (1.1)$$

In FIG. 1, the row labeled u8prefix(i) shows this stream for the example text.

Similarly, let u8prefix2 be a u8-indexed bit stream identifying prefix bytes in a more narrow range hexadecimal C0 through hexadecimal DF, i.e., u8prefix2 is a bit stream that identifies prefix bytes which indicate initial bytes of two-byte UTF-8 sequences. This property data stream is a bit stream that is defined by (or fabricated or created in accordance with) the following equation.

$$u8\text{prefix2}(i) = u8\text{prefix}(i) \wedge \neg u8\text{bit2}(i) \quad (1.2)$$

Again, FIG. 1 illustrates this computation for the example text.

These initial examples may also serve to illustrate efficiency advantages that may be gained through use of parallel data streams in general, and parallel bit streams in particular, in accordance with one or more embodiments of the present invention. In accordance with one or more such embodiments, registers are utilized that permit logical operations on a number of data elements in parallel. Such embodiments may be referred to as simultaneous-instruction, multiple-data ("SIMD") embodiments. For example, the XMM registers of Pentium-compatible processor architectures and the Altivec registers of Power PC processor architectures each provide for logical operations on 128 bits in parallel. Thus, for example and without limitation, in accordance with one or more embodiments of the present invention, a single register may be loaded with 128 consecutive bits from the u8bit0 bit stream, while a second register may be loaded with a corresponding 128 bits from the u8bit1 bit stream. A logical "and" operation applied to these two registers determines, in a single operation, a set of all code units within a block of 128 that represent prefix bytes (see eqn. 1.1). In addition, in one more step, this value may be combined using an "and complement" operation with an appropriate 128 bits loaded from the u8bit2 bit stream (see eqn. 1.2). By way of contrast, in accordance with prior art techniques, a byte-at-a-time loop for determining and classifying prefix bytes would require several hundred operations to process 128 code units.

Although SIMD facilities of modern processor architectures may provide the greatest advantage in parallel data stream manipulation, alternative embodiments of the present invention may achieve useful parallelism using standard processor instructions. For example, in accordance with one or more such alternative embodiments, parallelism involving 32 code units at a time may be achieved by using standard logical instructions of 32-bit processors.

In accordance with one or more embodiments of the present invention, one may move beyond strict logical combinations of aligned data stream values, to define derived data streams in terms of properties of neighboring code units. For example, let u8scope22(*i*) (a property data stream) represent a property that the code unit i is expected to be the second byte of a two-byte UTF-8 sequence. This property is true whenever the immediately preceding byte is a prefix byte in the hexadecimal C0 through DF range. See FIG. 1 for the running example. The following pair of equations may be used to define the property.

$$u8scope22(i) = u8prefix2(i-1), \text{ if } i \geq 1 \quad (1.3)$$

$$u8scope22(0) = 0 \quad (1.4)$$

Computation of properties such as these involves data shifting operations. Proper implementation requires attention to issues such as block and buffer boundaries, and details thereof are described in a subsequent section.

A further convention simplifies the definition of data shifting properties in many cases. The convention is that for any negative index i, u8data(i) is defined to be the null byte (0). By extension, the convention also applies to bit streams u8bit0 through u8bit7: u8bitn(i)=0, for all i<0. In the example of u8scope22, this convention allows a simplification by dropping special case handling that avoids u8prefix2(−1) in the case i=0. That is, the definition simplifies to a single unconditional equation.

$$u8scope22(i) = u8prefix2(i-1) \quad (1.5)$$

1.2 Property Streams in General

As illustrated by the examples above, many derived properties of interest, in accordance with one or more embodiments of the present invention, are logical or Boolean properties that may be represented using a single bit per code unit. This is advantageous as it provides for maximum parallelism in processing code units within fixed registers. However, in some cases, in accordance with one or more embodiments of the present invention, there are non-Boolean properties that are nevertheless u8-indexed. For example, the rows labeled u8hi4(*i*) and u8lo4(*i*) in FIG. 1 show, in hexadecimal notation, two parallel property streams derived from u8data(i), representing respectively the high 4 bits and the low 4 bits of each code unit. Similarly, the row labeled cpbyte(i) shows another u8-indexed property consisting of 8-bit code point values; this property will be described in a later section.

The examples above of u8-indexed property data streams illustrate a general concept of property streams that track data in one-to-one correspondence with code units of a UTF-8 byte stream in accordance with one or more embodiments of the present invention.

In addition, one or more embodiments of the present invention deal with data streams represented using UTF-16 and UTF-32. A property data stream is said to be u16-indexed if it is indexed in one-to-one correspondence with code units comprising a UTF-16 representation of a Unicode text. Similarly a property data stream is said to be u32-indexed if it is indexed in one-to-one correspondence with code units comprising a UTF-32 representation of a Unicode text. However, UTF-32 code units also have a one-to-one correspondence with Unicode code points, so a u32-indexed stream may also be said to be code point-indexed or character-indexed.

2. Inductive SIMD Instruction Set Architecture

This section introduces an inductive SIMD instruction set architecture useful for simplifying the description and implementation of operations on parallel data streams fabricated in accordance with one or more embodiments of the present invention. The inductive SIMD instruction set architecture includes basic capabilities of existing SIMD processors, including SIMD operations for integer arithmetic, bitwise logic and bit shifting, as well as field packing and merging. In addition, the inductive SIMD instruction set architecture extends these capabilities by providing support for inductive doubling, a property useful in some embodiments of algorithms in parallel bit stream processing in accordance with one or more embodiments of the present invention. As used herein, inductive doubling refers to algorithmic processes that involve repeated doublings of data element widths or other data attributes. Advantageously, inductive doubling considerably simplifies the initial description of many algorithms on parallel data streams so that techniques for handling implementation details on existing SIMD architectures can then be addressed as secondary issues.

The inductive SIMD instruction set architecture is based on SIMD operations over registers of total size $N=2^K$ bits, for some integer K. For example, for K=6, registers are 64 bits in size, as with Pentium MMX and Sun VIS facilities, while for K=7, registers are 128 bits in size, as with Pentium SSE (The term "SSE" will generally be used herein to represent a family of technologies including but not limited to Pentium SSE, SSE2, SSE3 and AMD extended 3D Now!) and Power PC Altivec facilities. Bits are numbered 0 to N−1 from left to right (big-endian convention). As described herein, the inductive SIMD instruction set architecture generally provides instructions in three-address form in which an N-bit destination register receives the value of applying a SIMD binary operation to two N-bit source registers. An alternative arrangement using two-address instructions is straightforward; for example, using one register as both source and destination.

In accordance with one or more embodiments of the present invention, inductive doubling provides for partitioning SIMD registers into N/n fields of width $n=2^k$ bits, for any k:0≤k≤K. For example, for K=6, the 64 bit SIMD registers may be treated as 64 1-bit fields, 32 2-bit fields, 16 4-bit fields, 8 8-bit fields, 4 16-bit fields, 2 32-bit fields or 1 64-bit field. Whenever a register r is partitioned into n-bit fields, the fields are indexed $r_n[0]$ through $r_n[N/n-1]$. Field $r_n[i]$ consists of bits i×n through (i+1)×n−1 of register r. The subscript may be omitted when referring to 1-bit fields; the ith 1-bit field of r, $r_1[i]$, is equivalent to the ith bit, r[i]. Bit j of field $r_n[i]$ is denoted $r_n[i][j]$ and is equivalent to r[i×n+j].

For each field width under this partitioning scheme, the inductive SIMD instruction set architecture provides unsigned integer addition, subtraction and multiplication as SIMD operations. Field width is specified as an operation modifier, applying to the result register as well as both source registers. Modular arithmetic confines results to the field widths as specified by the following equations.

$$r = \text{simd\_add}/n(a,b) \text{ implies } r_n[i] = (a_n[i] + b_n[i]) \bmod 2^n \quad (2.1)$$

$$r = \text{simd\_sub}/n(a,b) \text{ implies } r_n[i] = (a_n[i] - b_n[i] + 2^n) \bmod 2^n \quad (2.2)$$

$$r = \text{simd\_mult}/n(a,b) \text{ implies } r_n[i] = (a_n[i] \times b_n[i]) \bmod 2^n \quad (2.3)$$

Although existing SIMD architectures tend to provide more elaborate arithmetic models, including such options as signed arithmetic, saturating arithmetic, and double-sized result fields; the simple forms shown above suffice for parallel data stream operations described subsequently.

The inductive SIMD instruction set architecture also supports inductive doubling through half-operand modifiers that may be applied to SIMD register operands. These modifiers specify that only the high (/h) or low (/l) n/2 bits of each n-bit field are used in the operation. For example, if 8-bit fields of register s contain packed pairs of 4-bit values, these values may be added together to produce a register t of 8-bit sums by means of the operation t=simd_add/8(s/h, s/l). The following equations define the field values arising from half operand modification (where >> is the shift right operator).

$$r/h_n[i]=r_n[i]>>n/2 \quad (2.4)$$

$$r/l_n[i]=r_n[i] \bmod 2^{n/2} \quad (2.5)$$

In accordance with one or more embodiments of the present inventions, the above equations are defined to work with 1-bit fields by interpreting n/2 as [n/2]. Thus, $r/h_I[i]=0$ and $r/l_I[i]=r_I[i]$ in this case.

Together, the provision of integer operations at all field widths and the half-operand modifiers conveniently simplify parallel data stream algorithms. Existing SIMD architectures typically provide arithmetic operations on some, but not all, field widths, and half-operand selection only in special cases. Adapting algorithms to these architectures generally requires additional shifting and/or masking operations in the implementations.

Bitwise logical operations under the inductive SIMD instruction set architecture are straightforward and model capabilities of existing SIMD architectures closely. These operations may be considered to be implicitly associated with 1-bit field widths, although field width specifiers are not used. The following equations apply.

$$r=\text{simd\_and } (a,b) \text{ implies } r_I[i]=a_I[i] \wedge b_I[i] \quad (2.6)$$

$$r=\text{simd\_and } c(a,b) \text{ implies } r_I[i]=a_I[i] \wedge \neg b_I[i] \quad (2.7)$$

$$r=\text{simd\_or } (a,b) \text{ implies } r_I[i]=a_I[i] \vee b_I[i] \quad (2.8)$$

$$r=\text{simd\_nor } (a,b) \text{ implies } r_I[i]=\neg (a_I[i] \vee b_I[i]) \quad (2.9)$$

$$r=\text{simd\_xor } (a,b) \text{ implies } r_I[i]=a_I[i] \oplus b_I[i] \quad (2.10)$$

Note also that integer arithmetic at a field width of 1 may be specified, but reduces to the corresponding bitwise logical operation. That is, simd_add/1 and simd_sub/1 reduce to simd_xor while simd_mult/1 reduces to simd_and.

SIMD shift operations under the inductive SIMD instruction set architecture include shift left logical (simd_shll), shift right logical (simd_shrl), shift right arithmetic (simd_shra), and rotate left (simd_rotl) at each field width $n=2^k$. The n-bit data fields within a first operand register are each independently shifted by amounts specified by corresponding n-bit shift fields in a second operand register. However, only the k low-order bits of the shift fields are used to specify the shift amounts. For example, r=simd_shll/n(a, b) computes each field by $r_n[i]=a_n[i]<<(b_n[i] \bmod 2^k)$ These operations are equivalent to the corresponding Altivec operations on the Power PC for 8, 16 or 32 bit fields, but are also available for 2, 4, 64, or 128 bit fields in the idealized architecture.

The pack and merge operations common to SIMD architectures are generalized to all field widths under the idealized architecture. These may be viewed as operations which respectively halve or double the widths of data values and hence are core features in support of inductive doubling.

The simd_pack/n operation packs the n-bit fields of two N-bit input registers into n/2-bit fields in a single N-bit result register. The first N/2 bits of the result are formed by converting each of the n-bit fields of the first input operand to n/2 bits, while the second N/2 bits of the result are formed by correspondingly converting the n-bit fields of the second input operand. Conversion by means of signed or unsigned saturation or by truncation are feasible and satisfactory for the purpose of this invention. The following equations define the field values for r=simd_pack/n(a, b).

$$r_{n/2}[i]=\text{convert } (a_n[i],n/2), i<N/n \quad (2.11)$$

$$r_{n/2}[i]=\text{convert } (b_n[i-N/n],n/2), i \geq N/n \quad (2.12)$$

The simd_mergeh/n and simd_mergel/n operations select alternating n-bit fields from the two input operands to form 2n-bit fields in the result. The simd_mergeh operation takes n-bit fields from the high N/2 bits of each of the input operands, while the simd_mergel operation takes alternating n-bit fields from the low N/2 bits of each operand. The r=mergeh/n(a, b) operation is defined by the following equation.

$$r_{2n}[i]=a_n[i] \times 2^n + b_n[i] \quad (2.13)$$

Similarly, the r=mergel/n(a, b) operation is defined by the following equation.

$$r_{2n}[i]=a_n[i+N/2n] \times 2^n + b_n[i+N/2n] \quad (2.14)$$

3. One or More Embodiments of Parallel Data Stream Processing

Section 3. describes data stream processing methods that are fabricated in accordance one or more embodiments of the present invention. In particular, Section 3.1 describes how data streams may be processed using fixed size blocks and buffers. Section 3.2 describes a transposition operation that converts a byte stream (for example, a UTF-8 code unit stream) into a corresponding set of eight parallel bit streams. Sections 3.3 through 3.6 describe utility operations for extracting information from bit streams, including, respectively, bit counting, error bit detection, bit position determination, and run position determination. Section 3.7 describes the use of bit streams as deletion masks to provide for editing of parallel data streams, including bit streams in particular. Finally, Section 3.8 returns to the topic of transposition, and describes an inverse operation of parallel bit stream to serial byte transposition.

3.1 Blocks, Buffers, and Boundaries in Data Stream Processing

As illustrated in Section 2., parallel data streams constitute sequences of arbitrary length. As such, one or more embodiments of the present invention comprise processing such sequences using physical resources, with particular constraints on the number of sequence elements that can be stored and manipulated at one time.

Some embodiments of the present invention that utilize XMM registers of Pentium or compatible processors or Altivec registers of Power PC processors manipulate code units in blocks of 128 at a time and group blocks into buffers of 2048 code units (16 blocks per buffer). For such embodiments, a bit stream will use 128 bits (16 bytes) per block and 2048 bits (256 bytes) per buffer, while a byte stream will require 128 bytes per block and 2048 bytes per buffer.

In organizing processing of data streams in this manner, one must ensure correct processing of data streams in dealing with file, buffer and block boundaries. A general problem is that values of a data stream are often specified in terms of values of other data streams in different but nearby positions. For example, consider the determination of u8scope22($i$) in terms of u8prefix2($i$−1). In essence, u8scope22 is a shifted version of u8prefix2. However, because of end effects, a single shift instruction will not suffice to correctly implement the shift for all positions within the data stream. In general, there are four boundary conditions that must be considered.

1. i mod 128=0; a block-boundary crossing condition.

2. i mod 2048=0; a buffer-boundary crossing condition.
3. i=0; a beginning of file condition.
4. i=N; an end of file condition.

The block-boundary crossing and the buffer-boundary crossing conditions can be handled by preserving and combining information between consecutive iterations of a loop. Continuing with the example of u8scope22, let oldprefix2 and thisprefix2, respectively, be values of the u8prefix2 bit stream for the previous block (i.e., the previous time through the loop) and the current block respectively. Then, the value of u8scope22 may be computed by shifting the value of oldprefix2 left by 127 bits, shifting the value of thisprefix2 right by 1 bit, and forming the disjunction (logical 'or') of the results. In an iteration that processes each block within a buffer, the value of thisprefix2 at the end of each iteration can be used to establish the value of oldprefix2 for the next iteration. To begin processing the buffer, the value of oldprefix2 must be initialized to the value determined during processing of the last block of the previous buffer. Assuming this has been arranged, FIG. 2 shows a loop fragment implementing the calculation using the C-language interface for Altivec programming on the Power PC processor.

There are various ways to ensure that a value calculated for processing the last block of one buffer is made available to initialize processing of the first block of the next buffer. In accordance with one or more embodiments of the present invention, a ring of buffers is maintained as a general structure to support both lookbehind and lookahead operations. A ring of three buffers allows for previous, current and next buffers to be defined at all times. In the example, then, to initialize the value of oldprefix2 for processing the current buffer, it is a straightforward matter to retrieve or recompute the u8prefix2 value for the last block of the previous buffer. The concept of a buffer ring is well known in the prior art.

As described in Section 1.1, a convenient extension to the concept of data streams that allows beginning of file conditions to be handled easily is to consider that the u8data(i) and u8bit0(i) through u8bit7(i) have null (0) values for all negative positions i. This extension is easily implemented by specifying a null buffer (a buffer of all 0 values) as the initial value of the "previous" buffer when a file is opened. In this way, the shift operation that implements u8scope22(i)= u8prefix2(i−1) will correctly handle the beginning of file case by shifting in a 0 from u8prefix2(−1).

The final boundary condition that must be considered is the end-of-file case. As defined previously, the file consists of characters at positions 0 through N−1. However, the equation defining u8scope22 specifies a value at a position one past the end of file (i.e., at position N) in terms of the u8prefix2(N−1). It is thus possible that u8scope22(N)=1 in the event that that last code unit of the file is the prefix of a 2-byte sequence. Depending on the application, an embodiment of a system that is fabricated in accordance with the present invention may need to permit bit streams to extend beyond the end of file in this way. For example, in a task of UTF-8 validation, a value of u8scope22(N)=1 indicates an ill-formed UTF-8 code sequence at the end-of-file: a 2-byte sequence was initiated, but the end-of-file occurred before the expected suffix byte.

In some applications, it may be possible to simplify processing of block and/or buffer boundaries to avoid maintaining information between iterations. If the application involves natural and frequent break points across which information need not flow, then it may be worthwhile to employ a dynamic block shortening strategy that reduces the length of each block by the minimum value to reach such a break point. For example, in UTF-8 validation, decoding and/or transcoding, the beginning and end of each complete code unit sequence represents a natural break point. Block shortening involves a tradeoff: avoiding the cost of maintaining information flow across blocks, at the expense of a slight reduction in the number of elements processed per block and possibly the cost of dealing with data alignment issues.

3.1.1 General Shifts

Section 3.1 illustrated the case of single-bit shifting in bit stream generation. The single-bit shift is the most common operation in that it reflects a constraint or property relating to adjacent character positions. However, the same technique applies to multiple bit shifts. For example, consider a bit stream u8scope33 (a property data stream), denoting the 3rd byte position within a 3-byte sequence. UTF-8 prefix bytes between E0 and EF are reserved for 3-byte sequences; the u8scope33 stream has the value 1 whenever the u8prefix3 has the value 1 two positions previously.

$$u8\text{prefix}3(i) = u8\text{prefix}(i) \wedge u8\text{bit}2(i) \wedge \neg u8\text{bit}3(i) \quad (3.1)$$

$$u8\text{scope}33(i) = u8\text{prefix}3(i-2) \quad (3.2)$$

Calculation of u8scope33 thus requires a double-bit shift. Using the same strategy as that for single-bit shifts, the value of u8scope33 may be computed by shifting the value of oldprefix3 left by 126 bits, shifting the value of thisprefix3 right by 2 bits, and forming the disjunction (logical 'or') of the results. The u8scope33(0) and u8scope33(1) cases are handled by shifting in 0 values from u8prefix3(−2) and u8prefix3(−1), respectively, following the above-described convention that input data is null for all negative positions. This is handled automatically by initialization of the "previous" buffer to all zeroes at the beginning of the file.

The general pattern illustrated by these techniques applies for longer length shifts as well, i.e., up to the block size (128-bit shifts in the illustrated embodiment). Applications are generally limited to short-range shifts well below this limit. If necessary, however, shifts in excess of the block size can be accommodated by variations on this scheme that maintain access to more than one prior block (not just the last block).

3.1.2 End-of-Stream Padding

A UTF-8 data stream may or may not end on a natural buffer or block boundary. In order to simplify handling of the last block in a stream, however, one or more embodiments of the present invention pad the final block with null bytes beyond the logical end of file up to a full block (128-byte) boundary. In essence, this entails maintaining a full-block invariant; i.e., data streams may always be processed as if they consist of a whole number of blocks.

A full-block invariant simplifies implementation of methods designed to process one or more blocks of data. These methods include core methods that are fabricated in accordance with one or more embodiments of the present invention that are described in sections below. In essence, the simplification eliminates a need for an intra-block, end-of-stream test that might otherwise be required when processing each block, as well as any special code for handling a partial block. Advantageously, embodiments of methods written to the full-block invariant are easier to read and write, and hence, reduce the potential for coding errors. Furthermore, these simplifications avoid any performance penalty that may arise from intra-block bounds checking 3.1.3 Block Processing Circuitry One or more embodiments of the present invention implement one or more character stream processing functions as logic circuits operating on blocks of parallel bit stream data. Given a block size of N, bit stream equations involving logic and lookbehind shift operations may be implemented using logic circuitry as follows. For each basis stream used by the equations, an N-bit register is provided to hold one block of data from that stream at a time. For each distinct bit stream that is accessed in lookbehind shifted form within the set of equations, an s-bit register is provided to hold values of that term from the previous block, where s is the maximum size of the shift involving that term within any of the equations. For each logical operation ($\wedge$, $\vee$, $\neg$, $\oplus$), involving a distinct set of operands within the set of equations, an array of N logic gates (and, or, not, xor) is provided to compute the values of the one block segment of the derived bit stream corresponding to the given logical operation. Inputs to the gate arrays are wired from the outputs of registers holding basis streams, outputs of s-bit registers holding values stored for the previous block, or outputs from other gate arrays representing results of intermediate computations. Outputs that are needed in shifted form for processing the next block of input data are wired to the inputs of the corresponding s-bit register, for loading into that register in conjunction with a next-block signal.

In some applications, it may be possible to simplify processing of block boundaries to avoid maintaining bit stream values from previous blocks in s-bit registers. If the application involves natural and frequent break points across which information need not flow, then it may be worthwhile to employ a dynamic block shortening strategy that reduces the length of each block by the minimum value to reach such a break point. For example, in UTF-8 validation, decoding and/or transcoding, the beginning and end of each complete code unit sequence represents a natural break point.

3.2 Serial Byte to Parallel Bit Stream Transposition

In accordance with one or more embodiments of the present invention, transposition of an input byte stream into a corresponding representation as eight parallel bit streams is performed in accordance with a serial-byte-to-parallel-bit-stream transposition method which may be carried out, for example and without limitation, in a transposition unit. In particular, in accordance with one or more embodiments of the present invention, three binary division transformations are utilized to achieve the overall transposition where each transformation divides up an input stream into two half-length output streams. Three stages of such binary division transformations generate eight bit streams, each of one-eighth the length of the original input stream.

Using the inductive instruction set architecture, each of these three transformations can be implemented using simd_pack operations. In accordance with an embodiment of the present invention, one method entails using: (a) simd_pack/8 operations in a stage one transformation to divide the input byte stream into two streams of nybbles; (b) simd_pack/4 operations in a stage two transformation to divide the nybble streams into four streams of bit pairs; and (c) simd_pack/2 operations in a stage three transformation to produce the eight bit streams from the streams of bit pairs. FIG. 3 details this process, showing the transposition of eight consecutive registers of serial byte data (u8data0, u8data1, through u8data7) into eight parallel registers of bit stream data (u8bit0, u8bit1, through u8bit7). Note the use of the half-operand modifiers to select the high n/2 bits or low n/2 bits in conjunction with each simd_pack/n operation.

Alternative embodiments may use different strategies for dividing up bits within each stage, while still retaining the structure of a three-stage process using binary division transformations. For example, simd_pack/2 operations could be used in all three stages: (a) separating even bits (bit 0, 2, 4 and 6 of input bytes) from odd bits (bits 1, 3, 5, 7) in a stage one transformation; (b) further separating bits 0 and 4 from bits 2 and 6 and bits 1 and 5 from bits 3 and 7 in a stage two transformation; and (c) then dividing these into the individual bit streams in a stage three transformation.

While the three-stage structure of the transposition process carries over to embodiments using other SIMD architectures, alternative binary division strategies and additional implementation detail at each stage of transformation may be required, depending on the instruction set capabilities. For example, the finest-grained packing operation available with a number of existing architectures is the equivalent of simd_pack/16, packing doublebytes into bytes. Using packing operations at this level, the binary division transformations generally require additional masking and shifting operations. The number of additional operations required depends on choice of binary division strategy.

Using doublebyte-to-byte packing, a strategy of pairing up elements from consecutive bytes can constrain the overhead of masking and shifting operations to one shift and mask-select operation per output register per stage. In a first stage transformation, corresponding bits from two consecutive bytes are paired up, separating even bits from odd bits. That is, given consecutive bytes a and b in the input, the bits are divided into separate output streams having $a_0b_0a_2b_2a_4b_4a_6b_6$ and $a_1b_1a_3b_3a_5b_5a_7b_7$ byte patterns. In a second stage transformation, corresponding pairs from consecutive bytes are brought together to form runs of 4 bits. For example, given consecutive even bytes in $a_0b_0a_2b_2a_4b_4a_6b_6$ and $c_0d_0c_2d_2c_4d_4c_6d_6$ patterns, output bytes in the patterns $a_0b_0c_0d_0a_4b_4c_4d_4$ and $a_2b_2c_2d_2a_6b_6c_6d_6$ are formed. Then, a third stage transformation brings together runs of four to result in continuous bit streams. FIG. 4 illustrates the implementation of this process with an Altivec code fragment implementing the first stage transformation in accordance with an embodiment of the present invention, for example.

Alternative embodiments of serial to parallel byte transformation may use other techniques depending on instruction set architecture. For example, the pmovmskb operation on SSE-family processors allows the direct extraction of bit stream segments corresponding to 16 input bytes at a time.

In accordance with one or more embodiments of the present invention, a serial byte to parallel bit stream transposition is implemented as a routine that takes a data stream as a contiguous array of one or more blocks of UTF-8 byte data and writes bit stream data to eight preallocated output arrays. For example, a full buffer of 2048 bytes may be processed iteratively using 16 executions of a loop that processes the input array 128 bytes at a time. Each loop iteration generates 128 bits (16 bytes) per bit stream. Using the Altivec processor instruction set, for example, 72 logic, shift and pack instructions suffice to transform a block of 128 bytes in straight line code without branching. Organized in this way, the transposition code makes effective use of processor pipelining capabilities.

With an input byte stream meeting the full-block invariant, generated bit streams will also meet this invariant, considered in blocks of 128 bits (16 bytes).

3.3 Bit Detection Method and/or Unit

In accordance with one or more embodiments of the present invention, a bit detection method which may be carried out, for example and without limitation, in a bit detection unit, determines whether a full or partial bit buffer contains any occurrence of a 1 bit. In accordance one or more embodiments of the present invention, the unit is optimized so that absence of a bit may be verified in the shortest time. Successive 128-bit blocks are combined with a logical or operation until all blocks have been processed. A sum across this result is computed and tested for equality with zero. A nonzero value signals the occurrence of a 1 bit within the buffer. FIG. 5 shows an Altivec processor implementation in accordance with an embodiment of the present invention.

In accordance with one or more embodiments of the present invention, applications of bit detection include, for example and without limitation, error checking applications and optimization applications. In error checking applications, a bit vector may be computed to signal code unit positions at which particular types of error occur. Bit detection may be used to quickly verify the absence of error, or invoke error-handling code otherwise. In optimization applications, bit detection may be used to avoid special case handling of rarely occurring conditions. For example, 4-byte sequences occur quite rarely in UTF-8. When processing a buffer full of UTF-8 data, special case code dealing with 4-byte sequences may be skipped if no such sequence occurs within the buffer.

3.4 Bit Counting Method and/or Unit

In accordance with one or more embodiments of the present invention, a bit counting method, which may be carried out, for example and without limitation, in a bit counting unit, counts the number of 1 bits in a bit stream. Bit counting has a number of applications. One example is determining the number of lines in a file. By forming a bit stream that identifies end-of-line code units, this is transformed to a bit counting problem. Another example is determining the number of characters represented by a sequence of UTF-8 code units. By forming a bit stream identifying all non-suffix bytes, this also is transformed to a bit counting problem.

Counting bits within a $N=2^K$ bit register may be carried by K simd_add operations of the inductive instruction set architecture using an inductive doubling strategy. To count bits in a register x, the operation $r=simd\_add/2(x/l, x/h)$ is first used to produce N/2 fields each holding a 2-bit sum. The operation $r=simd\_add/4(r/l, r/h)$ is then applied to produce N/4 4-bit sums. The process continues with $r=simd\_add/8(r/l, r/h)$ to produce 8-bit sums and so on until a single N-bit sum remains.

A method that is fabricated in accordance with one or more embodiments of the present invention implements bit counting on a bit buffer meeting the full-block invariant, i.e., consisting of an array of one or more full blocks of 128 bits. In practice, bit counting is generally applied to a full buffer of 16 blocks at a time, providing for efficient use of the instruction pipeline. An integer result is returned.

One or more embodiments of the present invention implement a bit counting module as a dedicated logic circuit using adders or half-adders in accordance with techniques well known in the prior art.

3.5 Bit Position Arrays

Given a bit stream, it is frequently useful to generate an array of positions at which one bits are found, particularly in the case of relatively sparse bit streams. Such a position array allows iteration over all character positions matching a condition defined by the bit stream. Positions not matching the condition are simply skipped; this can substantially improve performance compared to byte-at-a-time processing. Conditional iterations formed in this way also have an advantage for pipelined architectures; i.e., branching logic that implements condition testing is eliminated from the loop body. This avoids performance penalties associated with branch misprediction within loops.

Bit position arrays can be constructed using bit scan instructions, such as bsf on Pentium processor architectures and cntlz on Power PC processor architectures. FIG. 6 shows an inline assembly implementation (GCC conventions) in accordance with one embodiment of the present invention suitable for a 32-bit Pentium architecture processor and compatible processors.

A method fabricated in accordance with one or more embodiments of the present invention determines bit positions given an input buffer meeting a full-block invariant, i.e., consisting of an array of one or more full blocks of 128 bits. In practice, full buffers of 16 blocks at a time are typically provided as input. The output array to receive bit positions must be preallocated to the maximum size anticipated; 2048 positions for a full buffer. An integer result is returned indicating the number of one bits found in the input buffer.

3.6 Run Position Arrays

An alternative to the use of bit position arrays for controlling conditional iterations is to use arrays of run positions, i.e., positions marking the beginning and ending of runs of consecutive 1 bits. This may reduce the number of iterations required considerably. Run arrays also create opportunities for parallelism by identifying consecutive runs of data elements that can all be processed in the same way. As with bit position arrays, iterations controlled by run position arrays avoid performance penalties of branch misprediction associated with condition testing within loops.

The methods described above for bit position determination can readily be extended for run determination by one of ordinary skill in the art routinely and without undue experimentation. The principal change required is to invert a bit stream being scanned once the start position of a run has been determined. This will allow the end of the run to be identified with the next scanning step, that is, as the first position in the inverted input that has a bit value of 1. Once the end of the run is found, the remaining bit stream is inverted to its original value to permit determination of the beginning of the next run.

A method fabricated in accordance with one or more embodiments of the present invention determines run positions given an input buffer meeting the full-block invariant, i.e., consisting of an array of one or more full blocks of 128 bits. In practice, full buffers of 16 blocks at a time are provided as input. The output array to receive run positions must be preallocated to the maximum size anticipated; 2048 positions maximum (1024 start positions and 1024 end positions) for a full buffer. An integer result is returned indicating the number of runs found in the input buffer.

3.7 Parallel Deletion Method and/or Unit

In accordance with one or more embodiments of the present invention, a parallel deletion method, which may be carried out, for example and without limitation, in a parallel deletion unit, performs deletion of one or more code units in one or more parallel data streams in accordance with a deletion mask. A deletion mask is defined as a bit stream consisting of is at positions identifying code units to be deleted and 0s at positions identifying code units to be retained. The data streams may be parallel bit streams such as a set of 8 parallel bit streams for UTF-8 code units, or byte streams such as a set of 2 parallel byte streams for UTF-16 code units or other forms of character-indexed data streams.

For example, consider an 8-bit deletion mask 10100010 and two corresponding 8-element parallel data streams abcdefgh and ABCDEFGH. Parallel deletion of elements from both data streams in accordance with the mask yields two five element streams, i.e., bdefh and BDEFH.

Deletion within fixed size fields or registers may produce results that are either left justified or right-justified. For example, a five-element stream bdefh within an eight-element register may be represented as either bdefhxxx or xxxbdefh, with don't care positions marked 'x'. Concatenating an adjacent right-justified result with a left justified result produces an important intermediate form known as a central deletion result. For example, xxbd and efhx may be respective right justified and left-justified results from the application of the 4-bit deletion masks 1010 and 0010 to the two consecutive 4-element stream segments abcd and efgh. Concatenation of xxbd and efhx produces the central result xxbdefhx, which may easily be converted to a either a left or a right justified 8-element result by an appropriate shift or rotate operation.

In accordance with one or more embodiments of the present invention, bit deletion is achieved by the method of central result induction. The process is initiated by considering pairs of adjacent bits to be 2-bit central deletion results. Inductive steps subsequently combine adjacent pairs of 2-bit central results to achieve 4-bit central results, combine pairs of 4-bit central results to achieve 8-bit central results, and so on. In general, given two adjacent n-bit central deletion results, the inductive step produces a 2n-bit central deletion result by right justifying the left n-bit result, left-justifying the right n-bit result and concatenating them together.

Using the inductive instruction set architecture, central result induction may be implemented using simd_rotl instructions at each induction level. Working with 128 bit registers, for example, the process begins by considering the bit stream data to be partitioned into 64 adjacent 2-bit central deletion results. A simd_rotl/2 instruction applies the necessary rotations to produce 32 4-bit central results. A simd_rotl/4 instruction then combines adjacent 4-bit results to produce 16 8-bit central results. The process continues with simd_rotl/8, simd_rotl/16, simd_rotl/32 and simd_rotl/64 instructions to produce an 128-bit central deletion result in six steps.

The techniques of section 3.1 are used to combine results from consecutive 128-bit blocks to perform deletion on longer length streams, such as buffers of 2048 bits used in accordance with one or more embodiments of the present invention.

The rotation factors used by each of the simd_rotl instructions must be established so that for every pair of n-bit results to be combined into a 2n-bit result, the left n-bit result is right-justified and the right n-bit result is left justified. Left justification of the right n-bit result requires that the result be shifted by the number of deleted elements on its left-side, that is the deletion count of the left n/2 bits of this n-bit result. For example, consider the 4-bit central deletion result xbxx corresponding to a deletion mask 1011 applied to the 4-bit segment abcd. Left justification to produce bxxx requires a left shift of 1, the deletion count of the first 2 bits of the mask. This left shift factor is used directly for the left rotate operation of simd_rotl, observing that any bits that rotate around to the right end are located in the don't care portion of the required result.

Right justification of the left result similarly requires a right shift by the deletion count of the right n/2 bits of the left n-bit result. To implement a right-shift using the left rotate operation of simd_rotl, a left rotate factor of n minus the deletion count is calculated. For example, consider the 4-bit central deletion result xxcx corresponding to a deletion mask 1101 applied to the 4-bit segment abcd. Right justification requires a right shift of 1. This may be implemented by a left rotate of 4−1=3, yielding xxxc, as required.

The rotation factors required for each simd_rotl operation are calculated in an inductive process as follows. Because a 1 bit in a deletion mask denotes a position to be deleted, each 0 or 1 in the deletion mask may be considered as the deletion count of the corresponding 1-bit field. Given the deletion mask in a register d1, the 64 deletion counts for 2-bit fields may be calculated using d2=simd_add/2(d1/h, d1/l). That is, each 2-bit field receives the sum of the high 1-bit count and the low 1-bit count. The 32 deletion counts for 4-bit fields are similarly produced by d4=simd_add/4(d2/h, d2/l) and so on. Deletion counts of high n/2 bit fields are used directly as rotation factors of right n-bit fields. Rotation factors of left n-bit fields are calculated using a simd_sub/n operation. The set of rotation factors used for each simd_rotl operation is then determined by selecting alternate values from those calculated for left n-bit fields and right n-bit fields.

The process of computing rotation factors is required only once for each set of parallel bit streams to be processed. The parallel deletion unit therefore provides a routine compute_deletion_info that calculates this information based on a deletion mask. The parallel deletion unit provides the routine delete_using_info to apply this information repeatedly on as many parallel bit streams as desired.

In accordance with one or more embodiments of the present invention, routines perform deletion within streams of bytes or doublebytes based on deletion masks. Deletion information is calculated based on bit masks considering, for example, 128 elements at a time. The computed information may then be used to perform deletion by byte rotation considered 16 bytes at a time within 128-bit registers or doublebyte rotation considered 8 doublebytes at a time within 128-bit registers.

Alternative embodiments may use an additive shift process in performing deletion by left-result induction. Similar to central result induction, the goal is to compute 2n-bit left deletion results by combination of adjacent pairs of n-bit left results. In general, this may be achieved by computing a 2n-bit additive shift term, and then, applying that term to the 2n-bit value formed by the adjacent n-bit inputs. The shift term is computed by multiplying the right n-bit input by $2^k-1$ where k is the deletion count of the left n-bit input. In essence, this implements a 2n-bit conditional shift by k; i.e., the rightmost n-bits are shifted while the nondeleted bits of the left n-bit input remain in place. Left result induction requires that all deleted bits be masked to zero before the process starts.

The multiplicative factors $2^k-1$ are readily determined during the preprocessing phase based on an observation. The bit representation of the factor $2^k-1$ as an unsigned n-bit integer consists of n−k 0s followed by k 1s. However, this bit pattern is precisely that of the updated deletion mask corresponding to the deletion result of the left n-bit input. Thus, by updating deletion masks as the deletion operation proceeds, the multiplicative factors are directly available.

A special case of left result induction is at step 1, determination of 2-bit left results. In this case, a single-bit multiplication is nominally required. However, single bit multiplication is equivalent to the logical and operation. The multiplication can hence be eliminated.

For subsequent steps, multiplications may still be effective. Although multiplications typically have significant latency, pipelined architectures can reduce the effective cost to a single instruction cycle. In such cases, and assuming the operation can be parallelized, the typical cost per induction step per bit stream is four operations: one copy, one mask, one multiplication and one shift.

Left result induction by additive shift may thus be used when an instruction set architecture provides simultaneous multiplication of a vector of elements by a vector of multipliers, but does not provide corresponding shift operations. For example, the SSE extensions of the Pentium architecture provide such operations yielding 16-bit, 32-bit or 64-bit results, but do not have corresponding operations to independently shift elements of those sizes by independent shift values.

In the event that an instruction set architecture does not provide simultaneous rotation of a vector elements by a vector of independent rotation counts, alternative embodiments may employ central result induction if the bit deletion operation is to be applied to multiple bit streams in parallel. In such a case, SIMD registers may be repacked so that parallel segments from several bit streams may be processed at once. When computing a 2n-bit central induction result, the ideal is that registers are repacked to use corresponding n-bit segments from several streams. In this case, all segments within the register are to be shifted by the same amount; i.e., there is no need for independent rotation of elements within the register.

An instruction set architecture may provide a capability for selecting arbitrary bits using an index vector. For example, the PowerPC provides such a facility through its vec_perm instruction as does the Sun VIS architecture through its vis_bshuffle instruction. An alternative embodiment of deletion of bytes or doublebytes is to initially use one of the deletion algorithms on index vectors and then apply the index vector to select the required nondeleted elements. If selection is to be arranged to a maximum of 16 elements at a time, a packed index vector using 4-bit index values may be initially computed. Deletion steps on this packed representation may have a twofold advantage over deletion steps on bytes or a fourfold advantage over deletion steps on doublebytes.

One or more embodiments of the present invention implement parallel deletion using dedicated logic circuitry. A logic circuit implementing parallel deletion on bit stream segments of $N=2^K$ bits may be realized as a K-stage logic circuit. The inputs to the first stage consist of a deletion mask and the parallel bit stream (the operand stream) to which parallel deletion is to be applied. The first stage first computes 2-bit deletion counts (deletion count stream) for each consecutive 2-bit field in the deletion mask. The first-stage partitioned shift register is wired to apply these counts to the rotation of each 2-bit field within the operand stream in accord with the method of central result induction. The updated deletion count stream and operand stream are connected to the inputs of the second stage. The second stage similarly adds pairs of adjacent deletion counts in 2-bit fields to produce 4-bit deletion counts and applies these counts to its operand stream in accord with the next stage of central result induction. Subsequent stages are configured similarly. The final stage is wired to perform the simple rotation of the N-bit central result to produce the final N-bit left deletion result.

3.8 Parallel Bit Stream to Serial Byte Transposition

A parallel bit stream to serial byte transposition process inverts the transposition process described in subsection 3.2 above. Three binary merging transformations are utilized to achieve the overall transposition. Each binary merging transformation combines two input streams to produce one double-length output stream. Three stages of such binary merging transformations generate one output stream of eight times the length of the original input stream. A binary merging transformation fabricated in accordance with one or more embodiments of the present invention will take as input fixed-length sections of eight parallel bit streams, each of the same length and satisfying the full-block invariant. FIG. 7 shows an embodiment using the simd_mergeh and simd_mergel instructions of the inductive instruction set architecture. Typically, full buffers of 2048 bits each will be supplied as input, generating full buffer of 2048 bytes into the preallocated data area.

In accordance with one or more embodiments of the present invention, the complementary transpositions allow applications to switch between byte processing and parallel bit stream processing at will.

4. Unicode Processing Methods

This section describes methods fabricated in accordance with one or more embodiments of the present invention that address specific requirements of Unicode text processing. UTF-8, UTF-16 and UTF-32 are each supported, including methods for code unit classification, validation and decoding. Transcoding operations between the representations are also provided.

Methods described in this section are fabricated in accordance with one or more embodiments of the present invention and utilize methods described above. In each case, equations are used to define bit streams relevant to particular processing requirements. In general, implementation details related to these equations that are not shown may be carried out by one of ordinary skill in the art routinely and without undue experimentation as a straightforward application of methods presented herein.

4.1 UTF-8 Byte Classification

A UTF-8 byte classifier forms useful bit stream definitions to support validation, decoding and conversion.

UTF-8 is based on 8-bit code units or bytes. Bytes in a range of hexadecimal 0-7F stand for Unicode code points directly. In essence, these are single-byte code unit sequences. Bytes in a range of hexadecimal 80-FF stand for multi-byte code unit sequences consisting of a prefix byte in a range of C0-FF and one or more suffix bytes, each in a range of hexadecimal 80-BF. Two-byte sequences have prefix bytes in a range of hexadecimal C0-DF; three-byte sequences have prefix bytes in a range of hexadecimal E0-EF; and four-byte sequences have prefix bytes in a range of hexadecimal F0-FF. Within these ranges, some prefix values are illegal, namely, C0, C1, and F5 through FF.

Section 1.1 defined u8prefix and u8prefix2 bit streams (property streams) to represent, respectively, the set of all prefix bytes and the set of those prefix bytes identifying the first bytes of two-byte sequences. Bit streams representing other byte classifications may similarly be defined by equations, as follows.

$$u8unibyte(i) = \neg\, u8bit0(i) \tag{4.1}$$

$$u8prefix(i) = u8bit0(i) \wedge u8bit1(i) \tag{4.2}$$

$$u8suffix(i) = u8bit0(i) \wedge \neg\, u8bit1(i) \tag{4.3}$$

$$u8prefix2(i) = u8prefix(i) \wedge \neg\, u8bit2(i) \tag{4.4}$$

$$u8prefix3or4(i) = u8prefix(i) \wedge u8bit2(i) \tag{4.5}$$

$$u8prefix3(i) = u8prefix3or4(i) \wedge \neg\, u8bit3(i) \tag{4.6}$$

$$u8prefix4(i) = u8prefix3or4(i) \wedge u8bit3(i) \tag{4.7}$$

$$u8badpfx2(i) = \\ u8prefix2(i) \wedge \neg\, (u8bit3(i) \vee u8bit4(i) \vee u8bit5(i) \vee u8bit6(i)) \tag{4.8}$$

$$u8badpfx4(i) = \\ u8prefix4(i) \wedge (u8bit4(i) \vee u8bit5(i) \wedge (u8bit6(i) \vee u8bit7(i))) \tag{4.9}$$

Corresponding to each occurrence of a UTF-8 prefix byte, particular expectations are established for a suffix byte at positions 2, 3 or 4 in a multi-byte sequence. Following the pattern of u8scope22 given previously, scope equations specifying the location of expected suffix bytes for 3 and 4 byte sequences are defined as follows.

$$u8scope22(i) = u8prefix2(i-1) \quad (4.10)$$

$$u8scope32(i) = u8prefix3(i-1) \quad (4.11)$$

$$u8scope42(i) = u8prefix4(i-1) \quad (4.13)$$

$$u8scope43(i) = u8prefix4(i-2) \quad (4.14)$$

$$u8scope44(i) = u8prefix4(i-3) \quad (4.15)$$

One additional definition is useful to identify those UTF-8 prefix bytes that require checking of special constraints on the immediately following suffix byte, i.e., the prefix bytes hexadecimal E0, ED, F0 and F4. The following definition can be used to distinguish these cases from other legal cases of 3-byte and 4-byte prefixes.

$$u8special(i) = \neg u8bit6(i) \land \neg (u8bit4(i) \oplus u8bit7(i)) \land \quad (4.16)$$
$$(u8bit3(i) \lor (\neg (u8bit4(i) \oplus u8bit5(i))))$$

In accordance with one or more embodiments of the present invention, creating property streams corresponding to each of these equations may be performed routinely by one of ordinary skill in the art without undue experimentation utilizing the disclosure herein, including that provided in Section 3.1. One or more embodiments of the present invention may implement a UTF-8 byte classification module as a logic circuit in accordance with the description of Section 3.1.3.

4.2 UTF-8 Validation

UTF-8 validation requirements can be expressed in terms of the UTF-8 byte classifications and scope expectations. Overall, eight violation conditions must be checked. The first two violation conditions identify invalid prefixes in ranges reserved for two-byte and four-byte sequences respectively; these are given by u8badpfx2 and u8badpfx4 as defined above.

The third and fourth violation conditions identify unpaired UTF-8 prefix and suffix bytes. The third violation condition identifies positions at which a suffix byte is expected, but does not occur. The fourth violation condition identifies positions at which a suffix byte occurs, but is not expected. Both the third and fourth violation conditions can be checked at once using a logical xor operation.

$$anyscope(i) = u8scope22(i) \lor u8scope32(i) \lor \quad (4.17)$$
$$u8scope33(i) \lor u8scope42(i) \lor u8scope43(i) \lor u8scope44(i)$$

$$u8mismatch(i) = anyscope(i) \oplus u8suffix(i) \quad (4.18)$$

The fifth through eighth violation conditions represent constraints on the first UTF-8 suffix byte whenever the UTF-8 prefix byte has one of the hexadecimal values E0, ED, F0, and F4, respectively. In each case, the suffix byte is constrained to a particular subset of the 80-BF range generally used for UTF-8 suffix bytes. The permitted suffix ranges in each case are E0:A0-BF, ED:80-9F, F0:90-BF, F4:80-8F. Correspondingly, the disallowed suffix ranges in each case are E0:80-9F, ED:A0-BF, F0:80-8F, F4:90-BF.

In the case of the E0 and ED prefixes, note that the permissible suffixes are complementary. That is, bit 2 of the suffix must be set (A0-BF), whenever bit 4 of the prefix is not set (E0), while bit 2 of the suffix must not be set (80-9F), whenever bit 4 of the prefix is set (ED). This allows a single definition to handle both cases.

$$u8badsfx32(i) = \quad (4.19)$$
$$u8scope32(i) \land u8special(i-1) \land \neg (u8bit4(i-1) \oplus u8bit2(i))$$

Similarly, the final two violation conditions also involve complementary requirements on suffixes. In the case that bit 4 of the prefix is not set (F0), neither bit 2 nor bit 3 of the suffix may be set, while in the case that bit 4 of the prefix is set (F4), at least one of bit 2 or bit 3 of the suffix must be set.

$$u8badsfx42(i) = u8scope42(i) \land \quad (4.20)$$
$$u8special(i-1) \land \neg (u8bit4(i-1) \oplus (u8bit2(i) \lor u8bit3(i)))$$

Overall, these definitions permit the set of all UTF-8 violations to be identified as a disjunction of the bitstreams for each of the conditions identified above.

$$\quad (4.21)$$
$$u8invalid(i) = u8badpfx2(i) \lor u8badpfx4(i) \lor$$
$$u8mismatch(i) \lor u8badsfx32(i) \lor u8badsfx42(i)$$

One or more embodiments of the present invention are one or more methods that implement these equations; which methods may be implemented routinely by one of ordinary skill in the art without undue experimentation utilizing the disclosure herein, including that provided in Section 3.1. Once all blocks in a buffer have been processed, the bit detection facility of Section 3.3 may be applied. If an error is detected, further processing of the input may be aborted, and an error signal may be returned to an application. In addition, one or more methods of the present invention involve carrying out one or more of the above-described validation methods in a UTF-8 validation unit (utilizing software instructions, hardware instructions, or a combination of software and hardware instructions).

One or more embodiments of the present invention may implement a UTF-8 validation module as a logic circuit in accordance with the description of Section 3.1.3.

4.3 UTF-8 Decoding

A UTF-8 decoding method, which may be carried out, for example and without limitation, in a UTF-8 decoding unit (utilizing software instructions, hardware instructions, or a combination of software and hardware instructions), allows an application to determine a sequence of Unicode code points corresponding to a UTF-8 data stream. This is generally useful, among other things, as a preprocessing step in converting to an alternative encoding form or in returning individual character or string values to the application.

FIG. 8 shows a correspondence between UTF-8 code units and code point byte values. The different sequence types are aligned so that the last bytes of the sequences line up; this serves to highlight common patterns across code sequences.

Note that FIG. 8 shows one code point byte value corresponding to each UTF-8 byte. It is thus convenient to define a u8-indexed property stream cpbyte(i) to be a code point byte value, as shown, corresponding to u8data(i). Similarly, cpbit0

($i$) through cpbit7($i$) are defined as parallel bit streams for bit0 through bit7, respectively, of cpbyte($i$).

As shown in FIG. 8, there are some common patterns between byte classes. It is thus convenient to define terms to capture these commonalities.

$$u8lastsuffix(i) = u8scope22(i) \lor u8scope33(i) \lor u8scope44(i) \quad (4.22)$$

$$u8lastbyte(i) = u8lastsuffix(i) \lor u8unibyte(i) \quad (4.23)$$

$$u8butlastsuffix(i) = u8scope32(i) \lor u8scope43(i) \quad (4.24)$$

$$u8butlastbyte(i) = u8butlastsuffix(i) \lor u8prefix2(i) \quad (4.25)$$

Decoding is accomplished through individual bit equations for cpbit0 through cpbit7. Each equation could be defined using a disjunction of ten terms, one each defining the value of the bit for one of the ten byte classifications. However, the common patterns make for considerable simplification of the equations. For example, cpbit0 is 0 except for last and butlast suffix bytes. In the three cases of a last suffix byte, cpbit0 is bit as shown in FIG. 8; in each case this bit corresponds to bit6 of the preceding u8data byte. In the two cases of a butlast suffix byte, cpbit0 is bit j, corresponding to bit4 of the preceding u8data byte.

$$cpbit0(i) = (u8lastsuffix(i) \land u8bit6(i-1)) \lor \quad (4.26)$$
$$(u8butlastsuffix(i) \land u8bit4(i-1))$$

Definitions of other bits follow similar patterns.

$$cpbit1(i) = (u8lastsuffix(i) \land u8bit7(i-1)) \lor \quad (4.27)$$
$$(u8butlastsuffix(i) \land u8bit5(i-1)) \lor (u8unibyte(i) \land u8bit1(i))$$

$$cpbit2(i) = \quad (4.28)$$
$$(u8lastbyte(i) \land u8bit2(i)) \lor (u8butlastsuffix(i) \land u8bit6(i-1))$$

$$cpbit3(i) = \quad (4.29)$$
$$(u8lastbyte(i) \land u8bit3(i)) \lor (u8butlastsuffix(i) \land u8bit7(i-1)) \lor$$
$$(u8scope42(i) \land u8bit5(i-1))$$

$$cpbit4(i) = (u8lastbyte(i) \land u8bit4(i)) \lor \quad (4.30)$$
$$(u8butlastsuffix(i) \land u8bit2(i)) \lor (u8scope42(i) \land u8bit6(i-1))$$

$$cpbit5(i) = (u8lastbyte(i) \land u8bit5(i)) \lor \quad (4.31)$$
$$(u8butlastbyte(i) \land u8bit3(i)) \lor (u8scope42(i) \land u8bit7(i-1))$$

$$cpbit6(i) = (u8lastbyte(i) \land u8bit6(i)) \lor \quad (4.32)$$
$$(u8butlastbyte(i) \land u8bit4(i)) \lor (u8scope42(i) \land u8bit2(i))$$

$$cpbit7(i) = (u8lastbyte(i) \land u8bit7(i)) \lor \quad (4.33)$$
$$(u8butlastbyte(i) \land u8bit5(i)) \lor (u8scope42(i) \land u8bit3(i))$$

Creating a cpbyte byte stream may be carried out by one of ordinary skill in the art routinely and without undue experimentation using the parallel bit stream to serial byte transposition described in Section 3.8.

One or more embodiments of the present invention may implement a UTF-8 decoding module as a logic circuit in accordance with the description of Section 3.1.3.

4.4 UTF-16 Data Streams

A UTF-16 processing method that is fabricated in accordance with one or more embodiments of the present invention allows Unicode text data to be processed in terms of any of the UTF-16, UTF-16LE or UTF-16BE encoding schemes. These schemes differ in whether the bytes of each 16-bit code unit occur in little-endian or big-endian order, and whether a byte-order mark may be used to signal endianness.

To read input from a UTF-16 data source in accordance with one or more embodiments of the present invention, the source is opened in one of the UTF-16, UTF-16LE or UTF-16BE modes. A value for endianness is determined in accordance with any one of a number of methods that are well known to those of ordinary skill in the art and stored. When opened in UTF-16 mode, big-endian is stored as the initial default. However, examination of the first two bytes of input may override this setting. If the first two bytes of input are hexadecimal FF and FE, respectively, then this is considered to be a byte order mark indicating little-endianness. The mode is set to little-endian, and the byte order mark is discarded. If the first two bytes of input are hexadecimal FE and FF, respectively, the mode is maintained as big-endian, and the first two bytes are discarded. Otherwise, the first two bytes of input are kept and the default mode of big-endian is maintained.

When a data stream is opened in UTF-16LE mode, the endianness is set to little-endian. No inspection of the first two input bytes for a byte order mark is made. Similarly, when a data stream is opened in UTF16-BE mode, the endianness is set to big-endian, and input processing proceeds directly without examination for a potential byte order mark.

In accordance with one or more embodiments of the present invention, conversion of UTF-16 input data to parallel bit streams proceeds by first computing u16-indexed parallel byte streams u16byte0 and u16byte1 for the most significant and least significant bytes of each logical UTF-16 code unit. In big-endian mode, the u16byte0 byte stream consists of the first byte of each 16-bit value from the UTF-16 data source, while the u16byte1 byte stream consists of the second byte of each such 16-bit value. In little-endian mode, the byte order is reversed. On typical SIMD architectures, a single SIMD pack operation is required for each two consecutive registers full of consecutive UTF-16 data. Using the inductive instruction set architecture, for example, the operations simd_pack/16(x/h, y/h) and simd_pack/16(x/l, y/l), respectively, compute u16byte0 and u16byte1 byte stream segments from an original big-endian UTF-16 segment contained in registers x and y.

The serial byte to parallel bit stream unit of Section 3.2 is then applied to generate bit streams. Bit streams u16bit0 through u16bit7 are generated by transposition from the u16byte0 byte stream, while bit streams u16bit8 through u16bit15 are generated by transposition from the u16byte1 byte stream.

4.5 UTF-16 Surrogate Pairs and Validation

Unicode code points in ranges 0-D7FF hexadecimal and E000 to FFFF hexadecimal are directly represented as 16-bit values in UTF-16. Unicode code points in a range 10000 to 10FFFF hexadecimal are represented as surrogate pairs; i.e., two consecutive UTF-16 code units in the respective ranges D800-DBFF and DC00-DFFF. UTF-16 validation requires that code units in an overall range D800-DFFF only occur in accordance with the surrogate pair convention.

In accordance with one or more embodiments of the present invention, the following definitions classify UTF-16 code units as low or high surrogates for validation and decoding.

$$u16surrogate(i) = \quad (4.34)$$
$$u16bit0(i) \land u16bit1(i) \land \neg u16bit2(i) \land u16bit3(i) \land u16bit4(i)$$

-continued $$u16surrogatelo(i) = u16surrogate(i) \land \neg u16bit5(i) \quad (4.35)$$

$$u16surrogatehi(i) = u16surrogate(i) \land u16bit5(i) \quad (4.36)$$

There are two potential types of invalid UTF-16 code unit sequences. The first is a sequence with a low surrogate code unit that is not immediately followed by a high surrogate. The second is an occurrence of a high surrogate that is not immediately preceded by a low surrogate. Both conditions can be determined using a single exclusive- or test that identifies mismatches of either kind $$u16invalid(i)=u16surrogatehi(i) \oplus u16surrogatelo(i-1) \quad (4.37)$$

One or more embodiments of the present invention may implement a UTF-16 validation module as a logic circuit in accordance with the description of Section 3.1.3.

4.6 UTF-32 Data Streams

A UTF-32 processing method that is fabricated in accordance with one or more embodiments of the present invention allows Unicode text data to be processed in terms of any of the UTF-32, UTF-32LE or UTF-32BE encoding schemes. The schemes differ in whether the bytes of each 32-bit code unit occur in little-endian or big-endian order, and whether a byte-order mark may be used to signal endianness.

In accordance with one or more embodiments of the present invention, to read input from a UTF-32 data source, the source is opened in one of the UTF-32, UTF-32LE or UTF-32BE modes. A value for endianness is also determined in accordance with any one of a number of methods that are well known to those of ordinary skill in the art and stored. When opened in UTF-32 mode, big-endian is stored as the initial default. However, examination of the first four bytes of input may override this setting. If the first four bytes of input are hexadecimal FF, FE, 00, and 00, in that order, then this is considered to be a byte order mark indicating little-endianness. The mode is set to little-endian, and the byte order mark is discarded. If the first four bytes of input are hexadecimal 00, 00, FE, and FF, in that order, the mode is maintained as big-endian, and the first four bytes are discarded. Otherwise the first four bytes of input are kept and the default mode of big-endian is maintained.

When a data stream is opened in UTF-32LE mode, the endianness is set to little-endian. No inspection of the first four input bytes for a byte order mark is made. Similarly, when a data stream is opened in UTF32-BE mode, the endianness is set to big-endian, and input processing proceeds directly without examination for a potential byte order mark.

UTF-32 code units represent Unicode code points directly. However, only 21 bits are required to represent all Unicode code points from hexadecimal 0000 through 10FFFF. In accordance with one or more embodiments of the present invention, a method for converting UTF-32 to parallel bit streams is thus designed to generate the 21 significant bit streams for further processing, while validating that the most 11 significant bits of each UTF-32 code unit are set to 0.

The conversion process proceeds by first computing four parallel byte streams u32byte0, u32byte1, u32byte2 and u32byte3 for the four bytes of each logical UTF-32 code unit, in order, from most significant to least significant. In big-endian mode, u32byte0, u32byte1, u32byte2 and u32byte3, respectively, consist of the first, second, third and fourth bytes of each 32-bit code unit from the UTF-32 data source. In little-endian mode, the byte order is reversed. In accordance with one or more embodiments of the present invention, these conversions may be implemented readily by one of ordinary skill in the art using straightforward packing operations of SIMD processors.

Corresponding to the most significant 8 bits of each code unit, the u32byte0 stream is used only to validate that all bits are zero. The serial byte to parallel bit stream unit of Section 3.2 is applied to each of the u32byte1, u32byte2 and u32byte3 streams to generate three corresponding sets of eight parallel bit streams. The individual bit streams in the three sets are labeled u32bit8 through u32bit15, u32bit16 through u32bit23, and u32bit24 through u32bit31, respectively. However, streams u32bit8 through u32bit1 0 are used only to validate that all bits are zero. The streams labeled u32bit11 through u32bit31 hence comprise the 21 significant bit streams of Unicode.

Once the UTF-32 code units are converted to parallel bit streams, a final validation step is carried out to ensure that code points are confined to the ranges 0000 to D7FF hexadecimal and E000 to 10FFFF hexadecimal.

$$(4.38)$$

$$u32invalid(i) =$$

$$\neg 32bit11(i) \land \neg u32bit12(i) \land \neg u32bit13(i) \land \neg u32bit14(i) \land$$

$$\neg u32bit15(i) \land u32bit16(i) \land u32bit17(i) \land$$

$$\neg u32bit18(i) \land u32bit19(i) \land u32bit20(i)$$

One or more embodiments of the present invention may implement a UTF-32 validation module as a logic circuit in accordance with the description of Section 3.1.3.

4.7. Transcoding

One or more embodiments of the present invention include methods for transcoding between the UTF-8, UTF-16 and UTF-32 representations of Unicode.

An example of UTF-8 to UTF-16 transcoding is illustrative. FIG. 9 shows an input/output diagram of UTF-8 to UTF-16 bit-space transcoder 1000 (U8U16BIT 1000) that is fabricated in accordance with one or more embodiments of the present invention. U8U16BIT 1000 converts one 128 code unit block of validated UTF-8 input data 1001 into corresponding UTF-16 output data 1002. However, only complete UTF-8 code unit sequences are transcoded; any code units of an incomplete multibyte sequence at the end of the input block are ignored. The number of UTF-8 code units processed is provided as output u8count 1003, while the number of UTF-16 code units generated is provided as output u16count 1004. Input 1001 consists of eight parallel 128-bit segments of u8-indexed bit streams u8bit0 through u8bit7. Output 1002 consists of sixteen parallel 128-bit segments of u16-indexed bit streams u16bit0 through u16bit15. The first u16count 1004 positions of the output streams represent UTF-16 code units corresponding to the first u8count 1003 positions of the UTF-8 input.

Figure 10:
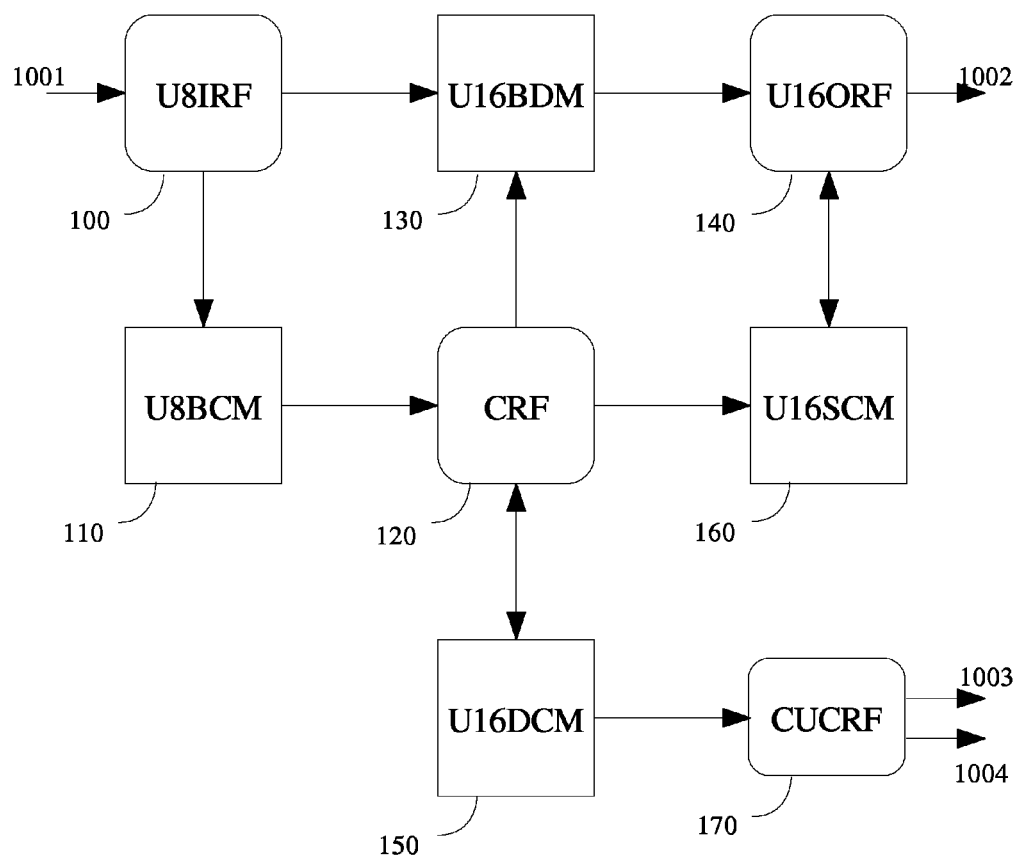
FIG. 10 shows a block diagram of an internal structure that is fabricated in accordance with one embodiment of the present invention of the UTF-8 to UTF-16 bit-space transcoder shown in FIG. 9.

FIG. 10 shows the internal structure of U8U16BIT 1000. A brief overview serves to introduce the modules of U8U16BIT 1000 and their roles; a detailed description follows below. U8U16BIT 1000 includes: three register files, UTF-8 Input Register File 100 (U8IRF 100), Control Register File 120 (CRF 120), and UTF-16 Output Register File 140 (U16ORF 140). Each of these register files comprise a set of 128-bit registers that store parallel 128-bit segments of bit stream data. In particular, in accordance with this embodiment, U8IRF 100 is initialized on input to store parallel 128-bit segments each of input data streams u8bit0 through u8bit7;

and CRF 120 is used to store property stream segments that control the functions of UTF-16 Bit Decoder Module 130 (U16BDM 130) and UTF-16 Stream Compression Module 160 (U16SCM 160). The property stream segments stored in CRF 120 are prepared by UTF-8 Byte Classification Module 110 (U8BCM 110) and UTF-16 Deletion Control Module (U16DCM 150). Specifically, U16BDM 130 prepares initial values of UTF-16 stream segments in u8-indexed form, and stores them in U16ORF 140. U16SCM 160 operates on the UTF-16 stream segments stored in U16ORF 140 to convert them to u16-indexed form. Code Unit Count Register File 170 (CUCRF 170) comprises two 8-bit registers to store integers reporting the number of UTF-8 and UTF-16 code units involved in the transcoding process.

After input of u8bit0 through u8bit7 stream segments into U8IRF 100, U8BCM 110 computes parallel bit stream segments that classify the code units at each position in accordance with the equations of Section 4.1, namely u8unibyte, u8suffix, u8prefix, u8prefix2 through u8prefix4 and u8scope22 through u8scope44. U8BCM 100 stores the computed property stream segments in CRF 120 for use by U16BDM 130 and U16DCM 150.

Upon completion of code unit classification by U8BCM 110, U16BDM 130 computes a u8-indexed intermediate form of the final UTF-16 data in accordance with the specifications shown in FIG. 11. The intermediate form consists of two sets of bit stream segments labeled u16hi and u16lo in FIG. 11 which comprises eight bit stream segments each, u16hi0 through u16hi7 and u16lo0 through u16lo7. For each class of UTF-8 byte, FIG. 11 shows the bit patterns that exist at a code unit position of that class. The patterns for the u16hi0 through u16hi7 and u16lo0 through u16lo7 bits are shown in terms of the corresponding UTF-8 pattern of u8bit0 through u8bit7. Note that, in multibyte sequences, some values of u16hi or u16lo bits are defined in terms of UTF-8 bit values at prior positions within the code unit sequence.

One complexity in the decoding process is the transformation of a five-bit efghi pattern in UTF-8 data into a four-bit abcd pattern in the UTF-16 form, where efghi=abcd−1. As shown in the table of FIG. 11, the efg bits occur as u8bit5 through u8bit7 at u8prefix4 positions, while the hi bits occur as u8bit2 and u8bit3 at u8scope42 positions. The transformed ab and cd bit patterns are realized as u16hi6/7 and u16lo0/1 bits at u8scope42 positions. In accordance with the constraints of valid UTF-8 data, the value of efghi is in a range 00001 through 10000, so the value of abcd=efghi−1 will be in the range 0000 through 1111.

The following equations detail the operation of U16BDM 130. The values of u8lastsuffix, and u8lastbyte are first determined in accord with equations 4.22 and 4.23.

$$u8surrogate(i) = u8scope42(i) \lor u8scope44(i) \quad (4.39)$$

$$u16hi0(i) = (u8scope33(i) \land u8bit4(i-2)) \lor u8surrogate(i) \quad (4.40)$$

$$u16hi1(i) = (u8scope33(i) \land u8bit5(i-2)) \lor u8surrogate(i) \quad (4.41)$$

$$u16hi2(i) = u8scope33(i) \land u8bit6(i-2) \quad (4.42)$$

$$u16hi3(i) = (u8scope33(i) \land u8bit7(i-2)) \lor u8surrogate(i) \quad (4.43)$$

$$u16hi4(i) = (u8scope33(i) \land u8bit2(i-1)) \lor u8surrogate(i) \quad (4.44)$$

$$u16hi5(i) = (u8lastsuffix(i) \land u8bit3(i-1)) \lor u8scope44(i) \quad (4.45)$$

The definitions of u16hi6, u16hi7, u16lo1 and u16lo2 incorporate the logic for abcd=efghi−1 at u8scope42 positions. The least significant bit is always negated, while other bits are negated depending on whether a borrow is generated.

$$u16lo1(i) = (u8unibyte(i) \land u8bit1(i)) \lor \\ (u8lastsuffix(i) \land u8bit7(i-1)) \lor (u8scope42(i) \land (\neg u8bit3(i))) \quad (4.46)$$

$$u16borrow0(i) = u16lo1(i) \quad (4.47)$$

$$u16lo0(i) = (u8lastsuffix(i) \land u8bit6(i-1)) \lor \\ (u8scope42(i) \land (u8bit2(i)) \oplus u16borrow0(i)) \quad (4.48)$$

$$u16borrow1(i) = u16lo1(i) \land \neg u8bit2(i) \quad (4.49)$$

$$u16hi7(i) = (u8lastbyte(i) \land u8bit7(i)) \lor \\ (u8scope42(i) \land (u8bit7(i-1) \oplus u16borrow1(i))) \quad (4.50)$$

$$u16borrow2(i) = u16borrow1(i) \land \neg u8bit7(i-1) \quad (4.51)$$

$$u16hi6(i) = (u8lastsuffix(i) \land u8bit4(i-1)) \lor \\ (u8scope42(i) \land (u8bit6(i-1) \oplus u16borrow2(i))) \quad (4.52)$$

The remaining equations are:

$$u16lo2(i) = (u8lastbyte(i) \land u8bit2(i)) \lor (u8scope42(i) \land u8bit4(i)) \quad (4.53)$$

$$u16lo3(i) = (u8lastbyte(i) \land u8bit3(i)) \lor (u8scope42(i) \land u8bit5(i)) \quad (4.54)$$

$$u16lo4(i) = (u8lastbye(i) \land u8bit4(i)) \lor (u8scope42(i) \land u8bit6(i)) \quad (4.55)$$

$$u16lo5(i) = (u8lastbyte(i) \land u8bit5(i)) \lor (u8scope42(i) \land u8bit7(i)) \quad (4.56)$$

$$u16lo6(i) = \\ (u8lastbyte(i) \land u8bit6(i)) \lor (u8scope42(i) \land u8bit2(i+1)) \quad (4.57)$$

$$u16lo7(i) = \\ (u8lastbyte(i) \land u8bit7(i)) \lor (u8scope42(i) \land u8bit3(i+1)) \quad (4.58)$$

U16BDM 130 computes the bit stream segments for u16hi0 through u16hi7 and u16lo0 through u16lo7 and stores the resulting values in U16ORF 140.

Once the u16lo and u16hi computations are complete, the principal remaining task is to convert the stored values from the intermediate u8-indexed form to the final u16-indexed form through parallel bit deletion. U16DCM 150 computes u16delmask to identify positions at which deletions take place. Deletions take place at all code unit positions marked delete in FIG. 11, namely at u8prefix positions as well as u8scope32 and u8scope43 positions. In addition, if an incomplete four-byte UTF-8 sequence is found in the final one to three code-unit positions of the block, deletion at the u8scope42 position of this code unit sequence is specified. To accommodate this latter concern, it is convenient to treat u8suffix(i) as having the value 0 for i≥128.

$$(4.59)$$
$$u16delmask(i) = u8prefix(i) \lor \\ u8scope32(i) \lor u8scope43(i) \lor (u8scope42(i) \land \neg u8suffix(i+2))$$

Based on this deletion mask, U16DCM 150 further computes deletion information as described in section 3.7 and stores this information in CRF 120. In accordance with one or more embodiments, this deletion information is determined based on the method of central result induction. Seven 128-bit sets of rotation counts are stored in CRF 120, corresponding to six steps of central result induction (combining 64 2-bit results into 32 4-bit results, combining 32 4-bit results into 16 8-bit results and so on until one 128-bit central result is computed), followed by a final rotation value to convert the 128-bit central result into a 128-bit left result.

U16DCM 150 further uses u16delmask to determine the number of UTF-16 code units that result from the transcoding process. One UTF-16 code unit is produced for every 0 bit in u16delmask. The u16delmask is inverted, the bit counting method and/or unit of section 3.4 is applied thereto and the result is stored in the u16count register of CUCRF 170.

U16DCM 150 also computes the number of UTF-8 code units that are transcoded, and stores this value in the u8count register of CUCRF 170. The u8count value is determined by a bit count operation applied to the inverse of u8incomplete, defined as follows.

$$u8\text{incomplete}(i) = (u8\text{prefix}(i) \land \neg u8\text{suffix}(i+1)) \lor \quad (4.60)$$
$$(u8\text{prefix3or4}(i) \land \neg u8\text{suffix}(i+2)) \lor$$
$$(u8\text{prefix4}(i) \land \neg u8\text{suffix}(i+3))$$

U16SCM 160 is responsible for conversion of u8-indexed u16hi and u16lo data sets into the final set of sixteen parallel u16-indexed bit stream segments u16bit0 through u16bit15. The parallel deletion method and/or unit of section 3.8 is applied to each of the sixteen stream segment registers of U16ORF 140. This effectively performs the conversion from u8-indexed form to u16-indexed form in place. One or more embodiments apply the method of central result induction using the rotation counts previously computed and stored in CRF 120 by U16DCM 130.

With the completion of stream compression by U16SCM 160 and the generation of u8count and u16count by U16DCM 130, the required outputs of U8U16BIT 1000 are stored and available in U16ORF 140 and CUCRF 170.

One or more embodiments implement U8U16BIT 1000 using operations of a 128-bit inductive SIMD instruction set processor. One or more alternative embodiments implement U8U16BIT 1000 or one or more components thereof using dedicated logic circuitry in accordance with the descriptions of Sections 3.1.3. 3.4 and/or 3.7.

In accordance with one or more further embodiments of the present invention, a combination of bit-space and byte-space techniques are used to implement byte-space transcoding of UTF-8 byte streams to corresponding UTF-16 doublebyte streams. A byte-space transcoder takes UTF-8 byte stream data as input and first converts it to parallel bit-stream form using the methods and/or unit of Section 3.2. One or more embodiments employ a bit-space transcoder to produce UTF-16 data in the form of 16-parallel bit streams. The high eight and low eight bit streams are each transposed to serial byte form using the methods and/or unit of Section 3.8. The two byte streams are interleaved using simd_merge operations to produce the UTF-16 doublebyte stream. One or more alternative embodiments use a modified bit-space transcoder that omits conversion to u16-indexed form in bit-space. Transposition of u8-indexed bit streams to doublebyte-space is performed prior to deletion of data corresponding to u8prefix, u8scope32 and u8scope43 positions. Conversion to u16-form is then carried out in doublebyte space, employing index vectors to select nondeleted bytes as described in Section 3.7.

In accordance with one or more embodiments of the present invention, an ASCII optimization is implemented in transcoding. Using the bit detection method of section 3.3, blocks or buffers may be examined to determine whether the entire block or buffer consists of characters within the ASCII subset of UTF-8 or not. Any one bit in u8bit0 signifies a non-ASCII character; if no such bit is detected the block or buffer may be processed in a simplified fashion. For example, a bit-space transcoder may optimize the processing of ASCII blocks or buffers by setting all u16hi bit streams to 0, all u16lo bit streams to the values of the corresponding u8 bit streams and skipping the bit deletion step (as there are no u8prefix, u8scope32 or u8scope43 positions within the ASCII block or buffer.) One or more embodiments of byte-space transcoding optimize processing of ASCII blocks or buffers by direct insertion of null bytes into the ASCII byte stream, bypassing bit-space transformations.

In accordance with one or more embodiments of the present invention, a quadbyte optimization is implemented in transcoding. Using the bit detection method of section 3.3, blocks or buffers may be examined to determine whether the entire block is free of four-byte UTF-8 sequences or not. If the block starts with other than a suffix byte and u8prefix4 consists entirely of zero bits, transcoding is carried out by simplified routines that omit logic for processing quadbyte sequences.

4.8 Validation, Decoding and/or Transcoding as Operating System Services

One or more embodiments of the present invention may provide validation, decoding and/or transcoding as part of an operating system or as a part of standard library services. In accordance with one or more such embodiments of the present invention, a general purpose transcoding service may be implemented in accordance with conventions of the iconv specification. In accordance with one or more such embodiments, an additional transcoding service may implement transcoding services to or from Unicode formats and a plurality of other non-Unicode character encodings. In accordance with one or more such embodiments, such additional transcoding service may employ parallel bit stream methods following one or more of the techniques described previously, or it may employ standard techniques well-established in the prior art. Transcoding between different non-Unicode character encodings may be implemented by a two-step process involving decoding the source character representation to Unicode code points following by encoding of these code points according to the requirements of the destination character encoding.

4.9 Validation, Decoding and/or Transcoding Virtual Machine Services

One or more embodiments of the present invention may provide validation, decoding and/or transcoding as services of a virtual machine or run-time environment. In accordance with one or more such embodiments, the virtual machine or run-time environment may standardize on a particular internal representation of characters such as, for example and without limitation, UTF-16. In accordance with one or more such embodiments, I/O services provided by the virtual machine or run-time environment may automatically convert to and from the standard internal representation to that required for input or output.

4.10 Validation, Decoding and/or Transcoding Appliances

One or more embodiments of the present invention may provide validation, decoding and/or transcoding as services within a network appliance. In accordance with one or more embodiments, a local area network may be configured to standardize on a particular Unicode transformation format or other coded character set representation for one or more classes of application file. Transcoding services within a network appliance may be used to convert to or from this representation whenever logical data packets are received from, or sent to, a wide area network to which the local area network is connected. Applications executing within the local area network may also use the services of the network appliance. Transcoding between different non-Unicode character encodings may be implemented by a two-step process involving decoding the source character representation to Unicode code points following by encoding of these code points according to the requirements of the destination character encoding.

4.11 Validation and/or Transcoding in XML Processors

One or more embodiments of the present invention integrate validation and/or transcoding within an XML processor. An XML processor accepts input data in either UTF-8 or UTF-16, and may accept data using any of a plurality of other encodings. In accordance with one or more such embodiments, an XML processor provides parsed element and text data to applications in a UTF-16 representation or other character encoding in accordance with an application programmer interface (API). Whenever the input character encoding differs from the API character encoding, the XML processor transcodes data from the input form to the API form. Prior to, or during, transcoding, validation of character data is performed to ensure that character data is valid in accord with encoding requirements or that an error condition is otherwise signaled.

4.12 Validation, Decoding and/or Transcoding in Office Software

One or more embodiments of the present invention integrate validation, decoding and/or transcoding within an office application such as, for example and without limitation, a word processor, a spreadsheet, a database, or presentation software. The office application defines an internal document representation that is a preferred form for working with documents in memory and also defines a native file format used as a preferred form for storing working documents. One or more such embodiments may use the XML-based Open Document Format of OASIS as a native format, while other embodiments may use Microsoft Office OpenXML. The office application provides file import and export filters for a variety of other data formats used in the industry. Whenever the character encoding of an input file differs from the encoding required by the internal document representation, transcoding of the input form to the internal form is performed. Whenever the character encoding of an output file differs from the encoding required by the internal document representation, transcoding is integrated into the output process appropriately.

4.13 Validation, Decoding and/or Transcoding in Database Systems

One or more embodiments of the present invention integrate validation, decoding and/or transcoding within database systems. For example, SQL CHARACTER SET specifications at the server, database, table and column levels allow applications to store data in any of a plurality of character encodings, and also to mix encodings within applications. SQL CONVERT operations directly invoke a transcoding unit fabricated in accordance with one or more such embodiments to produce character data in the required encoding for a server, database, table or column.

4.14 Validation, Decoding and/or Transcoding in Portable Communication Devices

One or more embodiments of the present invention integrate validation, decoding and/or transcoding within portable communication devices such as cellphones, personal digital assistants or wireless e-mail devices. In general, these devices may send and receive character stream data over a network. Validation, decoding, and/or transcoding may be invoked by the device to ensure that character stream data received from the network is in the correct form for processing by the communication software of the device. Transcoding may also be invoked to convert character stream data from the native format used by the device to the form required for transmission over a network.

4.15 Validation and Transcoding in Textbase Acquisition Systems

One or more embodiments of the present invention integrate validation and transcoding in text acquisition systems. In general, these systems acquire and integrate text from a variety of sources into a unified textbase. Upon retrieval of text data from a particular source, a validation step is applied to ensure that the text data is correctly represented in accord with the character encoding scheme used by that source. In the event that the encoding scheme used by the source is not that used internally by the textbase, transcoding is applied to convert the textual data from the external form used by the data source into the internal form used by the textbase.

5. One or More Embodiments of an Inductive SIMD Instruction Set Architecture 5.1 Embodiments Using Emulation on Existing SIMD Instruction Set Architectures In accordance with one or more embodiments of the present invention, the inductive SIMD instruction set architecture described in Section 2. is implemented through macros using existing SIMD instruction set architectures. For example, the inductive SIMD instruction set architecture with 128 bit registers may be implemented as a set of macros using the Altivec instruction set of the Power PC, using the C language interface. Each instruction of the inductive SIMD instruction set architecture maps to a set of three-argument macros, whose names are of the form simd_OP_W_XY, where OP is the operation name, W is the field-width (operation modifier) and X and Y are codes for the two operand modifiers, in order. The code "h" specifies the "/h" half-operand modifier, the code "l" specifies the "/l" half-operand modifier, and the code "x" specifies no operand modifier. The arguments to each macro consist of a destination register, and two operand registers of an inductive instruction. Thus, an inductive instruction r=simd_pack/4(a/h, b) would map to the macro call simd_pack_4_hx(r, a, b) using this naming scheme.

The macros are conveniently organized by instruction/field-width combinations. For each such combination, there is a set of nine macros for the different pairs of operand modifier codes: hh, hl, hx, lh, ll, lx, xh, xl, xx. Of these, the xx macro represents a base form in which neither operand is modified before applying the instruction logic. Each of the other forms may be implemented in terms of the base form after applying operand modifications in accord with the "l" and "h" codes.

The operand modifications associated with "l" codes are implemented using logical and operations to mask off the high-order n/2 bits of each n-bit field. The masks consist of alternating patterns of n/2 zeroes followed by n/2 ones for the full Altivec register width of 128 bits. For example, the "l"

code for 4-bit fields corresponds to applying a mask consisting of 16 bytes each having the hexadecimal value 0x33.

The operand modifications associated with "h" codes are implemented using shift right logical operations, followed by a masking operation where necessary. The shift constant is n/2 bits, i.e., half the field width. Where possible (i.e., with 8, 16, 32, and 128 bit field widths on the Altivec) the field width of the Altivec instruction is chosen to match that of the inductive instruction. No subsequent masking is required in these cases. In the other cases, an Altivec shift with a larger field width is used, followed by application of the masking operation associated with the "l" code for the given field width.

When an instruction/field-width combination is directly available in the Altivec instruction set (i.e., generally with 8, 16 and 32 bit field widths), the implementation strategy is straightforward. The "xx" macros map directly to this Altivec instruction, while the other forms first apply the required operand modifications as described above. FIG. 12 shows the general pattern with the example of the nine macros for the case of simd_add/16.

The general pattern is simplified in some instances when the semantics of an instruction mean that the high n/2 bits of a particular operand play no role. The "/l" operand modifier has no effect in such instances. For example, this is true for the shift operand (second operand) in the various shift and rotate instructions. As a consequence, the macros ending in "l" may be simplified to the equivalent "x" versions that perform no modification of the second operand. A similar simplification applies for both operands of simd_pack instructions (under the truncation model of conversion). Implementation of inductive instructions for 4-bit fields generally proceeds by combining the results from two applications of the corresponding Altivec instruction on 8-bit fields. One such application handles the high 4-bit field of each byte, while the second handles the corresponding low 4-bit fields. Masking and/or shifting operations are used to position the 4-bit field values appropriately for applying the 8-bit instruction. Where possible, the results are arranged so that they may be combined with a single vec_sel or vec_or operation. FIG. 13 shows the example of simd_srl_4.

In the case of 2-bit field widths, it is possible to combine results from four applications of Altivec operations on 8-bit fields. In most cases, however, it is simpler to use logic operations to determine each bit of the two bit field as a Boolean function of the four bits of the operands. For example, consider the subtraction $c_0c_1 = a_0a_1 - b_0b_1$ as an operation on 2-bit fields. The equation $c_1 = a_1 \oplus b_1$ may be used to calculate the least significant bit while $c_0 = a_0 \oplus b_0 \oplus (\neg a_1 \wedge b_1)$ includes the borrow term in calculating the most significant bit. Implemented using SIMD logical operations, these calculations handle one bit each of the 64 two-bit fields within a 128-bit register. FIG. 14 shows an Altivec implementation combining these calculations for the simd_sub/2 operation. This figure also illustrates optimizations that may apply when both operands have modifiers.

Implementation of inductive instructions for 64-bit and 128-bit field widths is straightforward using similar techniques to those described above. Combining results of 32-bit arithmetic operations to produce results for 64-bits or 128-bits is well known in the prior art and can make use of Altivec operations such as vec_addc and vec_subc, designed to produce carries for the purpose. The Altivec does provide shift operations capable of working with 128-bit field widths. SIMD shifting of two 64-bit fields can be implemented by combining together the results of two 128-bit shifts in a fashion similar to the implementation of 4-bit shifts using operations on 8-bit field widths. Alternative embodiments may combine results of 32-bit shifts to produce 64-bit results.

5.2 Embodiments Using Modified SIMD Architectures

One or more embodiments of the present invention implement the inductive SIMD instruction set architecture through additions or modifications to pipeline stages of existing SIMD processors. The description below focuses on those components of the SIMD processor that are directly involved in embodiments of the inductive doubling architecture. Other components of the SIMD processor may be realized in a number of ways that are well known to those of ordinary skill in the art.

Figure 22:
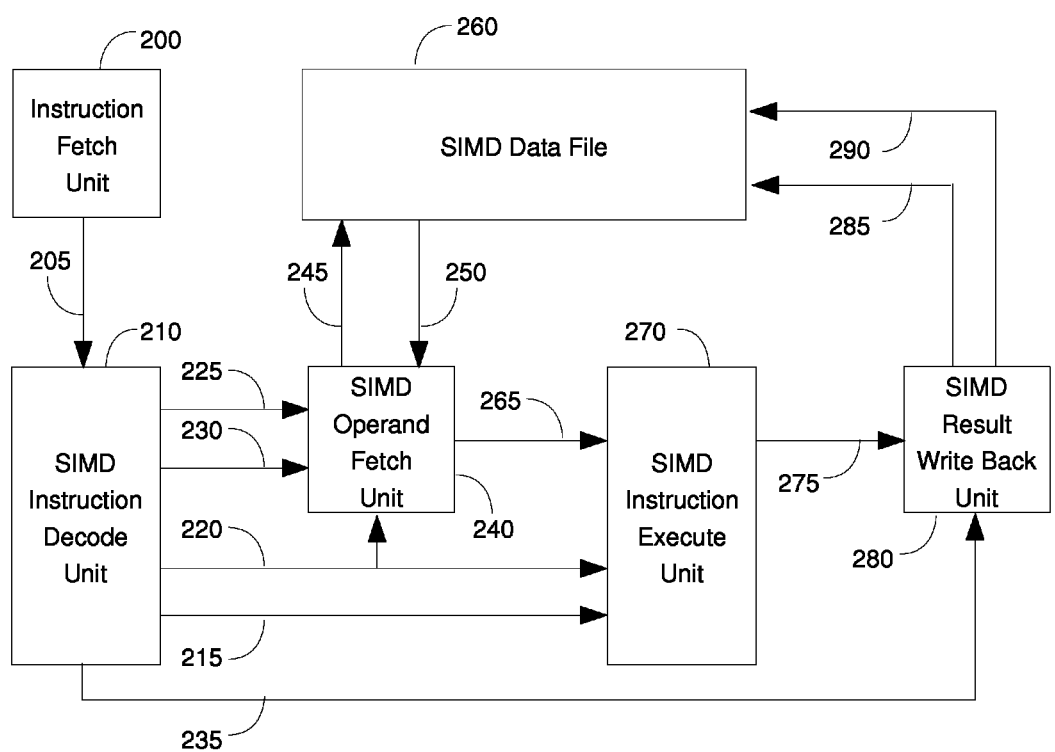
FIG. 22 shows a block diagram of a SIMD processor that is fabricated in accordance with one or more embodiments of the present invention.

FIG. 22 shows a block diagram of a SIMD processor that is fabricated in accordance with one or more embodiments of the present invention. Instruction Fetch Unit 200 (IFU 200) shown in FIG. 22 loads instructions for execution by the processor, in accordance with methods well known to those of ordinary skill in the art. In accordance with one or more embodiments of the present invention, IFU 200 may load SIMD instructions, including inductive double instructions, and non-SIMD instructions. However, for ease of understanding, the following will describe processing related to SIMD instructions. As shown in FIG. 22, IFU 200 supplies SIMD instructions as input 205 to SIMD Instruction Decode Unit 210 (SIDU 210) in accordance with any one of a number of methods that are well known to those of ordinary skill in the art.

In response to input 205, SIDU 210 decodes the input instructions to produce signals used to control subsequent processing of the instructions. The decoded instruction signals include: (a) SIMD operation identification signals 215; (b) SIMD field width identification signals 220; (c) SIMD source operand identification signals 225; (d) SIMD half-operand modifier signals 230; and (e) SIMD destination operand identification signals 235. Each of these signals is further defined below. As shown in FIG. 22, SIMD operation identification signals 215 are supplied as input to SIMD Instruction Execution Unit 270 (SIEU 270) to identify the instruction to be executed. As further shown in FIG. 22, SIMD field width identification signals 220 are supplied as input to SIEU 270 and to SIMD Operand Fetch Unit 240 (SOFU 240) to identify the field width supplied as an operation modifier to the instruction ("/2", "/4" and so on). As further shown in FIG. 22, SIMD source operand identification signals 225 are supplied as input to SOFU 240 to identify the two source locations from which operand values for the SIMD instruction are to be taken. As further shown in FIG. 22, SIMD half-operand modifier signals 230 are supplied as input to SOFU 240 to identify the operand value modifications (if any) that are to be applied to each of the two source operand values based on the respective half-operand modifier codes ("/h" and "/l") of the decoded instruction. Lastly, as shown in FIG. 22, SIMD destination operand identification signals 235 are supplied as input to SIMD Result Write Back Unit 280 (SRWBU 280) to identify the destination location that is to receive the value to be computed in accordance with the decoded instruction.

In accordance with one or more embodiments of the present invention, SIMD operation identification signals 215 include one signal for each possible SIMD instruction, including simd_add, simd_sub, simd_mult, simd_and, sind_andc, simd_or, simd_nor, simd_xor, simd_shll, simd_shrl, simd_shra, simd_rotl, simd_pack, simd_mergeh, and simd_mergel. Subsequently, these signals will be referred to using the instruction name without the initial "simd_" prefix. Each operation identification signal has the logical value 1 if the decoded instruction has the corresponding opcode, and has the value 0 otherwise. Exactly one operation identification signal will have the logical value 1 in response to the decoding of any particular SIMD instruction. SIMD operation identification signals 215 are produced by SIDU 210 in accordance with instruction decoding methods well known to one of ordinary skill in the art.

In accordance with one or more embodiments of the present invention fabricated to operate with a SIMD processor employing registers of $N=2^K$ bits, SIMD field width identification signals 220 consist of a set of K+1 bits, which may be considered to be a K+1 bit unsigned integer w specifying a field width. Because field widths are powers of 2, exactly one of these bits will have the value 1 in response to the decoding of any particular SIMD instruction. SIMD field width identification signals 220 are produced by SIDU 210 in accordance with instruction decoding methods well known to one of ordinary skill in the art.

In accordance with one or more embodiments of the present invention, fabricated to operate with a SIMD processor having M SIMD registers, SIMD source operand identification signals 225 comprise two sets of signals where each consists of a $\lceil \log_2 M \rceil$ bit unsigned integer specifying the register number from which retrieval of the corresponding operand value is to take place. SIMD source operand identification signals 225 are produced by SIDU 210 in accordance with instruction decoding methods well known to one of ordinary skill in the art.

In accordance with one or more alternative embodiments, SIMD source operand identification signals 225 comprise signals that identify memory locations from which operand values are to be retrieved using any of a number of memory addressing modes that are well known to one of ordinary skill in the art.

In accordance with one or more embodiments of the present invention, SIMD half-operand modifier signals 230 comprise two binary signals for each operand, the first signal h having a value 1 whenever the "/h" operand modifier is specified for the operand and a value 0, otherwise, and the second signal l having a value 1 whenever the "/l" operand modifier is specified for the operand and a value 0, otherwise. SIMD half-operand modifier signals 230 are produced by SIDU 210 in accordance with instruction decoding methods well known to one of ordinary skill in the art.

In accordance with one or more embodiments of the present invention, fabricated to operate with a SIMD processor having M SIMD registers, SIMD destination operand identification signals 235 consist of a $\lceil \log_2 M \rceil$ bit unsigned integer specifying the register number into which the result of executing a SIMD instruction is to be placed. SIMD destination operand identification signals 235 are produced by SIDU 210 in accordance with instruction decoding methods well known to one of ordinary skill in the art.

In accordance with one or more embodiments of the present invention, SOFU 240 is responsible for retrieving operand values for the two source operands of a SIMD instruction and for applying any specified half-operand modification logic thereto. In response to SIMD source operand identification signals 225, SOFU 240 applies these two sets of signals as input (i.e., as signals 245) to SIMD Data File 260 (SDF 260) to simultaneously retrieve two sets of operand values 250 in accordance with methods well known to one of ordinary skill in the art. SOFU 240 then independently processes the two sets of retrieved operand values 250 in response to SIMD half-operand modifier signals 230 and SIMD field width identification signals 220 in accordance with equations 2.4 and 2.5 set forth above and as detailed below. SOFU 240 then supplies the two sets of possibly modified operand data values as input (i.e., as signal 265) to SIEU 270.

In accordance with one or more embodiments of the present invention, logic circuitry within SOFU 240 implements the shifting and masking requirements of equations 2.4 and 2.5 by direct logical operations for each individual bit of the register values in accordance with any one of a number of methods well known to those of ordinary skill in the art. For example, let r be an operand value retrieved by SOFU 240 from SDF 260, and let s be a corresponding value to be produced by half-operand modification in accordance with equations 2.4 and 2.5. Consider, as an arbitrary example, circuitry for determining s[69] in working with 128-bit registers. This bit has various interpretations depending on the field width w. In a case where w=2, s[69] represents the low-order bit of the 34th 2-bit field, that is, $s_2[34][1]$. In a case where w=4, s[69] represents the second bit of the 17th 4-bit field, that is $s_4[17][1]$. Interpretations for other field widths include, respectively, $s_8[8][5]$, $s_{16}[4][5]$, $s_{32}[2][5]$, $s_{64}[1][5]$, and $s_{128}[0][69]$. In some cases, the bit lies in the high n/2 bits (field widths of 4, 16, 32 and 64 in the example); and in other cases, the bit lies in the low n/2 bits of the field (field widths of 2, 8 and 128). When either the "/h" or "/l" half-operand modifiers are specified (h=1 or l=1), the high n/2 bits of the result field are 0 in accordance with equations 2.4 and 2.5. Thus the logic circuit must produce s[69]=0, whenever the field width is 4, 16, 32 or 64, in conjunction with either modifier. When l=1, the low n/2 bits of the result field are unchanged from the input in accordance with the mod operation of equation 2.5. Thus the logic circuit must produce s[69]=r[69] whenever the field width is 2, 8 or 128 in conjunction with the "/l" modifier. When h=1, the high n/2 bits of the input are right-shifted to produce the low n/2 bits of the result field. Thus, with a field width of 2, $s_2[34][1]$ is computed by a right shift of 1 from $r_2[34][0]$, with a field width of 8, $s_8[8][5]$ is computed by a right shift of 4 from $r_8[8][1]$ and with a field width of 128, $s_{128}[0][69]$ is computed by a right shift of 64 from $r_{128}[0][5]$. Equivalently, the logic circuit must produce s[69]=r[68] when w=2, s[69]=r[65] when w=8, and s[69]=r[5] when w=128. When neither the "/h" nor "/l" half-operand modifiers are specified (h and/both 0), the logic circuitry must produce s[69]=r[69]. Given an eight bit field width w, the constraints w=128, w=64 and so on are represented by individual bits of the field width w[0], w[1] and so on. In light of this analysis, then, the logic circuitry for s[69] can then be constructed in accordance with the following equation.

$$s[69] = h \wedge (w[0] \wedge r[5] \vee w[4] \wedge r[65] \vee w[6] \wedge r[68]) \vee \\ \neg h \wedge (\neg l \vee w[0] \vee w[4] \vee w[6]) \wedge r[69] \quad (5.1)$$

Equations for each bit of modified operand value s may be determined using a similar analysis. These equations may be used to construct logical circuits by one skilled in the art routinely and without undue experimentation. Circuit optimizations may be achieved by rearranging terms, identifying common subexpressions and eliminating duplicate circuitry.

In accordance with one or more embodiments of the present invention, SOFU 240 includes separate half-operand modification circuitry for each operand in order to support simultaneous retrieval and modification of the operands.

Alternative embodiments may use a sequential strategy in order to use one set of half-operand modification circuitry for multiple operands.

In accordance with one or more embodiments of the present invention, SDF 260 is a set of registers incorporated in a SIMD processor in accordance with techniques well known in the prior art. In accordance with one or more such embodiments, SDF 260 consists of a set of M registers, each of width $N=2^K$ bits.

In accordance with one or more alternative embodiments, SDF 260 comprises memory and/or registers for storing SIMD data values.

In accordance with one or more embodiments of the present invention, SIEU 270 is an arithmetic and logic unit fabricated in accordance with any one of a number of techniques well known to one of ordinary skill in the art to execute SIMD instructions. The instructions to be executed are identified by the SIMD operation identification signals 215, in conjunction with SIMD field width identification signals 220. The instruction applies to two possibly modified register operand values supplied as input 265. The result value of the SIMD instruction execution is determined in accordance with the equations specified in Section 2 above. This result value is supplied as execution result signal 275 to SRWBU 280.

In accordance with one or more embodiments, SIEU 270 includes circuitry for simultaneous execution of the instructions at all inductive doubling levels. This circuitry may be constructed by extension of well-known techniques widely deployed for SIMD processing in conjunction with field widths of 8, 16 and/or 32 bits to the other required field widths.

One or more embodiments of SIEU 270 that are fabricated in accordance with the present invention perform SIMD processing on 2-bit fields using simplified circuitry specialized to this case. For example, a shift unit for simd_shll/2, shrl/2, shra/2 and rotl/2 may be constructed as follows. Let a and b be register values supplied as input 265 to SIEU 270, specifying respectively, an array of 2-bit values to be shifted and an array of 2-bit shift or rotate counts. Further, let shra, rotl, shll, and shrl, be operation identification signals provided as part of input 215, each having the value 1 to indicate decoding of the corresponding opcode and 0, otherwise. The following equations may then be used as the basis of circuitry implementing these instructions.

$$r_2[i][0] = \tag{5.2}$$
$$a_2[i][0] \wedge (\neg\, b_2[i][1] \vee shra) \vee a_2[i][1] \wedge b_2[i][1] \wedge (rotl \vee shll)$$

$$r_2[i][1] = \tag{5.3}$$
$$a_2[i][1] \wedge \neg\, b_2[i][1] \vee a_2[i][0] \wedge b_2[i][1] \wedge (rotl \vee shrl \vee shra)$$

These equations may be directly translated into simple logic circuits for individually computing the two result bits for each result field $r_2[i]$. However, a single circuit for the common subexpressions $(rotl \vee shll)$ and $(rotl \vee shrl \vee shra)$ should be shared.

In accordance with one or more embodiments of the present invention, SRWBU 280 is responsible for storing the result of a SIMD instruction execution into the appropriate destination within SDF 260. The address of the destination to receive the result is supplied to SRWBU 280 as input signal 235, while the computed value to be stored as the result of SIMD execution is supplied to SRWBU 280 as input signal 275. In response to these signals, SRWBU 280 supplies the address of the destination as input 285 to SDF 260 and the computed value to be stored as input 290 to SDF 260. SRWBU 280 may be fabricated in accordance with well-known methods by those with ordinary skill in the art.

In accordance with one or more embodiments of the present invention, IFU 200, SIDU 210, SOFU 240, SIEU 270 and SRWBU 280 are implemented in one or more separate pipeline stages. In addition, in accordance with one or more embodiments of the present invention, execution of half-operand modification of SOFU 240 is in a separate pipeline stage from that of SIEU 270.

In accordance with one or more alternative embodiments of the present invention, half-operand modification logic is implemented as a self-contained pipeline stage separated from operand fetch. In addition, in accordance with one or more alternative embodiments of the present invention, half-operand modification logic is implemented in combination with an initial pipeline stage within SIEU 270.

6. Collected Discussion of One or More Embodiments of the Present Invention

Figure 15:
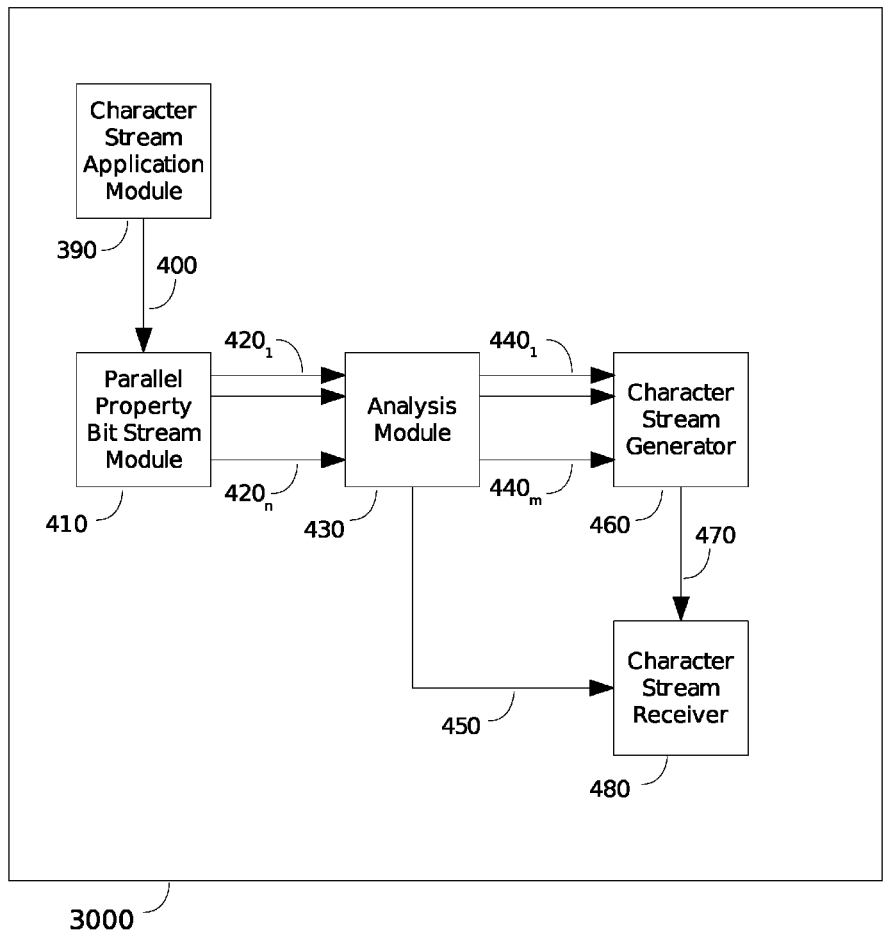
FIG. 15 shows a block diagram of a module that is fabricated in accordance with one or more embodiments of the specification.

FIG. 15 shows a block diagram of module 3000 that is fabricated in accordance with one or more embodiments of the specification. In accordance with one or more embodiments of the present invention, module 3000 may be: (a) an operating system or a library service package; (b) a virtual machine or a run-time environment; (c) a network appliance; (d) an XML processor; (e) an office application such as, for example and without limitation, a word processor, a spreadsheet, a database, or presentation software; (f) a database system; (g) a portable communication device such as, for example and without limitation, a cellphone, a personal digital assistant or a wireless e-mail device; and (h) a text acquisition system. The following describes the portion of module 3000 that pertains to character stream processing since methods for interfacing with the portion described herein and the rest of module 3000 are well known to those of ordinary skill in the art. Further, the specific manner in which the processing is utilized in such embodiments has been described above.

As shown in FIG. 15, character stream application module 390 of module 3000 applies character stream 400 as input to parallel property bit stream module 410 (character stream application module 390 is an appropriate part of, for example and without limitation, an operating system; a library service package; a virtual machine; a run-time environment; a network appliance; an XML processor; an office application such as, for example and without limitation, a word processor, a spreadsheet, a database, or presentation software; a database system; a portable communication device such as, for example and without limitation, a cellphone, a personal digital assistant or a wireless e-mail device; or a text acquisition system). As one of ordinary skill in the art can readily appreciate, the term "applied as input" is used in the broadest sense as transferred between co-located or distributed (as in systems and networks) hardware or software. In response, parallel property bit stream module 410 generates parallel property data streams (for example, parallel property bit streams) $420_1$ to $420_n$ in accordance with one or more embodiments of the present invention described herein. In accordance with one or more embodiments of the present invention, parallel property bit stream module 410 may be, for example, and without limitation, a software or a hardware module that is embodied in the manner described herein or in any manner that incorporate these teachings.

As further shown in FIG. 15, parallel property data streams $420_1$ to $420_n$ are applied as input to analysis module 430. Analysis module 430 performs one or more of the functions described herein such as, without limitation, validation, decoding and/or transcoding in the manner described herein. In response, analysis module 430 generates parallel property data streams (for example, parallel property bit streams) $440_1$ to $440_m$ and perhaps property detection property data stream 450. As was described above, for a UTF-8 to UTF-16 transcoding application, n may not be equal to m. Further, as one of ordinary skill may readily appreciate, property data stream 450 may be utilized, for example and without limitation, to indicate whether input is invalid. In accordance with one or more embodiments of the present invention, analysis module 430 may be, for example, and without limitation, a software or a hardware module that is embodied in the manner described herein or in any manner that incorporate these teachings.

As further shown in FIG. 15, parallel property data streams $440_1$ to $440_m$ are applied as input to character stream generator module 460. In response, character stream generator module 460 generates a character stream 470 in accordance with one or more embodiments of the present invention described herein. In accordance with one or more embodiments of the present invention, character stream generator module 460 may be, for example, and without limitation, a software or a hardware module that is embodied in the manner described herein or in any manner that incorporate these teachings. As one of ordinary skill in the art can readily appreciate, character stream 470 and/or property data stream 450 are applied as input to character stream receiver module 480 of module 3000 where character stream receiver module 480 is, for example and without limitation, an appropriate part of an operating system; a library service package; a virtual machine; a run-time environment; a network appliance; an XML processor; an office application such as, for example and without limitation, a word processor, a spreadsheet, a database, or presentation software; a database system; a portable communication device such as, for example and without limitation, a cellphone, a personal digital assistant or a wireless e-mail device; or a text acquisition system). As one or ordinary skill in the art can readily appreciate, the term "applied as input" is used in the broadest sense as transferred between co-located or distributed (as in systems and networks) hardware or software.

7. String Search Methods and/or Units

Figure 16:
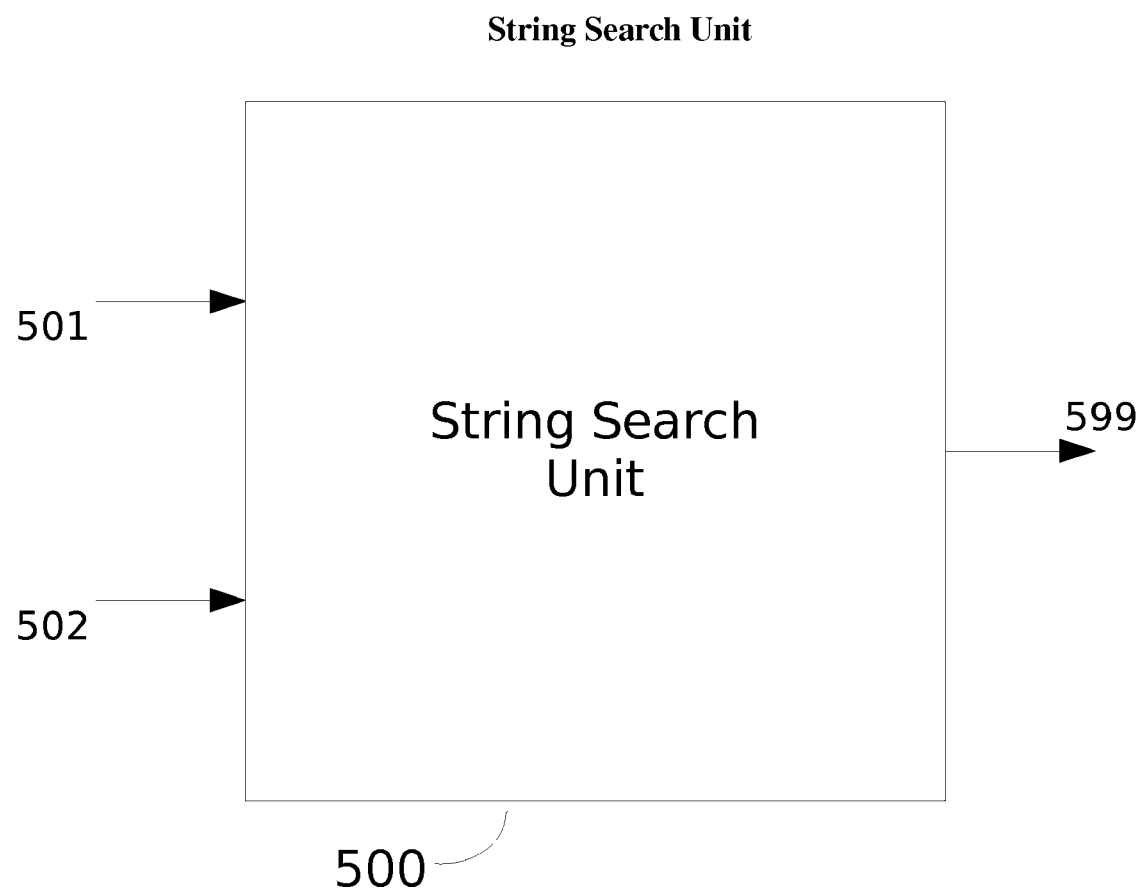
FIG. 16 shows a block diagram of input-output characteristics of a string search unit that is fabricated in accordance with one or more embodiments of the present invention.

FIG. 16 shows input-output characteristics of String Search Unit 500 (SSU 500) that is fabricated in accordance with one or more embodiments of the present invention. As shown in FIG. 16, input 501 is a character string pattern that: (a) is applied as input to SSU 500; and (b) specifies character strings that are searched for (i.e., the specified pattern), and input 502 is a character stream that is applied as input to SSU 500 whose text is to be searched. In response to inputs 501 and 502, SSU 500 searches through input 502 to identify one or more occurrences of strings matching the specified pattern of input 501. In accordance with one or more embodiments of the present invention, input 502 is a code unit stream such as, for example and without limitation, a stream of UTF-8 bytes. In accordance with one or more alternative embodiments of the present invention, input 502 is a set of parallel bit streams such as u8bit0 through u8bit7, or a hybrid string object representation that permits dynamic selection between byte stream, parallel bit stream and/or other character stream representations.

As shown in FIG. 16, output 599 signals the results of the searching process, for example and without limitation, by identifying a position or positions within input 502 at each of which an occurrence of a string matching the specified pattern may be found, or by providing a signal that no string matching the specified pattern is found within input 502.

7.1 Exact String Search Method and/or Unit

Figure 17:
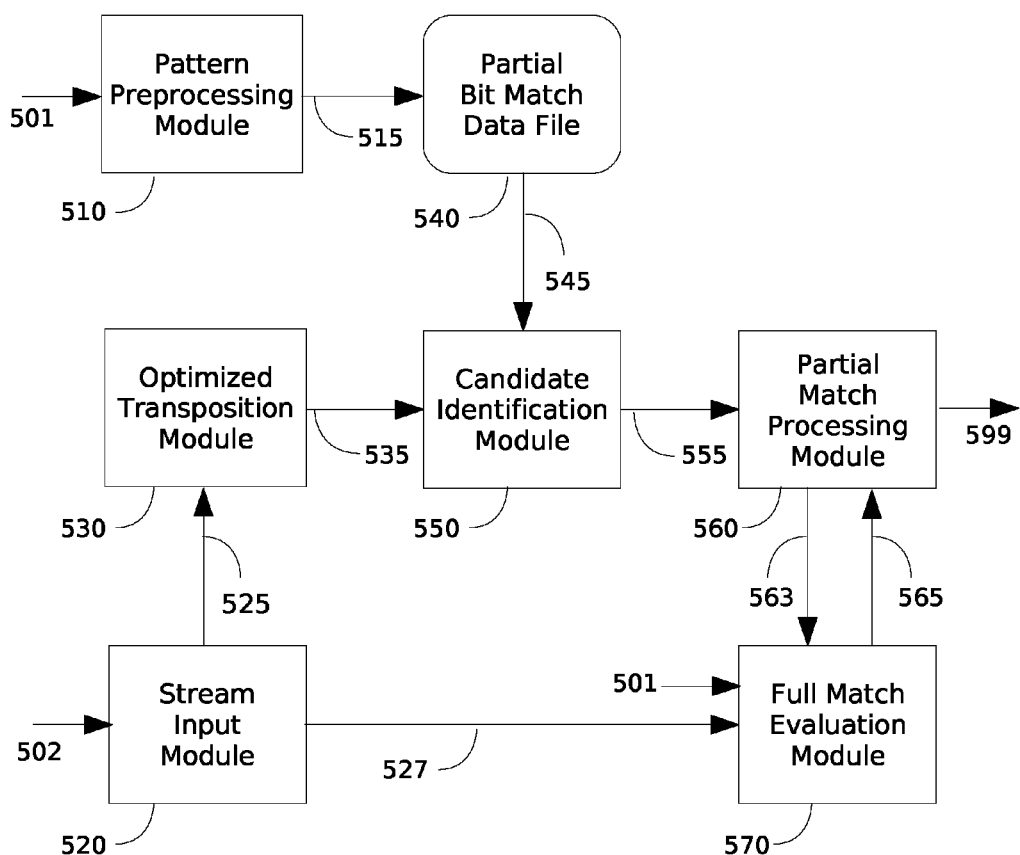
FIG. 17 shows a block diagram of an internal structure of a string search unit that is fabricated in accordance with one or more embodiments of the present invention for providing an exact string search capability.

FIG. 17 shows a block diagram of an internal structure of SSU 500 that is fabricated in accordance with one or more embodiments of the present invention for providing an exact string search capability. As shown in FIG. 17 for embodiments carrying out an exact string search, search pattern input 501 is a character string to be exactly matched in the search process. In accordance with one or more such embodiments, the search process is initialized by applying input pattern 501 as input to the Pattern Preprocessing Module 510 (PPM 510). PPM 510 computes and stores partial bit match data set 515 (PBMDS 515) in Partial Bit Match Data File 540 (PBMDF 540), where PBMDS 515 is to be used throughout the search process in accordance with a partial bit match method that is described in detail below. Text input 502 is a code unit stream that is applied as input to Stream Input Module 520 (SIM 520). In response, SIM 520 manages input to SSU 500 by supplying one block of data at a time to each of Optimized Transposition Module 530 (OTM 530) and Full Match Evaluation Module 570 (FMEM 570), as needed.

In accordance with one or more embodiments of the present invention, OTM 530 transposes each block of text data 525 to parallel bit stream form 535 (as described hereinabove), while omitting the computation of bit streams not needed in the partial bit match process. Each block of parallel bit stream data 535 is then supplied as input to Candidate Identification Module 550 (CIM 550). In response, CIM 550 obtains partial bit match data 515 from PBMDF 540 and computes a bit stream 555 identifying positions of match candidates within the block of parallel bit stream data 535, which bit stream 555 is applied as input to Partial Match Processing Module 560 (PMPM 560). In response to bit stream 555, PMPM 560 iteratively processes the identified positions to determine those that represent a complete match to the pattern and those that represent false positives. At each candidate position, PMPM 560 supplies the position as input 563 to Full Match Evaluation Module 570 (FMEM 570). In response, FMEM 570 compares the byte data of input pattern 501 with that of character stream 527 at the identified position, signaling whether a match has been found or not by means of output 565 to PMPM 560. For each full match identified, PMPM 560 generates the position of this match to output 599.

In accordance with one or more embodiments of the present invention, a partial bit match data set specifies a subset of bits in the search pattern to be matched against input text. To understand how this works, consider, for example, a search pattern "needle" and a text "haystack with one needy needle!" together with a partial bit match data set consisting of bits 5 and 7 of the first pattern character, bit 6 of the fourth pattern character, and bit 4 of the fifth pattern character. Based on an ASCII/UTF-8 representation, the actual values of these bits for the pattern "needle" are 1, 0, 0 and 1. Then, given a text to be searched in the form of parallel bit streams tbit0 through tbit7, a partial match exists starting at any position i such that $tbit5(i)=1$, $tbit7(i)=0$, $tbit6(i+3)=0$ and $tbit4(i+4)=1$. FIG. 18 shows the successive application of each of these conditions to the text. The first row shows the 16 text positions (of 32 total) that satisfy $tbit5(i)=1$. The second row shows the 8 positions that satisfy both this first condition and the second condition $tbit7(i)=0$. The third row shows the 3 positions that remain with the further constraint $tbit6(i+3)=0$, while the final row shows the 2 positions that satisfy all four constraints of the partial match. These 2 positions correspond to the positions of the words "needy" and "needle" in the text; the first is a false positive to be discarded by the full match evaluation process, while the second is a correct instance of a match between the pattern and the text.

The example of FIG. 18 illustrates the candidate filtering effect of the partial bit match method. Assuming a balanced distribution of 0 and 1 bits and independence of the bit tests, each individual bit test cumulatively filters out half the remaining candidates, on average. Given a partial match data set consisting of T independent bit tests, the candidate bit stream that results from the partial match process will have an average of one match candidate every $2^T$ positions.

Using SIMD block operations on registers of size $N=2^K$ bits, CIM 550 simultaneously applies each individual bit test operation to all N positions within a block. Let $C_{CI}$ be the cost of candidate identification including processing of one block by SIM 520, OTM 530 and CIM 550, and let $C_{FM}$ be the cost of evaluating each match candidate for a full match including processing by PMPM 560 and FMEM 570. Then the expected cost of string search $C_{SS}$ per code unit is given by the following equation.

$$C_{SS} = \frac{C_{CI}}{2^K} + \frac{C_{FM}}{2^T} \quad (7.1)$$

Equation 7.1 exhibits a trade-off in the cost of additional bit tests within CIM 550 versus the corresponding reduction of the cost of full-match evaluation. As tests are added the cost due to the first term of (7.1) goes up additively, while the cost due to the second term drops geometrically. If the incremental cost of an additional bit test during candidate evaluation is $C_{BT}$, then the additional test is expected to be worthwhile whenever the following relation holds.

$$\frac{C_{FM}}{C_{BT}} > 2^{(T+1-K)} \quad (7.2)$$

For example, in working with $2^K=128$ bit registers, if the cost of a full match is 20 times that of an additional bit test, then the added test is expected to be worthwhile when the current number of tests T in the partial bit match data set is 10 or fewer. Moving beyond 11 tests is not worthwhile.

To reduce the cost of candidate identification, one or more embodiments of the present invention limit the bit selection performed by PPM 510 so that only a subset of the t8bit0 through t8bit7 bit streams are required during matching. In this case, OTM 530 implements a reduced-cost partial transposition of the input data to parallel bit streams by computing only those bit streams required in the candidate identification process. In accordance with one or more such embodiments, the low-order 4 bits of each code unit are chosen. Partial transposition is implemented, using a method, for example and without limitation, like the one described herein in section 3.2 with the omission of those instructions relevant only to the calculation of unneeded bit streams.

One or more embodiments use SIMD block operations to compute matches on one block or shortened block of character positions at a time. For example, one or more embodiments using Altivec or SSE technology use boundary-crossing techniques, for example and without limitation, like the one described herein in section 3.1 to process full blocks of 128 input code units at a time. Alternative embodiments may be optimized to avoid shifts across block boundaries by using a shortened block strategy. For example, a block size of 112 code units in working with 128 bit registers allows 16 bit positions from the previous block to be loaded with the current block for candidate identification based on up to 16 positions of the search string.

In accordance with one or more embodiments of the present invention, PPM 510 generates partial bit match data in the form of machine instructions that directly perform the bit match operations. For example, consider again the partial match data set for the pattern "needle" consisting of bits 5 and 7 of the first pattern character, bit 6 of the fourth pattern character, and bit 4 of the fifth pattern character. PPM 510 may generate logic and shift instructions that implement the equations shown in FIG. 18 using dynamic instruction assembly techniques well known in the prior art. Upon generating such data, care must be taken to ensure that the data caches are properly written to memory and instruction caches are invalidated using instructions appropriate to the processor, such as the dcbst, sync, icbi and isync instruction sequence of the PowerPC. The use of dynamically generated machine code in this way can reduce the cost of implementing the candidate identification logic. The machine code is stored in PBMDF 540 and then invoked as needed under the control of CIM 550.

In accordance with one or more embodiments of the present invention, PMPM 560 uses bit scan operations to identify the position of each one bit (match candidate) within the candidate vector. For each such position, a full evaluation matching all bits of the text with all bits of the pattern is performed. In accordance with one or more embodiments in which partial transformation processing is applied to sequential code unit data, FMEM 570 implements its matching process using comparison of sequential code unit data. Depending on the length of the search string, the FMEM 570 may have to process multiple blocks of input data to verify a full match. If a full match is found, the position of this match is generated to output. Other candidates are discarded as false positives.

In accordance with one or more embodiments, PPM 510 computes a partial match data set to provide optimal search performance based on, for example and without limitation, a probabilistic model of expected character stream data. Given a probability distribution for the subject text and a search pattern, PPM 510 will first iterate through possible partial match data sets in order of their cost of evaluation in order to determine the minimum cost that a partial match data set must pay to reach the optimal point. Typically, there will be many partial match data sets of equal cost. The data set which reduces the expected match probability to the lowest value will be selected and stored in PBMDF 540.

One or more further embodiments of the present invention are designed to take character stream input 501 in parallel bit stream form. In such embodiments, the block structure of FIG. 17 is modified so that SIM 520 supplies the parallel bit stream input directly to CIM 550, bypassing OTM 530. Character stream data 527 transferred from SIM 520 to FMEM 570 is also supplied in parallel bit stream form. FMEM 570 is structured to perform full match evaluations on this basis.

7.2 Adaptive Search

The exact string search method and unit described above is vulnerable to poor performance whenever the subject text has a vocabulary of frequently occurring substrings. If the partial match data set produced by the PPM 510 matches one or more of these substrings, then the probability of a "candidate" being found in a block may go up considerably.

Figure 19:
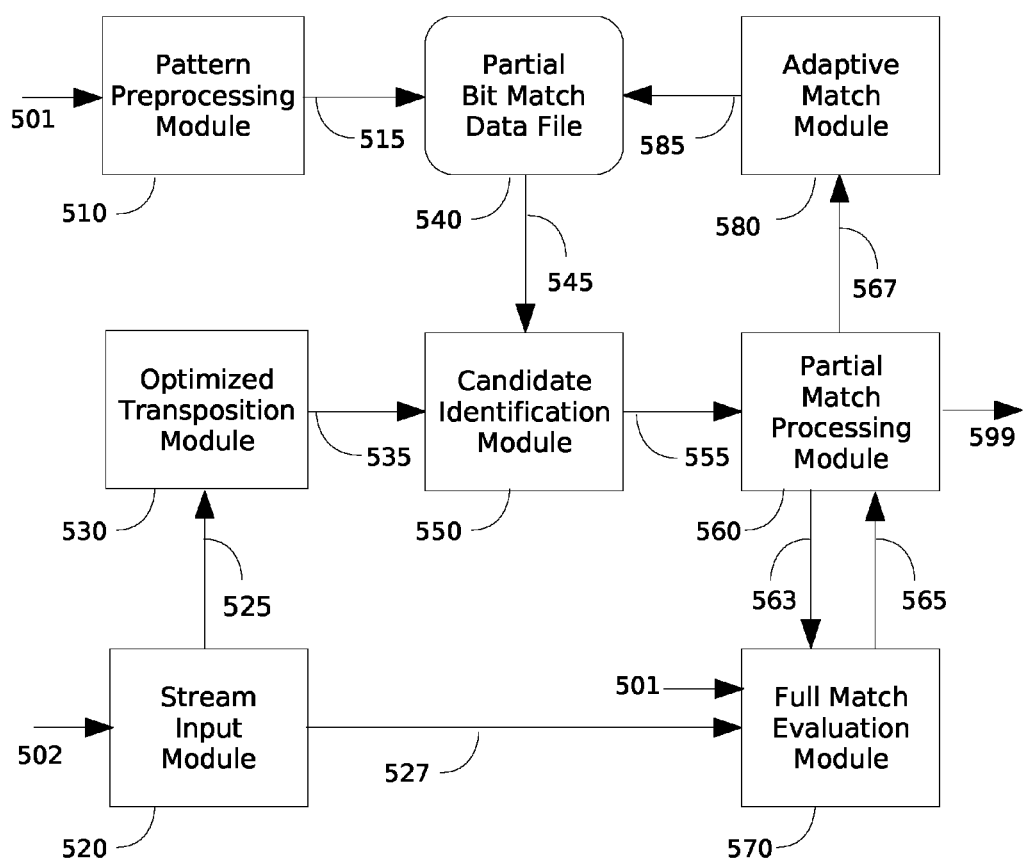
FIG. 19 shows a block diagram of an internal structure of a string search unit that is fabricated in accordance with one or more embodiments of the present invention for providing an adaptive string search capability.

In accordance with one or more embodiments of the present invention, to solve this problem, an Adaptive Match Module 580 (AMM 580) is added to the unit as shown in FIG. 19. AMM 580 takes as input false positives 567 from PMPM

560 and operates on the partial bit match data set stored in PBMDF 540. In particular, AMM 580 identifies frequently occurring bits within false positives that are not common to the search pattern. For each false positive, the exclusive or of the text at the candidate position and the pattern identifies those bits that may be used to rule out that false positive. Identification of frequently occurring bits may then proceed either by counting occurrences of bits for successive false positives or taking intersections of the successive bit sets to determine bits common to several false positives in a row. When such bits have been found at a required level of significance, AMM 580 stores a revised partial match data set in PBMDF 540. The revised data set will include a test on the identified bit or bits; this eliminates all future instances of the particular false positives found to frequently occur.

7.3 Exact Set Search Method and/or Unit

An exact set search unit is a system for searching for occurrences of any of a set of one or more character strings (patterns). The exact set search unit is organized using the same modular structure as the exact string search unit described in Section 7.1. However, the various modules implement additional functionality as described below.

In accordance with one or more embodiments of the present invention, a Pattern Preprocessing Module 510 for the exact set search unit (PPM-set 510) constructs one or more partial match data sets corresponding to the set of patterns. When a subset of two or more patterns have sufficiently many bit values in common, however, a single partial match data set is formed for the subset. For example, given four strings consisting of at least 48 significant bits each (e.g., 8 characters each with 6 significant bits per character), there will typically be at least 12 bits in common between all four strings. These 12 bits may then be used as the basis of a single partial match data set. PPM-set 510 partitions the set of patterns into a minimal size set of subsets such that each subset has at least the required number of bits in common. For each of these subsets, a partial bit match data set may then be formed by selecting the required number of bits; these partial bit match data sets are then individually stored in PBMDF-set 540.

Given a block of subject text data to search for occurrences of the patterns, the Candidate Identification Module 550 for the exact set search unit (CIM-set 550) forms a candidate bit vector for each partial bit match data set produced by the PPM-set. Conceptually, each of these candidate bit vectors is produced independently. However, common logical subexpressions in calculation of multiple candidate identification vectors are commonplace. CIM-set 550 optimizes the calculation of these bit vectors by reusing the value of each of these common logical expressions after they are first calculated.

A Partial Match Processing Module 560 for the exact set search unit (PMDM-set 560) identifies candidate bit vectors that have a one bit at one or more positions. These vectors are then passed to a Full Match Evaluation Module 570 for the exact set search unit (FMEM-set 570) to determine whether or not a complete match occurs. For each occurrence of a one bit in a candidate bit vector corresponding to a particular partial match data set, the FMEM-set 570 must iteratively assess each pattern in the subset of patterns corresponding to this data set to determine whether an instance of that pattern occurs at the identified position If any such assessment results in a full match, this result is generated to output. If no such assessment results in a full match, the candidate is considered a false positive.

7.4 Search With Single-Character Wildcards

One or more embodiments of the present invention extend the exact string search method and unit with a facility for specifying single character wildcards in the search pattern. A single-character wildcard matches any single character. In regular expression notation, the dot (".") is used to denote a single-expression wild card, while in the syntax of the SQL LIKE operator an underscore ("_") is used. For example, an SQL statement "SELECT * FROM Patents WHERE InventorName LIKE 'J_n'" could be used to retrieve patent records having inventors named Jan, Jen or Jon.

Modifications to the Pattern Preprocessing Module 510 and the Full Match Evaluation Module 570 of the string search unit enable it to implement single-character wildcards. In accordance with one or more embodiments of the present invention, PPM 510 is modified so that character positions at which single-character wildcards occur are identified and removed from consideration in the formation of partial match data sets. The data sets thus produced will not refer to any of the bit values at wildcard positions. However, the form of these data sets is unchanged; they may thus be directly used for candidate identification in an unmodified CIM 550.

When PMPM 560 identifies candidate positions and passes them to FMEM 570, FMEM 570 must apply the wildcard logic in evaluating whether a full match has been found. To do this, FMEM 570 constructs a mask vector having a one bit (or an all ones code unit for code-unit based matching) at each wildcard position. The logical or of this vector with the vector of boolean matches at other character positions is then used to identify full matches (signaled by ones at all pattern positions).

7.5 Search with Multi-Character Wildcards

One or more embodiments of the present invention may extend the exact string search unit with a Multiple Segment Search Module (MSSM) to support wildcards that match arbitrary length substrings within the search string. Examples of such multi-character wildcard notations include the '.*' construction commonly supported by regular expression packages and the '%' wildcard in SQL LIKE syntax. For example an SQL database search using "SELECT * FROM Patents WHERE Description LIKE '% UTF % ranscoding'" might be used to retrieve patent records having description fields including phrases such as "UTF-8 to 16 transcoding" and "Extended ASCII to UTF-8 Transcoding".

In accordance with one or more embodiments of the present invention, the MSSM implements multi-character wildcard search using a series of simpler search operations without such wildcards. First, the position of all multi-character wildcards within the search pattern are identified and used to break the pattern up into a consecutive sequence of subpatterns, each of which involves no multi-character wildcards. A simple search is then initiated using the first such subpattern. If this succeeds, a simple search using the second subpattern is initiated at the point immediately following the substring that matched the first subpattern. This process continues so long as each subpattern is successfully matched. If all subpatterns are matched, then a successful search result is generated to output. This result consists of the string running from the first character of the substring matching the first subpattern through to the last character of the substring matching the last subpattern. If the matching of any subpattern fails to succeed, then failure of the overall search is signaled.

As described, the MS SM implements a nonbacktracking shortest-match rule for multi-character wildcard search. Alternative embodiments that implement nonbacktracking longest-match search or a full backtracking search may be developed using well-known techniques.

7.6 Caseless Search

One or more embodiments of the present invention extend the search facilities with a capability for caseless (also known as case-insensitive) search. This involves a modification of Pattern Preprocessing Module 510 and Full-Match Evaluation Module 570 similar to that for single-character wildcards. For each letter in the search pattern, PPM 510 confines the selection of bits for the partial match data set to those bit positions that the case variants have in common. For the ASCII character set, for example, this is always achieved by excluding the third most significant bit (bit 2) of the ASCII representation from the partial match data set. A similar modification to FMEM 570 is required to ensure that a subject string in any case variant is deemed a successful match to the pattern.

If the case variants of letters in a particular subject string have insufficiently many bits in common to permit the formation of a single partial match data set of the required size, the search is translated into an exact set search problem involving all case variants of the pattern.

7.7 Regular Expression Search

One or more embodiments combine the search modules described above to implement an integrated search facility based on patterns expressed using regular expression syntax.

7.8 Separated Preprocessing and Adaptive Processing

One or more alternative embodiments separate the preparation of partial match bit data sets from the string search unit proper. For example and without limitation, in accordance with one or more embodiments of the present invention, particular patterns and/or partial bit match data sets may be stored in a search unit. In accordance with one or more such embodiments, such information may be stored as software or be "hard wired" in the form of dedicated logic. In accordance with one or more such embodiments, partial bit match data sets for such search units may be determined by preprocessing software or by engineering design prior to manufacturing the search unit.

In accordance with one or more embodiments of the present invention, nonvolatile storage is provided for patterns and/or partial bit match data sets. In accordance with one or more such embodiments, a separate pattern preprocessing unit is used to compute partial bit match data sets. As needed, the pattern preprocessing unit is connected to the string search unit proper for the purpose of down- or uploading the patterns (for example and without limitation, over a network) and partial bit match data sets into nonvolatile storage. After a pattern preprocessing unit is used to down- or upload a pattern and corresponding partial bit match data set into one string search unit, the pattern preprocessing unit may be disconnected from that string search unit to become available for connections to and down- or uploading into further string search units of a group or network of string search units.

In accordance with one or more embodiments of the present invention, patterns and partial bit match data sets are distributed to string search units over a computer network. In accordance with one or more such embodiments, string search units provide inputs for directly loading patterns and partial bit match data sets into their internal partial bit match data files through network connections. Servers may distribute partial bit match data sets and patterns to multiple string search units on a network or internetwork. Adaptive match servers may also accept network input in the form of identified false positives from different string search units. Adaptive match servers then compute new partial bit match data sets based on the false positives and distribute new partial match data sets back to the originating string search units and other string search units.

In accordance with one or more embodiments of the present invention, the specified pattern may be a single character string to be matched exactly or it may be a pattern expression comprised of one or more pattern features. In accordance with one or more embodiments of the present invention, pattern features include, but are not limited to, explicit lists of alternative strings to be matched, single-character wildcards, multiple-character wildcards, parameters to control the matching process such as a caseless search parameter specifying matching without regard to whether letters are upper or lower case, and other features known in the prior art. Pattern features may be expressed in terms of well-known notations such as that of regular expressions.

8. Lexical Processing of Textual Notation

Character stream data is often structured according to a grammar or other set of rules associated with a textual notation system. This section describes methods and apparatus for lexical analysis and other processing of character stream data structured in such a fashion, as facilitated through the use of parallel property streams in general and parallel bit streams, in particular. These methods are illustrated primarily through application to the example of XML processing, although the methods apply equally well to other textual notation systems.

In general, lexical processing of textual notation data continues to depend on the bit representations dictated by the character encoding scheme underlying the particular textual notation system concerned. The examples in this section employ UTF-8 as the underlying character encoding scheme. It is a straightforward matter to adapt the embodiments described herein to other character encoding schemes.

One general method in lexical analysis entails forming bit streams known as lexical item streams to facilitate scanning operations. For example, in XML processing, a LeftAngle lexical item stream may be formed to identify those character or code unit positions at which an "<" character occurs. An array of these positions may then be computed using a method, for example and without limitation, like that described herein in section 3.5. Finding successive occurrences of "<" characters in XML processing then reduces to iteration through this array. Alternatively, one or more embodiments of the present invention may avoid computing bit position arrays by relying on direct application of bit scan operations to lexical item streams on an as-needed basis.

Another general method in lexical analysis entails taking advantage of the parallel nature of code unit basis streams and derived lexical item streams. For example, having identified a particular code unit position through a bit scan operation, individual code units or characters at neighboring positions may be determined through indexing operations applied to the basis stream. For example, the "!" character is relevant in XML processing when it immediately follows a "<" character. Given the position p of a "<" character, it is possible to use bit stream techniques to find the position q (if any) of the next "!" character and then test to determine whether p=q+1. It is also possible to construct lexical item streams for the two character sequence "<!" and employ tests or scans on this stream. However, better performance may be achieved by taking advantage of the character or code unit basis stream to directly test the code unit at position p+1 for equality with the "!" character.

8.1 XML Character Validation

A textual notation system may proscribe the use of particular characters at any point within valid text data. Character validation is a process of identifying occurrences of proscribed characters in input text. This may be conveniently carried out through the computation of a lexical item stream to identify positions of proscribed characters and application of a bit detection method, for example and without limitation, like that described herein in section 3.3, to the lexical item stream.

In the case of XML, proscribed character data consists of control characters (except for white space) and the FFFF and FFFE characters. It is convenient to first define subsidiary lexical item streams for whitespace characters and UTF-8 code units for the FFFF and FFFE characters.

$$HT(i)=(u8data(i)=0x09) \qquad (8.1)$$

$$LF(i)=(u8data(i)=0x0A) \qquad (8.2)$$

$$CR(i)=(u8data(i)=0x0D) \qquad (8.3)$$

$$SP(i)=(u8data(i)=0x20) \qquad (8.4)$$

$$S(i)=HT(i) \vee LF(i) \vee CR(i) \vee SP(i) \qquad (8.5)$$

$$xEF(i)=(u8data(i)=0xEF) \qquad (8.6)$$

$$xBF(i)=(u8data(i)=0xBF) \qquad (8.7)$$

$$xBE(i)=(u8data(i)=0xBE) \qquad (8.8)$$

In accordance with one or more embodiments of the present invention, these equations use a shorthand notation to define the value of a bit stream at position i in terms of u8data(i). Each constraint on u8data corresponds to a set of Boolean constraints on u8bit0 through u8bit7 In accordance with one or more such embodiments, testing for equality with a particular 8-bit hexadecimal value corresponds to a set of seven boolean operations combining the eight bits. However, advantageously, the computation for a particular lexical item stream frequently shares common subexpressions with one or more of the calculations for other streams. As such, the overall cost of computing lexical item streams is reduced by calculating the values of common subexpressions once and reusing the values as needed. FIG. 20 shows Altivec code implementing equations 8.1 through 8.8 and illustrates the role of common subexpression calculations; only 31 instructions are required to calculate 8 stream values at all 128 positions of a block.

The lexical item stream for characters restricted under XML 1.0 is defined in terms of these subsidiary streams as follows.

$$Restricted(i) = (u8data(i) \leq 0x1F) \wedge \qquad (8.9)$$
$$\neg S(i) \vee xEF(i-2) \wedge xBF(i-1) \wedge (xBE(i) \vee xBF(i))$$

XML 1.1, is somewhat more restrictive, proscribing the DEL character and control characters in the 0080 through 009F range, except for NEL.

$$DEL(i) = (u8data(i) = 0x7F) \qquad (8.10)$$

$$NEL(i) = (u8data(i-1) = 0xC2) \wedge (u8data(i) = 0x85) \qquad (8.11)$$

$$Restricted11(i) = Restricted(i) \vee DEL(i) \vee \qquad (8.12)$$
$$(u8data(i-1) = 0xC2) \wedge (u8data(i) \leq 0x9F \wedge \neg NEL(i))$$

One or more embodiments of an XML character validation unit that are fabricated in accordance with the present invention use a control input to determine whether an input stream is XML 1.0 or XML 1.1. The control input is based on the presence of an XML encoding declaration equivalent to <?xml version='1.1'> or not. The lexical item stream Restricted or Restricted11 is computed accordingly to identify occurrences of proscribed characters. A bit detection method, for example and without limitation, like the one described herein in section 3.3, is applied to the lexical item stream to determine whether any occurrences exist; an error condition is signaled if so.

One or more embodiments of the present invention combine XML character validation with other input validation requirements. For example, character validation may be combined with UTF-8 validation, for example and without limitation, as described herein in section 4.2 Alternatively, or additionally, character validation may be combined with other XML well-formedness or validation checking 8.2 XML Line Break Normalization XML standards recognize several methods of identifying logical line breaks in XML documents. To simplify the tasks of applications, XML processors are required to normalize line breaks to use a single LF character.

Under XML 1.0, CR and LF lexical item streams denote characters that are significant to end-of-line processing Under XML 1.1, the NEL and LS characters are also significant.

$$LS(i) = u8data(i-2) \qquad (8.13)$$
$$= 0xE2 \wedge u8data(i-1)$$
$$= 0x80 \wedge u8data(i)$$
$$= 0xA8$$

The two character CR-LF combination is considered to represent a single line break under XML 1.0, while XML 1.1 extends this treatment to the CR-NEL combination, a three-byte sequence under UTF-8.

$$CRLF(i)=CR(i-1) \wedge LF(i) \qquad (8.14)$$

$$CRNEL(i)=CR(i-2) \wedge NEL(i) \qquad (8.15)$$

However, a CR that stands alone is considered to be a line break as well. The CREOL lexical item stream is thus defined to identify those CR characters that represent XML 1.0 line breaks by themselves (without a following LF), while the CREOL11 lexical item stream is defined to identify those CR characters that similarly represent XML 1.1 line breaks (without either a following LF or NEL).

$$CREOL(i)=CR(i) \wedge \neg LF(i+1) \qquad (8.16)$$

$$CREOL11(i)=CREOL(i) \wedge \neg NEL(i+2) \qquad (8.17)$$

Under XML 1.0, an EOL is considered to occur at any LF character or any CREOL, that is CR not followed by LF. Under XML 1.1, an extended definition also treating NEL and LS characters as line breaks applies.

$$EOL(i)=LF(i) \vee CREOL(i) \qquad (8.18)$$

$$EOL11(i)=LF(i) \vee CREOL11(i) \vee NEL(i) \vee LS(i) \qquad (8.19)$$

In multibyte sequences that denote a line break, the bytes prior to the EOL position are identified by the preEOL and preEOL11 bit streams for XML 1.0 and XML 1.1, respectively.

$$preEOL(i) = CRLF(i+1) \tag{8.20}$$

$$preEOL11(i) = \\ CRLF(i+1) \vee CRNEL(i+2) \vee NEL(i+1) \vee LS(i+1) \vee LS(i+2) \tag{8.21}$$

An XML Line Break Normalizer fabricated in accordance with one or more embodiments of the present invention computes EOL and preEOL or EOL11 and preEOL11 lexical item streams dependent on a control indicating whether the input stream is XML 1.0 or XML 1.1. Because the LF character requires only a single byte (code unit) within UTF-8, the normalization may be achieved by replacing the code unit at EOL positions with LF and deleting code units at the preEOL positions. In terms of a parallel bit stream representation, replacement of code units at EOL positions by LF is implemented in accordance with equations for XML normalized bit streams (xn8bit0 through xn8bit7), as follows.

$$xn8bitn(i) = u8bitn(i) \wedge \neg EOL(i), n \in \{0,1,2,3,5,7\} \tag{8.22}$$

$$xn8bitn(i) = u8bitn(i) \vee EOL(i), n \in \{4,6\} \tag{8.23}$$

These equations reflect the fact that bits 4 and 6 of an LF character are 1, while all other bits are 0. Deletion of preEOL code units is achieved by applying the parallel deletion unit of Section 3.7 to the xn8bit0 through xn8bit7 bit streams using the preEOL lexical item stream as the deletion mask. Given an XML 1.1 document, normalization is similarly implemented based on the EOL11 and preEOL11 bit streams. That is, normalized bit streams are calculated using EOL11 in place of EOL in equations 8.22 and 8.23, followed by deletion using the preEOL11 lexical item stream as the deletion mask.

One or more embodiments of the present invention optimize the end-of-line normalization process by eliminating the deletion operations when there are no multibyte line break characters in a block or buffer. A bit detection method, for example and without limitation, like the one described herein in section 3.3 is applied to the preEOL bit stream to determine whether the optimization may be applied (no preEOL bit detected) or not. One or more embodiments of the present invention optimize the end-of-line normalization process by skipping the process in the absence of CR characters under XML 1.0 or in the absence of CR, NEL and LS characters under XML 1.1.

8.3 XML Lexical Analysis

In processing text structured in accordance with a textual notation system, lexical analysis may be characterized as a process of partitioning an input stream into a series of tokens where each token is a substring of the input that is treated as an atomic unit with respect to parsing and/or semantic rules. In essence, tokens may be viewed as the "words" and "punctuation" of a notation system. For the case of XML, punctuation tokens include several sets of delimiters based on left and right angle brackets, such as: (a) "<!--" and "-->" for comments; (b) "<?" and "?>" for processing instructions and XML declarations; (c) "<![CDATA[" and "]]>" for character data sections; and (d) "<", "</", ">" and "/>" for element tags. Other XML punctuation tokens include: (a) "&" and ";" for references; and (b) internal punctuation such as "=" for attribute-value pairs in element tags. The "words" of XML consist of: (a) the names of elements, attributes and entities; (b) string values enclosed in single or double quotes; and (c) runs of uninterpreted text referred to as character data. Note that one should not confuse these XML "word" tokens with English words. For example; a single XML token may comprise a character data segment consisting of several English sentences so long as there is no XML punctuation within the segments.

Lexical analyzers may operate in a number of different states, which states correspond to different sets of rules for forming tokens that may apply in different contexts. In XML, for example, each distinct set of delimiters based on left and right angle brackets has a corresponding distinct set of rules for token formation between the delimiters.

Lexical analysis involves: (a) recognizing fixed-length tokens (typically "punctuation"); and (b) scanning variable length tokens (typically "words"). Lexical analyzers are also known as scanners, in recognition of the characteristic role of scanning within lexical analysis.

One or more embodiments of the present invention use lexical item streams (together with parallel access to code unit data streams) to facilitate: (a) recognizing fixed length tokens; and (b) scanning of variable length tokens. In particular, and in accordance with one or more embodiments of the present invention, all of the lexical item streams for an entire block or buffer are precomputed prior to initiating lexical analysis. However, some lexical item streams may only be relevant to certain states of a lexical analyzer that may not always be encountered during processing of a given buffer or block. As such, in accordance with one or more alternative embodiments of the present invention, computation of one or more lexical item streams for a particular block or buffer is deferred until a need for each such a lexical item stream has been established for that block or buffer by entry into a relevant state. For example, and without limitation, one or more embodiments of the present invention will defer the computation of the PIEnd lexical item stream (see equation 8.33 below).

Lexical item streams may be of two general types: (a) streams that identify characters that are to be included in a particular token; and (b) streams that identify characters or character sequences that delimit the token. In the examples below, most instances are of the first type; however the NameDelim stream (equation 8.31) is an example of the second type.

Overall, an XML document consists of uninterpreted character data interspersed with XML markup. XML markup consists of tokens comprising XML declarations, document type declarations, comments, processing instructions, CDATA sections, element tags, and references. Uninterpreted character data is simply character data that contains no markup. The lexical analyzer state corresponding to the scanning of uninterpreted character data until an occurrence of markup is located is referred to as the top-level state of the lexical analyzer.

A lexical item stream for top-level scanning of uninterpreted character data is defined in terms of three subsidiary lexical item streams. These are for the "&" (RefStart) and "<" (LeftAngle) characters that signify the beginning of markup, and the "]]>" (CDEnd) character sequence that is illegal in uninterpreted character data.

$$RefStart(i) = u8data(i) = 0x26 \tag{8.24}$$

$$LeftAngle(i) = u8data(i) = 0x3C \tag{8.25}$$

-continued $$CDEnd(i) = u8\text{data}(i) \qquad (8.26)$$
$$= 0x5D \wedge u8\text{data}(i+1)$$
$$= 0x5D \wedge u8\text{data}(i+2)$$
$$= 0x3E$$

$$EndofText(i) = LeftAngle(i) \vee RefStart(i) \vee CDEnd(i) \qquad (8.27)$$

The EndofText lexical item stream consists of 1 bits identifying positions at which uninterpreted character data ends. One or more embodiments of the present invention compute a bit position array based on the EndofText lexical item stream using a method, for example and without limitation, like the one described herein in section 3.5. Alternative embodiments of the present invention may directly perform incremental bit scans on the EndofText lexical item stream as needed. In scanning, an uninterpreted character data token is considered to be all character data from the current position up to, but not including, the next EndofText position p. However, if there are no such characters, (i.e., the next EndofText position is the current position), there is no uninterpreted character data token. The code unit u8data(p) is then examined to determine subsequent processing. An error is signaled if CDEnd is identified at this position; otherwise markup scanning is initiated based on the identified RefStart or LeftAngle character.

There are three kinds of tokens associated with the RefStart character: (a) the "&#x" token which indicates the start of a character reference in hexadecimal notation; (b) the "&#" token which indicates the start of a character reference in decimal notation; and (c) the lone "&" token which indicates the start of a general reference. The lexical analysis of each of these references involves a token comprising the body of the reference, namely, a hexadecimal numeral, a decimal numeral or an XML name.

Lexical item streams for decimal digits and hexadecimal digits define precisely the set of characters that may occur in the corresponding numerals.

$$\text{Digit}(i) = u8\text{data}(i) \geq 0x30 \wedge u8\text{data}(i) \leq 0x39 \qquad (8.28)$$

$$\text{HexDigit}(i) = \text{Digit}(i) \vee (u8\text{data}(i) \geq 0x41 \wedge u8\text{data}(i) \leq 0x46) \vee \qquad (8.29)$$
$$(u8\text{data}(i) \geq 0x61 \wedge u8\text{data}(i) \leq 0x66)$$

A hexadecimal numeral, for example, is determined by scanning the maximal length contiguous run of 1 bits in the HexDigit lexical item stream.

Because XML names permit a very large set of characters in a large number of single and multi-character ranges, a lexical item stream that matches the set of permitted characters precisely is expensive to compute. In accordance with one or more embodiments of the present invention, the lexical analyzer makes use of a lexical item stream that delimits legal XML names rather than precisely matching the allowed characters. In particular, a subsidiary lexical item stream DelimSymbol identifies the printable ASCII characters that may delimit names in XML syntax, namely ">", "/", "?" and "=". In addition, a lexical item stream NameDelim is a convenient stream that may be used to terminate scans for name tokens based on the occurrence of a character in the DelimSymbol or whitespace (S, see eqn 8.5) streams.

$$DelimSymbol(i) = u8\text{data}(i) \qquad (8.30)$$
$$= 0x2F \vee u8\text{data}(i)$$
$$= 0x3D \vee u8\text{data}(i)$$
$$= 0x3E \wedge u8\text{data}(i)$$
$$= 0x3F$$

$$NameDelim(i) = DelimSymbol(i) \vee S(i) \qquad (8.31)$$

The NameDelim lexical item stream is designed to efficiently delimit XML name tokens, but not to validate them. That is, given a context in which an XML name is expected, if there is a correct XML name token in the following input, the NameDelim stream will properly mark the end of the token. However, the NameDelim stream has the effect of accepting a wider class of characters in tokens than are actually legal in XML names.

One or more embodiments of the present invention validate XML names using symbol tables following well-known techniques in the prior art. The symbol table holds previously validated names, possibly with other information related to the name that may be useful in XML processing. Given a context in which an XML name is expected, a candidate name token is determined as the string of characters from the current position up to but not including the position corresponding to the next 1 bit in the NameDelim stream. A look-up operation determines whether this name exists in the symbol table. If so, then it is known to be a valid XML name. Symbol table information associated with the name may be set aside for further XML processing. If the name is not located by the look-up operation, subsequent processing depends on whether the current context permits new XML names to occur. If not, an error is reported. If a new name may occur in the current context, then the candidate name is validated on a character by character basis. Errors in validation are signaled. If validation completes without error, the validated name is entered into the symbol table together with related information dependent on the needs of the XML processor.

Returning to the case of a top-level scan identifying a RefStart character at position p, the lexical analyzer employs the lexical item streams for numerals and XML names as follows. The lexical analyzer employs standard character processing operations well known in the prior art to determine the type of token beginning at u8data(p). If a "&#x" token is identified, the lexical analyzer uses the HexDigit lexical item stream to determine the extent of a hexadecimal numeral immediately following the token. If a "&#" token is identified, the lexical analyzer uses the Digit lexical item stream to determine the extent of a decimal numeral immediately following the token. Otherwise, the NameDelim lexical item stream is used to determine the extent of an XML name token immediately after the "&" token. In all three cases, an error is reported if there is not at least one character in the hexadecimal numeral, decimal numeral or XML name token or if the character immediately after the numeral or name is not the expected ";" character that serves as a reference delimiter token. In the case of a character reference in either hexadecimal or decimal notation, the numeral is converted to an integer to determine whether this integer denotes a permitted Unicode code point. In the case of a general reference the lexical analyzer validates the name as described previously.

If a top-level scan identifies markup beginning with a LeftAngle character, there are several possible tokens that serve as opening delimiters for different types of markup. The recognition of the type of token that occurs in a particular instance is performed by inspection of the u8data stream using standard character processing techniques well-known in the prior art. Depending on the token type identified, the lexical analyzer leaves the top-level state and enters one of several scanning states at the position immediately following the recognized token.

If a comment opening token "<!--" is recognized, the lexical analyzer enters a scanning state for the body of the comment. The comment body is a token comprising arbitrary character data up to, but not including the next occurrence of the "--" (double hyphen) character sequence. The following CommentStop lexical item stream is used to delimit the body of a comment.

$$CommentStop(i) = u8data(i) = 0x2D \wedge u8data(i+1) = 0x2D \quad (8.32)$$

Bit scan operations are applied to determine the extent of a comment body token. A test on the u8data stream is then performed to determine whether a full comment closing token "-->" exists at the end of the comment body. If so, the lexical analyzer leaves comment scanning mode and initiates a new scan for uninterpreted character data in the top level state. If the double hyphen is not followed by ">" to form a proper comment closing delimiter, an error is signaled.

If a character data section opening token "<![CDATA[" is recognized, the lexical analyzer enters a scanning state for the body of the character data section. The body is a token comprising arbitrary character data up to, but not including the next occurrence of the "]]>" token. Note that the CDEnd stream matches the entire closing delimiter for the character data section in contrast to CommentStop. This is a consequence of the "]]" subsequence being legal within a character data section, whereas the "--" subsequence is not legal within the body of a comment. After determination of the token comprising the body of the character data section, the lexical analyzer immediately reports the closing delimiter and returns to top-level state.

If a processing instruction opening delimiter "<?" is recognized, the lexical analyzer enters a scanning state for the start of a processing instruction, XML declaration or encoding declaration. The NameDelim stream is used to identify an XML name token that must occur immediately after the opening delimiter. A whitespace (S) token is then required. The remainder of the processing instruction or declaration is then identified using the PIEnd lexical item stream formulated as follows.

$$PIEnd(i) = u8data(i-1) = 0x3F \wedge u8data(i) = 0x3E \quad (8.33)$$

Element start tags and empty element tags use an opening delimiter of "<" immediately following by an XML name for the element. Lexical analysis of these tags is somewhat more complex than that for comments, character data sections or processing instructions, involving the repeated scanning of attribute information in the form of name-value pairs separated by an "=" token. Attribute values consist of quoted string literals, using single quotes or double quotes. Lexical item streams for identifying single quote and double quote characters are thus defined.

$$SQuote(i) = u8data(i) = 0x27 \quad (8.34)$$

$$DQuote(i) = u8data(i) = 0x22 \quad (8.35)$$

An opening delimiter of "</" marks the beginning of an element end tag. The NameDelim lexical item stream is used to identify the extend of the XML name token that must occur immediately thereafter. The whitespace (S) lexical item stream is then used to identify allowed whitespace before a ">" closing delimiter is required. One or more embodiments of the present invention optimize validation of XML names within element end tags by direct comparison of the identified tag name with that of the most recent unclosed start tag.

A document type definition beginning with the token "<!DOCTYPE" may occur in the prolog of an XML document. Document type definitions have substantial internal structure, involving a number of additional lexical analyzer states. However, the methods illustrated above may be applied to the lexical analysis of document type declarations by one skilled in the art without undue experimentation.

In view of the fact that a document type declaration occurs only in the document prolog, the performance gains associated with the use of lexical item streams in processing the document type declaration may not warrant the additional complexity. One or more embodiments of the present invention perform lexical analysis of document type declarations using techniques well-known in the prior art, without resort to lexical item streams.

As described, an XML lexical analyzer produces a stream of XML tokens. The resulting token stream may then be supplied as input to further XML processing logic, such as that required of an XML parser. Alternatively, one or more embodiments of the present invention integrate lexical analysis as an interleaved activity with other XML processing logic directly in an XML parser.

8.4 Scanning and DFA Self-Transitions

The example of XML scanning illustrates lexical analysis techniques that can be applied in dealing with a plurality of other textual notation systems, including programming language notations such as Java, data syntax notations such as ASN.1 and markup language notations such as TeX. In general, textual notation systems have a lexical structure that may be described using regular expressions or other notations for regular grammars. A standard model for implementing lexical analyzers for a given regular grammar is a deterministic finite automaton (DFA). Iterative scans of tokens comprising any number of occurrences of characters within a character class correspond to self-transitions of a DFA. The bit stream methods illustrated above for XML scanning may be generalized on this basis. Specifically, a regular grammar and corresponding DFA is constructed for the desired textual notation system; one lexical item stream is then defined for each character class used in DFA self-transitions. Run-length scans over such bit streams correspond to iteration through a sequence of characters in the character class.

8.5 Lexical Analyzer Embodiments

Figure 21:
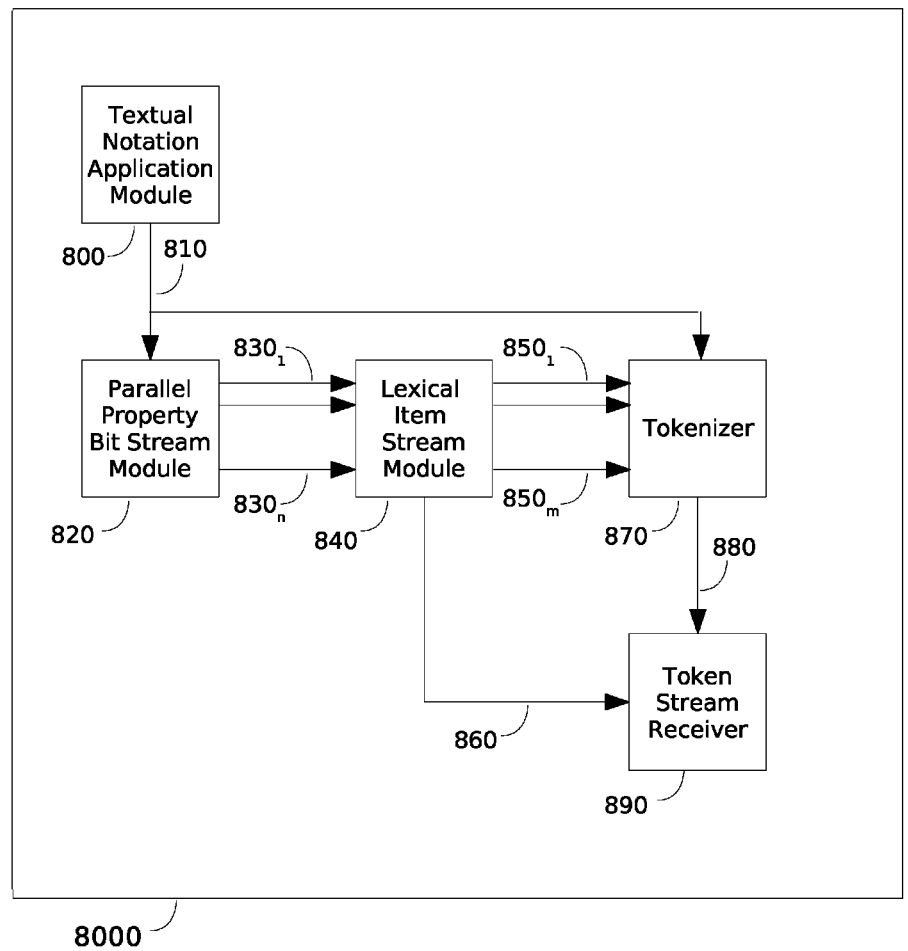
FIG. 21 shows a block diagram of module 8000 used in lexical analysis that is fabricated in accordance with one or more embodiments of the present invention.

FIG. 21 shows a block diagram of module 8000 that is fabricated in accordance with one or more embodiments of the present invention. In accordance with one or more embodiments of the present invention, module 8000 may be: (a) an operating system or a library service package; (b) a virtual machine or a run-time environment; (c) a network appliance; (d) an XML processor; (e) an office application such as, for example and without limitation, a word processor, a spreadsheet, a database, or presentation software; (f) a database system; (g) a portable communication device such as, for example and without limitation, a cellphone, a personal digital assistant or a wireless e-mail device; and (h) a text acquisition system. The following describes the portion of module 8000 that pertains to textual notation processing since methods for interfacing with the portion described herein and the rest of module 8000 are well known to those of ordinary skill in the art.

As shown in FIG. 21, textual notation application module 800 of module 8000 applies character stream 810 as input to parallel property bit stream module 820 (character stream application module 800 is an appropriate part of, for example and without limitation, an operating system; a library service package; a virtual machine; a run-time environment; a network appliance; an XML processor; an office application such as, for example and without limitation, a word processor, a spreadsheet, a database, or presentation software; a database system; a portable communication device such as, for example and without limitation, a cellphone, a personal digital assistant or a wireless e-mail device; or a text acquisition system). As one of ordinary skill in the art can readily appreciate, the term "applied as input" is used in the broadest sense as transferred between co-located or distributed (as in systems and networks) hardware or software. In response, parallel property bit stream module 820 generates parallel property data streams (for example, parallel property bit streams) $830_1$ to $830_n$ in accordance with one or more embodiments of the present invention described herein. In accordance with one or more embodiments of the present invention, parallel property bit stream module 820 may be, for example, and without limitation, a software or a hardware module that is embodied in the manner described herein or in any manner that incorporate these teachings.

As further shown in FIG. 21, parallel property data streams $830_1$ to $830_n$ are applied as input to lexical item stream module 840. Lexical item stream module 840 computes one or more lexical item streams as described herein and generates them as parallel property data streams (for example, parallel property bit streams) $850_1$ to $850_m$ and perhaps validation data stream 860. In general, n may not be equal to m. Further, as one of ordinary skill will readily appreciate, validation data stream 860 may be utilized, for example and without limitation, to indicate whether character stream 810 is invalid. In accordance with one or more embodiments of the present invention, lexical item stream module 840 may be, for example, and without limitation, a software or a hardware module that is embodied in the manner described herein or in any manner that incorporate these teachings.

As further shown in FIG. 21, character stream 810 and parallel property data streams $850_1$ to $850_m$ are applied as input to tokenizer module 870. In response, tokenizer module 870 generates a token stream 880 in accordance with one or more embodiments of the present invention described herein. For example, in processing XML as a textual notation, tokens may be generated in accordance with the methods of section 5.3. In accordance with one or more embodiments of the present invention, tokenizer module 870 may be, for example, and without limitation, a software or a hardware module that is embodied in the manner described herein or in any manner that incorporate these teachings. As one of ordinary skill in the art can readily appreciate, token stream 880 and/or property data stream 860 are applied as input to token stream receiver module 890 of module 8000 where token receiver module 890 is, for example and without limitation, an appropriate part of an operating system; a library service package; a virtual machine; a run-time environment; a network appliance; an XML processor; an office application such as, for example and without limitation, a word processor, a spreadsheet, a database, or presentation software; a database system; a portable communication device such as, for example and without limitation, a cellphone, a personal digital assistant or a wireless e-mail device; or a text acquisition system). As one or ordinary skill in the art can readily appreciate, the term "applied as input" is used in the broadest sense as transferred between co-located or distributed (as in systems and networks) hardware or software.

9. Regular Expression Matching

A frequent requirement in character stream processing is to identify strings that match regular expressions. For example, the regular expression "[−+]?[0-9]+" matches strings that comprise an optional sign followed by one or more digits; this is the syntax of positive or negative integers. One or more embodiments of the present invention use parallel bit stream methods to identify occurrences of strings matching a particular regular expression. One or more embodiments simultaneously match multiple occurrences of substrings matching a particular regular expression. One or more additional embodiments of the present invention provide a dynamic regular expression compiler that, given a regular expression in a suitable form, dynamically generate parallel bit stream instructions for recognizing occurrences of the given regular expression.

In general, the techniques set forth herein apply to deterministic regular expressions. These are regular expressions, such as that of the introductory example, that provide for clear, unambiguous decision making at each step in the matching process. In essence, deterministic regular expressions are those that may be translated directly to deterministic finite automata, as is well known in the prior art. There are also known techniques for transforming nondeterministic regular expressions to deterministic regular expressions, where possible. One or more embodiments incorporate such techniques in a regular expression compiler so that parallel bit stream instructions may be generated for both determinsitic regular expressions and nondeterministic regular expressions for which transformation to deterministic form is available.

9.1 Character Classes

Regular expressions involve character classes, i.e., sets of characters that may be used at particular positions. For example, the regular expression "[−+]?[0-9]+" involves two character classes, the class ("[−+]") for plus or minus sign characters and the class ("[0-9]") for the consecutive ASCII characters "0" through "9", i.e., the decimal digits.

Given a set of character classes relevant to recognition of particular regular expressions, a character class bit stream may be generated for each class. Such a character class bit stream identifies positions at which occurrences of members of that class occur in a particular character stream. Construction of parallel bit streams to identify character classes involves boolean operations on the character stream for individual character bits. For example, seven logical combining operations are required to combine the eight bits comprising an individual (extended) ASCII character or UTF-8 code unit.

When a character class consists of multiple characters and/or multiple character classes need to be computed, it has been discovered that the cost of these calculations can often be greatly reduced by identifying common subexpressions for the different characters. Further simplifications are possible for contiguous ranges of characters. For example, by taking advantage of the contiguity of character codes for ASCII digits, a character class bit stream for the "[0-9]" class can be constructed in only six operations. Surprisingly, this is fewer than that for an individual character.

Given a set of character class definitions for 8-bit code units, the following methods may be used to generate efficient code for constructing character class bit streams for each definition. First, a bit pairing technique is used to create opportunities for common subexpression recognition. This bit pairing technique ensures that the 8-bit logical expressions for character recognition are always expressed in terms of subexpressions that pair bit 0 with bit 1, bit 2 with bit 3, bit 4 with bit 5 and bit 6 with bit 7. Furthermore the results of these subexpressions are also paired in a predetermined way, i.e., the bit0/1 results are paired with the bit2/3 results and the bit 4/5 results are paired with the bit 6/7 results. FIG. 20 shows the application of this bit pairing technique to construct character class bit streams corresponding to equations 8.1 through 8.8.

Second, logic for recognition of character class ranges is generated as follows.

1. Identify the common high-order bit pattern for the low and high values of the range, and construct an appropriate logical expression. For example, the character range for the ASCII digits "[0-9]" consists of the characters hexadecimal 30 through hexadecimal 39. The common high-order bit pattern for the first 4 bits is 0011 (hexadecimal 3). This may be expressed as not(bit0 or bit1) and bit2 and bit3.
2. Determine the highest bit position at which the low and high values of the range differ, and split the range into subranges dependent on this bit value, i.e., the low subrange consisting of all specified set elements with a value of 0 for this bit and the high subrange consisting of all specified set elements with a value of 1 for this bit. Then, construct subexpressions for the remaining bits of each of these subranges as described below. Using the value of the highest differing bit in the if-part, construct an if-then-else logical form with the logical expressions for the high and low subranges respectively inserted into the then- and else-branches.
3. The expression for the remaining bits of the low subrange specifies those bit patterns which are numerically greater than or equal to the low value. This expression may be formed recursively as follows. If no bits remain, the expression true is returned. Otherwise, if the highest bit remaining of the low value is 1, then a value is in the low subrange only if it is has a 1 at this position. The expression is formed from the logical and of this bit and the expression for low subrange on the remaining bits after this one. Otherwise, the highest bit remaining of the low value is 0. In this case, a value is in the subrange if either this bit is 1 or the remaining bits satisfy the low subrange criterion. Then, form a logical or of this bit and the recursive invocation.
4. The expression for the remaining bits of the high subrange is determined in a complementary fashion.

A recursive expression simplifier is then used to further optimize the generated character class logic by using the well-known "inside-out" method to apply logic simplifications such as "or(X, true)=>X", "not(not X))=>X" and so on.

9.2 Multiple Simultaneous Matching of Repeated Character Classes

Given a set of character class bit streams, for example, as constructed in accord with the methods of 9.1, it is then possible to generate efficient bit stream manipulation code for recognition of multiple instances of substrings matching regular expressions composed of character class repetitions using standard * (zero or more), +(one or more) and/or ? (zero or one) regular expression operators. For example, consider recognition of substrings matching the [0-9]* regular expression starting at positions 6, 18 and 26 of a character stream "data: 325a4 . . . 45; 347212. b7654." Code for the regular expression matching is conveniently implemented using a little-endian (right to left) character and bit stream representation, as used on Pentium architecture, for example. FIG. 23 illustrates an embodiment of the inventive matching technique. Line 1 of FIG. 23 shows the character string under discussion in little-endian form. Line 2 of FIG. 23 shows the [0-9] character class stream, and Line 3 shows an initial cursor stream identifying the starting positions for three simultaneous substring matches.

A key step in matching a repeated character class expression is to add the cursor stream to the character class bit stream. If the character class bit stream indicates a run of characters of the required character class at a particular cursor position, the effect of the addition is to set all the bits for the run of characters to be zero and to set the immediately following bit (to the left in the little-endian representation) to be a one. This is precisely the functionality needed to advance the cursor. Line 4 of FIG. 23 illustrates this process in the example case. To exclusively identify the one bits that result from this addition and propagation process, the result of the addition is then masked by an and-complement operation with the original character class stream ([0-9] stream in this example) as shown on Line 5 of FIG. 23. Note that the final cursor positions of the three initial cursors have been advanced by 3, 6 and 0 positions, respectively, in accord with the lengths of the repeated digit substrings found at those locations.

A general pattern for matching occurrences of a repeated character class expression involving the +(one-or-more) operator (e.g., "[0-9]+") follows that for the * operator with one additional step. The first two steps remain the same; i.e., add the character class bit stream for the repeated character class to the current cursor, and then apply the and-complement operation to the result and the character class bit stream. The third step enforces the requirement that at least one character position is matched by masking off (and-complement) those new cursor positions that are unchanged from the old cursor value. Masking off a cursor in this way indicates that the match has failed, disabling the use of the cursor in any further matching operations.

A general pattern for matching occurrences of a character class expression involving the ? (zero or one) operator also involves a one-step modification to the method for the * operator. In this case, the modification is to first select only those bits of the character class bit stream that identify occurrences of a character in the class precisely at an existing cursor position. This is achieved by simply computing the logical and of the character class bit stream and the current cursor. This selected value is then added to the cursor bit stream to advance cursor positions by one whenever such a character was indeed found at a cursor position. This completes the matching process. In particular, a final masking operation is not required because of the premasking of non-relevant bits from the character class bit stream.

A character class without a repetition operator may be considered to be a repetition with both a lower and upper bound of one. Simultaneous matching of a single instance of a character class at multiple cursor positions is achieved by modifying the procedure for character class repetitions involving the ? operator. As with the ? operator, the first step is to select those cursor positions that have instances of the character class by forming the logical and of the cursor and the character class bit stream. The second step is then to compute the new cursor bit stream as a one-bit shift forward operation on the selected cursor locations. Cursors at nonselected locations are zeroed out and no longer participate in the matching process; all other cursor positions advance one.

9.3 Field Definition in Multiple Substring Matching

To apply the techniques described herein for simultaneous matching of multiple substrings, the overall string to be matched is divided into a number of fields, each of which is considered to be the locus of a single independent substring matching operation. The fields may be of a common fixed length or of variable length. In either case, the initial cursor value is populated with a single one bit for each field located at the first position within the field (rightmost in the little-endian representation). An end_mask value is also established to identify the desired final cursor position for each field, that is, the cursor position to be reached for the overall substring match to be considered to succeed.

Fixed length fields corresponding to a natural field width of a SIMD register provide for the simplest processing In this case, the field width used is one greater than the maximum substring length to be matched. This ensures that the final field position is available to denote a successful match, with the cursor advanced past all character positions in the substring. The use of SIMD integer and logical operations on fixed width fields automatically ensures that the fields are processed independently of each other.

Simultaneous matching within variable-size fields requires care to ensure that carries and shifts do not propagate between fields and also to ensure that carries and shifts do propagate across block boundaries when the relevant field crosses the block boundary. Nevertheless, matching with variable-sized fields is an important problem. For example, list datatypes in XML schema always consist of space-separated list items, each of which may be required to match a particular regular expression pattern. The list items are generally of variable length, but the field boundaries are readily identified by the occurrence of the space characters. Each space character is an end-mask position for one field; the immediately following position is the starting cursor position for the next field.

When a character is used to separate fields, then it should not logically appear in any character class bit stream used to match the field contents. Upon ensuring that this is the case, a regular expression compiler can then establish field boundaries using the separator character and apply the matching techniques of section 9.2, safe in the knowledge that cursor propagation across field boundaries cannot occur.

9.4 Concatenated Expressions

Regular expressions often consist of a concatenation of subexpressions, each of which is to be matched in sequence to achieve an overall matching effect. For example, the regular expression "[−+]?[0-9]+" consists of the concatenation of two subexpressions, one for an optional sign, followed by one for a series of one or more digits. Matching of such concatenations builds on the multiple cursor techniques described above. In short, after the cursor is initialized to the first position of each field, the matching operations for each of the concatenated subexpressions is applied in turn. The result of each such operation moves the cursor to the initial position for matching the next subexpression within each field, or zeroes out the cursor for particular fields in the event that the match for those fields failed. After processing all of the concatenated subexpressions, the final cursor value computed may be compared to the end-mask value to identify the fields within which full substring matches have been identified and the ones failing to satisfy the match criteria.

FIG. 24 illustrates this process in the application of the "[−+]?[0-9]+" regular expression to matching the space-separated set of tokens in the "124-71 wrong +4++6-359697.5;" character string. Line 1 of FIG. 23 shows the character stream in little-endian form, while lines 2 and 3 show the "[−+]" and "[0-9]" character class bit streams based thereon. The division of the character stream into 7 space-separated fields is then shown on lines 4 and 5, with line 4 showing the initial cursor values at the beginning of each field and line 5 showing the end_mask giving expected end positions for a full match of the token found in each respective field.

Line 6 shows the result of the first matching step, matching the "[−+]?" subexpression. Following the method described in section 9.2, a bit stream comprising only those sign bits that are at the cursor position are selected and then added to the current cursor to produce the next cursor value, c1. Note that this succeeds in every case, with the cursor advancing by one for the second, fourth, fifth and sixth fields, each of which begins with a sign character. In the cases without an initial sign character, the cursor position is unchanged. Note also that the cursor is advanced by only one position in the case of the fifth field, even though this field begins with two "+" signs.

Using the c1 value as the initial cursor value for matching the "[0-9]+" subexpression, the final cursor value c2 is calculated as shown on line 7 of FIG. 24. The seven cursors are advanced by addition with the [0-9] stream, extraneous bits that are not the result of the cursor propagation are removed with the and-complement of the [0-9] stream and then cursor values that remain unchanged are zeroed out by the second and-complement operation that enforces the semantics of the +regular expression operator: at least one character must be matched. The final two lines compare the final cursor with the end_mask value, showing that a complete token match was found in the first, second and fourth fields, while the third, fifth, sixth and seventh fields failed to contain a complete match.

As one skilled in the art may readily appreciate, the techniques illustrated here may be applied for any number of concatenations of subexpressions. The subexpressions may be individual characters or character classes or repetitions of characters or character classes. Furthermore, the subexpressions may also include more complex components using techniques described in the following sections.

9.5 Alternative Expressions and Optional Phrases

The techniques described above may be extended to address more complex regular expressions with the introduction of methods for alternative expressions and optional phrases.

A regular expression may consist of a number of alternative subexpressions separated by vertical bars. A regular expression of this form matches a substring if any one of the alternatives matches the substring. Using parallel bit stream methods, simultaneous matching of a regular expression of this form at multiple locations indicated by an initial cursor stream is implemented by separately matching each of the alternative subexpressions, in accord with the techniques presented above. Each of these subexpression matches is initiated with the same initial cursor stream value. A set of alternative final cursor values is produced, one for each of the alternative subexpressions. Under the assumption that at most one alternative subexpression matches at each location (true in the case of a deterministic overall expression), the separate results of the matches are then combined with a logical or operation to yield the final cursor value.

An optional phrase is a regular expression consists of the "?" operator applied to a subexpression. The case of an optional phrase involving an individual character or character class is handled using the techniques described previously. In the more general case, the optional phrase is treated as an alternative expression of two alternatives: the subexpression of the optional phrase and the empty string. Such an optional phrase is matched by recording the initial cursor value, proceeding to match the given subexpression using the techniques established previously and then forming the logical or of the final cursor value computed through this process and the recorded initial cursor value. This process can potentially generate two cursor values within one field. However, if the overall expression containing the optional phrase is deterministic, the following step will eliminate one of these cursor values within each field.

In the case of multiple substring matching within fixed width fields, the combination of results from alternative expressions may be implemented with a SIMD unsigned max operation rather than a logical or operation. This allows the requirements for deterministic alternatives to be relaxed in both the general case of muliple alternatives and the special case of a single alternative to the empty string.

9.7 Regular Expression Compilation

One or more embodiments implement a compiler for regular expressions restricted to the forms identified in sections 9.1 through 9.6 above.

One or more embodiments implement a regular expression compiler that accepts a wider class of regular expressions that can be processed using the techniques identified in sections 9.1 through 9.6 above, choosing either the parallel bit stream methods if the regular expression can be processed with these techniques or an alternative method of regular expression compilation otherwise. As one skilled in the art will appreciate, this approach of selecting among implementation methods is a known strategy for choosing between alternative regular expression techniques, used, for example, in choosing between preferred implementations based on deterministic finite automata where possible with alternative implementations based on backtracking methods in cases for which the DFA approach is deemed infeasible or inappropriate.

One or more embodiments adapt the bit-stream techniques identified above for a big-endian bit stream representation by performing match operations in reverse.

10 XML Parsing

Although parsing of textual notation is typically implemented as an operation over a token stream provided by a lexical analyzer, direct implementation of parsing in terms of character streams and parallel lexical item streams is also possible. Such an embodiment may be preferred for reasons of parsing performance, for example. This section describes an embodiment of an XML 1.0 parser implemented directly using character streams and parallel lexical item streams. This direct implementation also permits the parser to take direct control of validation, line break normalization and transcoding, optimizing these operations when possible.

Figure 25:
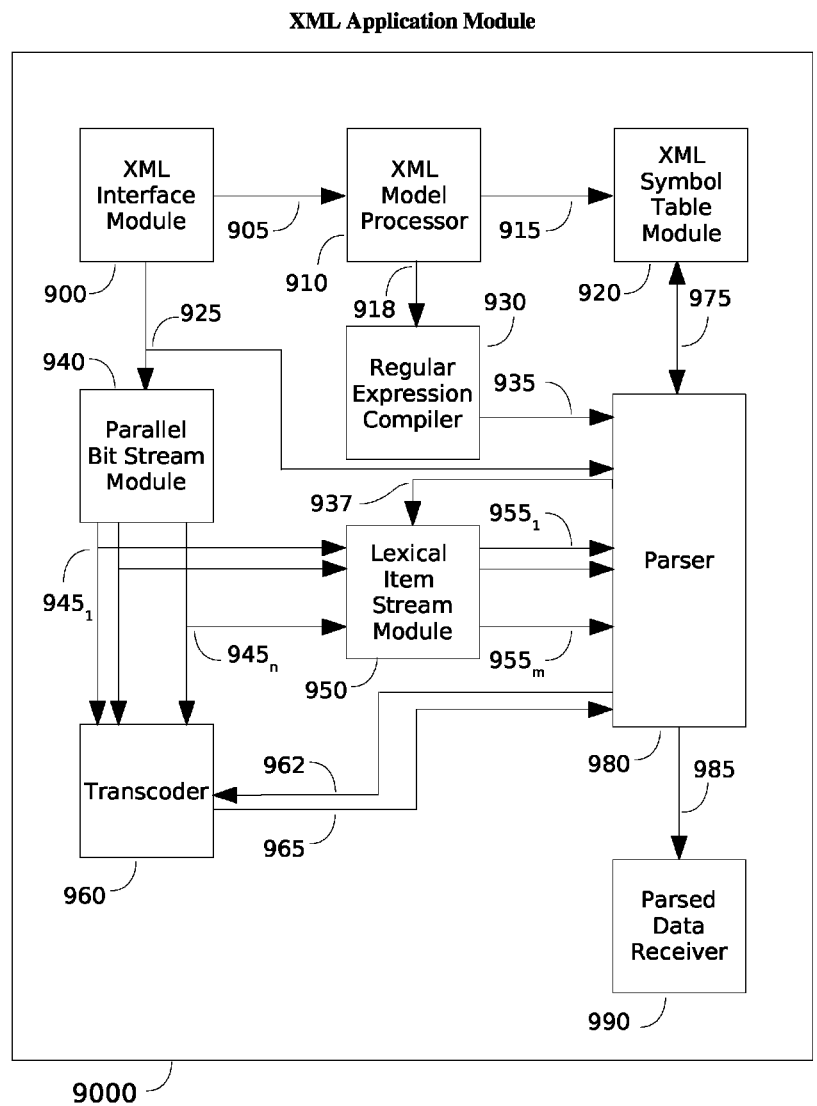
FIG. 25 shows a block diagram of XML application module 9000 that is fabricated in accordance with one or more embodiments of the present invention.

FIG. 25 shows a block diagram of module 9000 that is fabricated in accordance with one or more embodiments of the present invention. In accordance with one or more embodiments of the present invention, module 9000 may be: (a) an operating system or a library service package; (b) a virtual machine or a run-time environment; (c) a network appliance; (d) an office application such as, for example and without limitation, a word processor, a spreadsheet, a database, or presentation software; (e) a database system; (f) a portable communication device such as, for example and without limitation, a cellphone, a personal digital assistant or a wireless e-mail device; and (g) a text acquisition system. The following describes the portion of module 9000 that pertains to XML parsing since methods for interfacing with the portion described herein and the rest of module 9000 are well known to those of ordinary skill in the art.

As shown in FIG. 25, XML interface module 900 of module 9000 controls the interpretation and processing of an XML document by applying XML model information 905 relevant to that document as input to XML model processor 910 and applying the XML character stream data 925 to parallel property bit stream module 930. XML model information 905 includes any Document Type Definition (DTD) that XML interface module 900 extracts from a prolog of an XML document as well as additional information supplied by module 9000 (that is made available to module 9000 by any one of a number of methods that depend on the nature of module 9000 and are well known to one having skill in the art) to guide XML processing such as one or more XML Schema documents defining the structures and datatypes of XML elements and attributes that may occur in the XML document. XML model information 905 may further include information about the desired data to be extracted from the XML document in the form of a set of XPath specifications supplied by module 9000 as is well known in the art. Using techniques well known in the art, XML model processor 910 processes the DTD, XML Schema, XPath and/or other model information to create a set of symbol table entries 915 that are applied as input to XML symbol table module 920. XML symbol table module 920 records and organizes these entries so that XML symbol table module 920 is ready to respond to XML symbol lookup inquiries 975 from parser 980 to provide symbol lookup responses 975 based on the recorded entries. Also based on XML model information 905, XML model processor 910 identifies regular expressions that may be used to validate the values of particular elements or attributes, and supplies this regular expression data 918 to regular expression compiler 930. In response, regular expression compiler 930 compiles regular expression data 918 in accord with the techniques of section 9 to produce dynamically generated executable code 935 for use by parser 980. This code may include lexical item stream code 937 for calculating additional lexical item streams for character classes within the regular expression. In accordance with one or more such embodiments, parser 980 installs this the lexical item stream code 937 into lexical item stream module 950. For each compiled regular expression received, parser 980 creates a validation buffer into which it will collect values for validation by the compiled regular expression.

In response to XML character data stream 925, parallel property bit stream module 940 generates parallel property data streams $945_1$ to $945_n$ in accordance with one or more embodiments of the present invention described herein. In accordance with one or more embodiments of the present invention, parallel property bit stream module 940 may be, for example, and without limitation, a software or a hardware module that is embodied in the manner described herein or in any manner that incorporate these teachings.

As further shown in FIG. 25, parallel property data streams $945_1$ to $945_n$ are applied as input to lexical item stream module 950. Lexical item stream module 950 computes one or more lexical item streams and/or validation streams as described below, and generates them as parallel property data streams (for example, parallel property bit streams) $955_1$ to $955_m$ In general, n may not be equal to m. In accordance with one or more embodiments of the present invention, lexical item stream module 950 may be, for example, and without limitation, a software or a hardware module that is embodied in the manner described herein or in any manner that incorporate these teachings.

As further shown in FIG. 25, parallel property data streams $945_1$ to $945_n$ are applied as input to transcoder module 960. In response to transcoder control signal 962, transcoder 960 provides transcoded character stream data 965 as required to parser 980.

As further shown in FIG. 25, character stream 925 and parallel property data streams $955_1$ to $955_m$ are applied as input to parser 980. In response, and as further detailed below, parser 980 identifies each of the markup and text items in the XML data stream, processes these items in accord with symbol lookup queries and responses 975 made to XML symbol table module 920, and then provides the required parsed data item signals 985 to parsed data receiver 990 of module 9000, where parsed data receiver 990 is, for example and without limitation, an appropriate part of an operating system; a library service package; a virtual machine; a run-time environment; a network appliance; an office application such as, for example and without limitation, a word processor, a spreadsheet, a database, or presentation software; a database system; a portable communication device such as, for example and without limitation, a cellphone, a personal digital assistant or a wireless e-mail device; or a text acquisition system).

In one or more embodiments of module 9000, character stream data 925 is encoded in UTF-8, while character stream data supplied as part of parsed data item signals 985 is required to be encoded in UTF-16. In such embodiments, transcoder 960 performs UTF-8 to UTF-16 transcoding as described in section 4. The remainder of the discussion will refer to embodiments of this kind, although one with skill in the art will readily appreciate that embodiments using other combinations of character encodings for input and output may be produced by employing the methods documented herein without undue experimentation.

Lexical item stream module 950 computes parallel property data streams $955_1$ to $955_m$ as the following single position lexical item streams: HT(i), LF(i), CR(i), SP(i) and S(i), as defined by equations 8.1 through 8.5, Control(i) as defined by equation 10.1 below, RefStart(i) and LeftAngle(i) as defined by equations 8.24 and 8.25, NameDelim as defined by equation 8.31, SQuote(i) and DQuote(i) as defined by equations 8.34 and 8.35, and RightAngle(i), RefEnd(i), RightBracket(i), Hyphen(i) and QMark(i), as defined by equations 10.2 through 10.6 below.

$$\text{Control}(i) = u8\text{data}(i) \leq 0x1F \tag{10.1}$$

$$\text{RightAngle}(i) = u8\text{data}(i) = 0x3E \tag{10.2}$$

$$\text{RefEnd}(i) = u8\text{data}(i) = 0x3B \tag{10.3}$$

$$\text{RightBracket}(i) = u8\text{data}(i) = 0x5D \tag{10.4}$$

$$\text{Hyphen}(i) = u8\text{data}(i) = 0x2D \tag{10.5}$$

$$\text{QMark}(i) = u8\text{data}(i) = 0x3F \tag{10.6}$$

Rather than identifying full tokens, these lexical item streams identify particular locations at which tokens begin. Because each of the streams is defined in terms of a u8data byte at a single code unit position, the streams may be computed efficiently without the complexities of any block or boundary crossing logic.

In accordance with one or more embodiments of the present invention, lexical item stream module 950 also computes compound lexical item streams that permit parser 980 to optimize validation, line break normalization, transcoding, and replacement text determination. One stream each is defined for scanning of the body of comments, CDATA sections, processing instructions after the processing instruction target, double-quoted and single-quoted attribute values and text outside of markup.

$$\text{Exception}(i) = (u8\text{data}(i) \leq 0x1F) \wedge \neg (LF(i) \vee HT(i)) \vee u8\text{bit0}(i) \tag{10.7}$$

$$\text{SimpleCommentEnd}(i) = \text{Hyphen}(i) \vee \text{Exception}(i) \tag{10.8}$$

$$\text{SimpleCDEnd}(i) = \text{RBracket}(i) \vee \text{Exception}(i) \tag{10.9}$$

-continued $$\text{SimplePIEnd}(i) = \text{QMark}(i) \vee \text{Exception}(i) \tag{10.10}$$

$$\text{SimpleDQuoteEnd}(i) = \\ \text{LeftAngle}(i) \vee \text{RefStart}(i) \vee \text{DQuote}(i) \vee \text{Exception}(i) \tag{10.11}$$

$$\text{SimpleSQuoteEnd}(i) = \\ \text{LeftAngle}(i) \vee \text{RefStart}(i) \vee \text{SQuote}(i) \vee \text{Exception}(i) \tag{10.12}$$

$$\text{SimpleTextEnd}(i) = \\ \text{LeftAngle}(i) \vee \text{RefStart}(i) \vee \text{RightBracket}(i) \vee \text{Exception}(i) \tag{10.13}$$

Using these lexical item streams, parser 980 optimizes validation, transcoding, line break normalization and entity replacement (in the case of attributes and text). For example, when parsing an expected text item, parser 980 first performs a bit scan to locate the next bit in the SimpleTextEnd stream. The scan proves that all characters up to that point are in the simple set of ASCII characters without carriage returns (CR), restricted characters, "]]>" delimiters or markup. Parser 980 then tests for an opening angle bracket that signals the beginning of the next markup item. Very frequently, as frequently as 100% of the time in some data-oriented XML applications, this test will succeed. If so, the XML replacement text of a full text item has been identified, complete with UTF-8 validation, XML character validation, line break normalization and entity replacement applied. Furthermore, transcoding to UTF-16 by insertion of null bytes is straightforward so that parser 980 need not invoke transcoder 960 through transcoder control signal 962.

In the event that a text scan for SimpleTextEnd ends with a "]" character, a test is made to verify that the three character sequence "]]>" has not occurred. If the test fails, the error is reported, otherwise, the scan for SimpleTextEnd can be restarted with the next character.

In other cases, parser 980 enters a general loop for calculating replacement text. Parser 980 resolves and expands all character and general references initiated with the "&" character, and normalizes all line breaks initiated by the CR character. General references are expanded by making appropriate symbol lookup requests 975 to symbol table module 920 to retrieve replacement text associated with the referenced entity. In the event that non-ASCII UTF-8 bytes are encountered, parser 980 activates transcoder 960 through transcoder control signal 962 to perform UTF-8 validation and transcoding to UTF-16. Transcoder 960 provides transcoded UTF-16 data 965 in response. In one or more embodiments, line break normalization is combined with UTF-8 to UTF-16 transcoding in accord with section 8.2. If any restricted characters are encountered, the error is reported.

The main work of parser 980 is in parsing and processing element tags (start tags and empty element tags). After recognizing an opening "<" delimiter without a following "/" or "!" or "?" character, parser 980 initiates a scan for the XML element name using the NameDelim lexical item stream. The position and length of the name is noted, and a loop to identify zero or more attribute-value pairs is then initiated. The loop first checks for a closing ">" or "/>" delimiter either immediately or after whitespace. If there is no such delimiter, but there is whitespace, then an attribute name is scanned using the NameDelim lexical item stream. The position and length of the attribute name is noted. Parser 980 then verifies that an "=" sign then follows with possible whitespace on either side, followed by an open single or double quote for the attribute value. The SimpleSQuote or SimpleDQuote lexical item stream is then used as appropriate to perform an optimized scan. If the scan does not succeed in completing immediately with the closing single or double quote, a general attribute scan with line break normalization, transcoding and/or entity expansion is entered in a similar fashion to parsing of text. Once the attribute value has been parsed, a test whether the attribute name begins with "xmlns" is made. If so, the attribute name and value are treated as a namespace declaration and URI. The namespace name (if any) and URI are supplied as namespace lookup inquiries 975 to symbol table 920. Symbol table 920 responds by retrieving and bringing into scope the set of declarations associated with the namespace. An attribute name that does not begin with "xmlns" is simply noted along with the attribute value. The loop then repeats to identify the closing ">" or "/>" delimiter or further attribute-value pairs.

Once the closing delimiter of a start or empty element tag is found, parser 980 issues a symbol table lookup inquiry 975 to symbol table module 920 to retrieve information on the model properties of attributes and content associated with this element name. If the element name is not recognized, an error may be signaled depending on the validation mode set by XML model processor 910. Otherwise, the set of attribute names parsed is verified against the set of names established by XML model processor 910 and stored in XML symbol table 920. Attribute values are also processed and validated according to requirements specified by XML model processor 910. Some of these requirements may be that attribute values match particular regular expressions that have been compiled by regular expression compiler 930 and supplied to parser 980 as executable code 935. Parser 980 gathers such attribute values into a buffer that it has previously created for values subject to validation by the particular regular expression identified. Parser 980 uses the compiled code to perform validation when sufficiently many values have been collected to perform parallel regular expression validation on a full block of data or when parsing is otherwise complete. In one or more alternative embodiments, parser 980 may perform immediate validation of attribute values in some or all cases.

Once the attributes of a start tag have been processed, parser 980 then creates a stack entry for the element, placing its name and content model information as retrieved from symbol table 920 on the stack.

Upon encountering an opening "</" delimiter of an end tag, parser 980 immediately verifies that the immediately following text matches the expected end tag name recorded as the top of stack value. Verification of a the end tag closing delimiter ">" after possible white space follows. Parser 980 then completes any validation requirements associated with the content model as recorded on the top of stack. For text-based content models, this may include validation of the content in accord with a compiled regular expression using the same techniques described previously for attribute validation. Once validation requirements for the element content have been established, parser 980 may further validate that the element is correct for its context, that is, is valid in accord with incremental content model requirements of the parent node down one position in the stack.

Parser 980 parses comments, processing instructions and CDATA sections using similar techniques to those described above for text and start, empty element and end tags.

As parser 980 completes parsing of markup and text, it supplies the parsed items as parsed data item signals 985 to parsed data item receiver 990, in accord with requirements established by XML model processor 910 as recorded in symbol table 920. In one or more embodiments, these parsed item values are provided as node sets or sequences in accord with an XPath interface specification. One or more alternative embodiments provide parsed items in accord with the Simple API for XML (SAX) interface specification. One or more alternative embodiments provide parsed items in accord with the Document Object Model (DOM) specification.

11. Alternative Embodiments

Although various embodiments that incorporate the teachings of the present invention have been shown and described in detail herein, those skilled in the art can readily devise many other varied embodiments that still incorporate these teachings. For example, although descriptions of various embodiments of the present invention were provided which utilize full block invariants, it should be understood that the present invention is not limited to such embodiments. In fact, it is within the spirit of the present invention to include various embodiments utilizing partial blocks. In addition, one of ordinary skill in the art can readily fabricate such embodiments utilizing partial blocks routinely and without undue experimentation in light of the description provided above.

Although various embodiments using parallel bit streams have been described herein, other embodiments employing property data streams consisting of bit pairs, nybbles or other data units may be fabricated by one of ordinary skill in the art in light of the teachings.

Further, as one of ordinary skill in the art can readily appreciate from the detailed description above, one or more embodiments of the present invention are designed to improve efficiency in text processing systems so that increases in throughput, reductions in hardware requirements and/or savings in energy consumption may be achieved. For example, for a fixed hardware configuration, one or more embodiments of the present invention may be employed to increase throughput of text processing applications on the configuration. However, if the throughput requirements are fixed and known, one or more embodiments of the present invention may be applied to reduce system cost by reducing the overall number of processors and/or the performance specifications that must be satisfied by each processor. Alternatively, if the primary constraint is that of energy consumption, one or more embodiments of the present invention may permit efficiencies to be achieved by reducing the time spent in high-power operating modes, allowing lower-power processors to be substituted and/or reducing the total number of processors required.

It should be understood by those of ordinary skill in the art that, for any or all of the above described embodiments that were or could be embodied in software or a full or partial program, such software or full or partial program may be: (a) stored on a computer readable medium such as, for example and without limitation, a CD or DVD; and/or (b) embodied as a computer data signal embedded in a carrier wave.

What is claimed is:

1. An Extensible Markup Language (XML) application processor module that receives an XML character stream, which processor module comprises:

an XML interface module, a parallel bit stream processor module which includes a processor equipped with parallel processing instructions, a lexical item stream module, a parser and a parsed data receiver wherein:

the XML interface module applies the character stream as input to the parallel bit stream processor module and to the parser;

the parallel bit stream processor module, in response to the character stream:

(a) using the parallel processing instructions, forms a plurality of parallel property bit streams Pj wherein each of the parallel property bit streams consists of a stream of bit values $Pj(i)$ such that $Pj(i)$ is a property associated with code unit $C(i)$ of the character stream and each parallel processing instruction produces a plurality of bit values $Pj(i)$;

(b) segments the parallel property bit streams into blocks, each block consisting of bit values $Pj(i)$ at a multiplicity of positions i; and (c) applies the blocks as input to the lexical item stream module;

the lexical item stream module processes the blocks to form lexical item streams marking predetermined XML lexical items and applies the lexical item streams as input to the parser;

the parser, in response to the lexical item streams and the character stream, forms a stream of parsed XML data and applies the stream of parsed XML data as input to the parsed data receiver; and the parsed data receiver processes the stream of parsed XML data.

2. The Extensible Markup Language (XML) application processor module of claim 1 wherein the XML character stream is encoded in 8-bit Unicode Transformation Format (UTF-8):

the parallel bit stream processor module applies the blocks of parallel property bit streams representing the bits of UTF-8 code units to a transcoder;

the transcoder produces corresponding blocks of parallel property bit streams representing the bits of 16-bit Unicode Transformation Format (UTF-16) code units and applies the corresponding blocks as input to the parser; and the parser processes the corresponding blocks, the character stream and the lexical items streams to form a stream of parsed XML data represented using UTF-16.

3. The Extensible Markup Language (XML) application processor module of claim 1 wherein the parsed data receiver is a word processor.

4. The Extensible Markup Language (XML) application processor module of claim 1 wherein the parsed data receiver is a database system.

5. The Extensible Markup Language (XML) application processor module of claim 1 wherein the parsed data receiver is a communication software module of a portable communication device.

6. The Extensible Markup Language (XML) application processor module of claim 1 wherein the parsed data receiver is a textbase acquisition system.

7. The Extensible Markup Language (XML) application processor module of claim 1 wherein the parsed data receiver is an operating system module.

8. The Extensible Markup Language (XML) application processor module of claim 2 wherein the parsed data receiver is a database system.

9. The Extensible Markup Language (XML) application processor module of claim 2 wherein the parsed data receiver is a textbase acquisition system.

10. The Extensible Markup Language (XML) application processor module of claim 1 wherein the character stream is in the form of Extensible HyperText Markup Language (XHTML).

11. The Extensible Markup Language (XML) application processor module of claim 1 wherein the parallel processing instructions are single-instruction, multiple-data (SIMD) instructions.

* * * * *